(12) United States Patent
Nishihara et al.

(10) Patent No.: US 8,075,973 B2
(45) Date of Patent: Dec. 13, 2011

(54) INFORMATION RECORDING MEDIUM AND METHOD FOR MANUFACTURING THE SAME

(75) Inventors: Takashi Nishihara, Osaka (JP); Yoshitaka Sakaue, Osaka (JP); Rie Kojima, Osaka (JP)

(73) Assignee: Panasonic Corporation, Osaka (JP)

( * ) Notice: Subject to any disclaimer, the term of this patent is extended or adjusted under 35 U.S.C. 154(b) by 735 days.

(21) Appl. No.: 12/095,832

(22) PCT Filed: Nov. 9, 2006

(86) PCT No.: PCT/JP2006/322356
§ 371 (c)(1),
(2), (4) Date: Aug. 6, 2008

(87) PCT Pub. No.: WO2007/063687
PCT Pub. Date: Jun. 7, 2007

(65) Prior Publication Data
US 2009/0246558 A1    Oct. 1, 2009

(30) Foreign Application Priority Data
Dec. 2, 2005    (JP) .............................. P 2005-349023

(51) Int. Cl.
*B32B 3/02*    (2006.01)

(52) U.S. Cl. ..................... 428/64.1; 428/64.4; 428/64.5; 428/64.6; 430/270.13

(58) Field of Classification Search ........................ None
See application file for complete search history.

(56) References Cited

U.S. PATENT DOCUMENTS

| | | |
|---|---|---|
| 6,153,063 A | 11/2000 | Yamada et al. |
| 6,456,584 B1 | 9/2002 | Nagata et al. |
| 6,503,690 B1 | 1/2003 | Uno et al. |
| 6,610,380 B2 | 8/2003 | Kitaura et al. |
| 6,670,014 B2 | 12/2003 | Nishihara et al. |
| 6,821,707 B2 | 11/2004 | Uno et al. |
| 6,854,126 B2 | 2/2005 | Hirotsune et al. |
| 6,855,479 B2 | 2/2005 | Inase et al. |
| 7,037,413 B1 | 5/2006 | Otoba et al. |
| 2005/0019695 A1 | 1/2005 | Kojima et al. |
| 2005/0064132 A1 | 3/2005 | Inase et al. |
| 2005/0074694 A1 | 4/2005 | Nishihara et al. |

(Continued)

FOREIGN PATENT DOCUMENTS

CN    1479287    3/2004
(Continued)

OTHER PUBLICATIONS

Supplementary European Search Report (in English language) issued Apr. 2, 2009 in corresponding European Patent Application No. 06823243.

(Continued)

*Primary Examiner* — Elizabeth Mulvaney
(74) *Attorney, Agent, or Firm* — Wenderoth, Lind & Ponack, L.L.P.

(57) ABSTRACT

An information recording medium, 15 capable of recording information by irradiation of light or applying electrical energy, wherein at least one of first and second dielectric layers 102, 106, first interface layer and counter-incident side interface layer 103, 105 is formed from a Si—In—Zr/Hf—O-based material containing at least Si, In, M1 (M1 represents at least one element selected from among Zr and Hf) and oxygen (O), with Si content being 1 atomic % or more. This medium has high recording sensitivity when information is recorded thereon, high overwrite cycle-ability and high signal intensity.

27 Claims, 12 Drawing Sheets

U.S. PATENT DOCUMENTS

| | | |
|---|---|---|
| 2005/0089799 A1 | 4/2005 | Otoba et al. |
| 2007/0003730 A1 | 1/2007 | Kojima et al. |

FOREIGN PATENT DOCUMENTS

| | | |
|---|---|---|
| EP | 1 501 090 | 1/2005 |
| EP | 1 521 250 | 4/2005 |
| EP | 1 669 207 | 6/2006 |
| JP | 2-3114 | 1/1990 |
| JP | 10-275360 | 10/1998 |
| JP | 2000-36130 | 2/2000 |
| JP | 2002-144736 | 5/2002 |
| JP | 2003-67974 | 3/2003 |
| JP | 2004-71079 | 3/2004 |
| JP | 2005-56545 | 3/2005 |

OTHER PUBLICATIONS

International Search Report issued Feb. 6, 2007 in the International (PCT) Application PCT/JP2006/322356 of which the present application is the U.S. National Stage.

Partial English translation of Office Action issued Dec. 11, 2009 in the Chinese Application corresponding to the present U.S. Application.

INFORMATION RECORDING MEDIUM AND METHOD FOR MANUFACTURING THE SAME

TECHNICAL FIELD

The present invention relates to an information recording medium used to optically or electrically recording, erasing, rewriting and/or reproducing information, and a method for producing the same.

BACKGROUND ART

There has been known a phase transition type information recording medium that is based on a phenomenon of phase transition taking place in a recording layer (phase transition material layer). An optical phase transition type information recording medium is a medium where the phase transition is caused to occur by means of laser beam, namely that is used to optically recording, erasing, rewriting and reproducing information. More specifically, information is recorded on the optical phase transition type information recording medium by causing transition of state between, for example, crystal phase and amorphous phase by the heat generated through irradiation of laser beam. The recorded information is read out by detecting the difference in reflectivity between crystal phase and amorphous phase.

A rewritable optical phase transition type information recording medium allows it to erase information recorded thereon and write over other information. In this medium, the initial state of the recording layer is crystal phase in general. To record information on this medium, it is irradiated with a laser beam of high power (recording power) so as to melt the recording layer and then quickly cool it, thereby turning the portion of the recording layer that has been irradiated with the laser into amorphous phase. To erase information from this medium, it is irradiated with a laser beam having an output power (erasure power) lower than that for recording to raise the temperature of the recording layer and then gradually cool it, so as to turn the portion of the recording layer that has been irradiated with the laser into crystal phase. Accordingly, it is made possible to record new information while erasing the recorded information, by irradiating the recording layer of the rewritable optical phase transition type information recording medium with a laser beam that has been power-modulated between a high power level and a low power level.

A write-once optical phase transition type information recording medium is a medium that allows it to record information thereon only once, and does not allow it to erase or write over information. In this medium, the initial state of the recording layer is amorphous phase in general. To record information on this medium, it is irradiated with a laser beam of high power (recording power) so as to raise the temperature of the recording layer and then gradually cool it, thereby turning the portion of the recording layer that has been irradiated with the laser into crystal phase.

There is also an electrical phase transition type information recording medium that records information by applying electrical energy (for example, electric current) instead of irradiation of laser beam. Information is recorded on the electrical phase transition type information recording medium by causing transition of state between crystal phase (low resistance) and amorphous phase (high resistance) in phase transition material layer of a recording layer by the Joule heat generated by the electric current. The recorded information is read by detecting the difference in electrical resistance between crystal phase and amorphous phase.

An example of the optical phase transition type information recording medium is a 4.7 GB/DVD-RAM. Constitution of the 4.7 GB/DVD-RAM is shown in FIG. 12. The information recording medium 12 (which hereafter may also be referred to simply as medium) shown in FIG. 12 comprises an incident side dielectric layer 2, an incident side interface layer 3, a recording layer 4, a counter-incident side interface layer 5, a counter-incident side dielectric layer 6, an optional compensation layer 7 and a reflective layer 8 which are provided in this order on a substrate 1 when viewed from the side where laser beam enters. A dummy substrate 10 is adhered on the reflective layer 8 by means of an adhesive layer 9.

The incident side dielectric layer 2 and the counter-incident side dielectric layer 6 have optical functions to increase the efficiency of the recording layer 4 to absorb light by regulating the optical distance and to increase the difference in the reflectivity between crystal phase and amorphous phase so as to increase the intensity of signals. These dielectric layers also have a thermal function to thermally insulate the substrate 1, the dummy substrate 10, etc. that are vulnerable to heat, from the recording layer 4 that is heated to a high temperature during recording. $(ZnS)_{80}(SiO_2)_{20}$ (mol %) that is used to form the dielectric layer in the prior art is an excellent dielectric material having transparency, high refractive index, low heat conductivity, high thermal insulation, good mechanical characteristics and high humidity resistance.

The recording layer 4 is of a fast-crystallizing material containing (Ge—Sn) Te—$Sb_2Te_3$, which is prepared by substituting a part of Ge with Sn in a GeTe—$Sb_2Te_3$ quasi-dual component phase transition material, a mixture of compounds GeTe and $Sb_2Te_3$. The recording material of this material not only has high initial rewriting performance but also has high archival characteristic (capability to reproduce recorded information after a long period of storage) and high archival overwrite characteristic (capability to erase or rewrite recorded information after a long period of storage).

The reflective layer 8 has an optical function to increase the amount of light absorbed by the recording layer 4. The reflective layer 8 also has a thermal function to quickly diffuse the heat generated in the recording layer 4 and facilitate the phase transition of the recording layer 4 into amorphous phase. The reflective layer 8 further has a function to protect the multilayer film from the operating environment.

The incident side interface layer 3 and the counter-incident side interface layer 5 have the function to prevent material transfer from occurring between the incident side dielectric layer 2 and the recording layer 4 and between the counter-incident side dielectric layer 6 and the recording layer 4. The material transfer is the diffusion of S (sulfur) into the recording layer in the course of repetitive irradiation of the recording layer 4 with the laser beam for recording and rewriting cycles, in the case where the incident side dielectric layer 2 and the counter-incident side dielectric layer 6 are of $(ZnS)_{80}(SiO_2)_{20}$(mol %). Diffusion of sulfur in the recording layer causes deterioration of overwrite cycle-ability. In order to prevent overwrite cycle-ability from deteriorating, it is preferable to use a nitride containing Ge to form the incident side interface layer 3 and the counter-incident side interface layer 5 (refer, for example, to Japanese Unexamined Patent Publication (Kokai) No. 10-275360 (FIG. 2, pp 2-6)).

Based on the findings described above, the 4.7 GB/DVD-RAM was commercialized by achieving high overwrite performance and high reliability.

In the meantime, various technologies have been investigated for the purpose of further increasing the recording capacity of the information recording medium. With regards to the optical phase transition type information recording medium, for example, such a technology has been under development that employs smaller spot of laser beam so as to record information with higher density. Specifically, it is investigated to use a blue-violet laser that has shorter wavelength than the red laser used in the prior art and use an objective lens having higher numerical aperture (NA) with decreased thickness of the substrate on the side where the laser beam enters. When information is recorded with laser beam of decreased spot size, the area irradiated by the laser beam becomes smaller so that the density of power absorbed by the recording layer increases, thus resulting in greater volume change. As a result, material transfer becomes easier to occur and the use of a material containing S such as ZnS—SiO$_2$ in contact with the recording layer leads to deterioration of the overwrite cycle-ability.

Such an optical phase transition type information recording medium has also been developed that has two information layers each having a recording layer (may hereafter be referred to as double-layer optical phase transition type information recording medium) (refer, for example, to Japanese Unexamined Patent Publication (Kokai) No. 2000-36130 (FIG. 2, pp 2-11) and Japanese Unexamined Patent Publication (Kokai) No. 2002-144736 (FIG. 3, pp 2-14)). The double-layer optical phase transition type information recording medium may have a recording capacity twice as large as the medium shown in FIG. 1. Recording and reproduction of information on and from the two information layers are carried out by means of a laser beam that enters on one side of the medium. Accordingly, recording and reproduction of information on and from the information layer located away from the surface where the laser beam enters (hereafter referred to as the second information layer) are carried out by means of a laser beam that has transmitted through the information layer located nearer to the surface where the laser beam enters (hereafter referred to as the first information layer). Therefore, the recording layer of the first information layer is made extremely thin, so as to increase the light transmittance. However, when the recording layer becomes thinner, it is subjected to the material transfer from the adjacent layers more significantly, and therefore the use of a material containing S such as ZnS—SiO$_2$ leads to rapid deterioration of the overwrite cycle-ability.

In the past, the present inventors formed interface layers from a nitride that contains Ge on both sides of the recording layer so as to mitigate the influence of the material transfer and prevent overwrite cycle-ability from deteriorating in the high-density recording medium and the double-layer optical phase transition type information recording medium described above, similarly to the case of 4.7 GB/DVD-RAM.

However, in the optical phase transition type information recording medium where information is recorded in high density by using the laser beam of small spot size, much heat may be generated in the recording layer as higher energy (laser power) is applied to the recording layer when recording information. As a result, when the interface layer is of a nitride containing Ge as in the prior art, the interface layer may be destroyed by the heat generated in the recording layer. Destroyed interface layer is not capable of suppressing the diffusion of S from the dielectric layer. Thus the interface layer of a nitride containing Ge has the problem that it can cause rapid deterioration of overwrite cycle-ability.

Also nitride containing Ge has high heat conductivity. As a result, increasing the thickness of the interface layer for the purpose of suppressing the diffusion of S from the dielectric layer makes it easier for heat to diffuse. Thus the interface layer of a nitride containing Ge also has the problem that it can cause deterioration of sensitivity to recording.

DISCLOSURE OF THE INVENTION

The present invention has been made so as to solve the problems described above. An object of the present invention is to provide a phase transition type information recording medium that has the overwrite cycle-ability and the recording sensitivity both being improved and a favorable signal intensity. Another object of the present invention is to provide a phase transition type information recording medium that has more favorable archival characteristic.

The present invention provides an information recording medium (may hereafter be referred to simply as medium) on and/or form which information can be recorded and/or reproduced by applying light or applying electrical energy, and which media includes a layer of a Si—In—Zr/Hf—O-based material containing Si, In, M1 (M1 representing at least one element selected from among Zr and Hf) and oxygen (O), wherein the layer of Si—In—Zr/Hf—O-based material contains 1 atomic % or more Si. The expression of Zr/Hf means either one or both of Zr and Hf. Use of this material layer as a dielectric layer (including one that is formed in contact with the recording layer and one that is formed in contact with the interface layer as well), or as an interface layer disposed between the dielectric layer and the recording layer, it is made possible to improve the overwrite cycle-ability, archival characteristic, recording sensitivity and signal intensity of the medium. Specific composition of the Si—In—Zr/Hf—O-based material is as described below.

In the information recording medium of the present invention, the layer of Si—In—Zr/Hf—O-based material may contain a Si—In—Zr/Hf—O-based material represented by a formula (1):

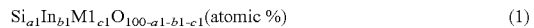

$$\text{Si}_{a1}\text{In}_{b1}\text{M1}_{c1}\text{O}_{100-a1-b1-c1}(\text{atomic \%}) \qquad (1)$$

wherein M1 represents at least one element selected from among Zr and Hf, while a1, b1 and c1 satisfy relationships: $1 \leq a1 < 32$, $3 < b1 < 38$, $1 < c1 < 30$, and $25 < a1+b1+c1 < 40$.

The appendix "atomic %" in the formula indicates that the composition is given in terms of the number of atoms of each element in proportion to the total number of Si atoms, In atoms, M1 atoms and oxygen atoms (100%). The appendix "atomic %" will be used hereafter in this meaning. Formula (1) shows only the proportion of the numbers of Si atoms, In atoms, M1 atoms and oxygen atoms contained in the layer of Si—In—Zr/Hf—O-based material. Accordingly, the Si—In—Zr/Hf—O-based material represented by this formula may contain other components (for example, other metal, hydrogen, argon, nitrogen, etc.).

Each element may exist as any compound in the formula (1). The reason for identifying the material by such a formula as described above is that it is difficult to determine the composition of the compound that constitutes the thin film, and the material composition is often identified merely by elementary composition that is proportions of the respective elements.

In the information recording medium of the present invention, the layer of a Si—In—Zr/Hf—O-based material may contain a Si—In—Zr/Hf—O-based material represented by a formula (2):

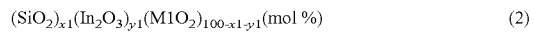

$$(\text{SiO}_2)_{x1}(\text{In}_2\text{O}_3)_{y1}(\text{M1O}_2)_{100-x1-y1}(\text{mol \%}) \qquad (2)$$

wherein M1 represents at least one element selected from among Zr and Hf, while x1 and y1 satisfy relationships: $5 \leq x1 \leq 90$, $5 \leq y1 \leq 90$ and $10 \leq x1+y1 \leq 95$. Formula (2)

shows preferable proportions of the oxides, in the case where Si, In and M1 are contained in the form of oxides.

The appendix "mol %" in the formula (2) indicates that the composition is given in terms of the proportion to the total number of compounds (100%). The appendix "mol %" will be used hereafter in this meaning. The layer of the Si—In—Zr/Hf—O-based material may contain other compounds.

In the information recording medium of the present invention, the layer of the Si—In—Zr/Hf—O-based material may further contain M2 (M2 represents at least one element selected from among Y, Cr and Ga). The layer of the Si—In—Zr/Hf—O-based material contains M2 in addition to Si, In and M1, when used as the dielectric layer or the interface layer of the phase transition type information recording medium, also enables it to improve the overwrite cycle-ability, archival characteristic, recording sensitivity and signal intensity of the medium.

In the information recording medium of the present invention, the layer of Si—In—Zr/Hf—O-based material containing M2 may contain a Si—In—Zr/Hf—O-based material represented by the formula (3):

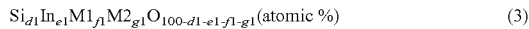

$$Si_{d1}In_{e1}M1_{f1}M2_{g1}O_{100-d1-e1-f1-g1} \text{(atomic \%)} \quad (3)$$

wherein M1 represents at least one element selected from among Zr and Hf, M2 represents at least one element selected from among Y, Cr and Ga, while d1, e1 f1, and g1 satisfy relationships: $1 \leq d1 < 31$, $2 < e1 < 38$, $1 < f1 < 29$, $0 < g1 < 36$, and $25 < d1+e1+f1+g1 < 40$.

In the information recording medium of the present invention, the layer of Si—In—Zr/Hf—O-based material containing M2 may contain a Si—In—Zr/Hf—O-based material represented by a formula (4):

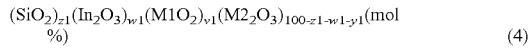

$$(SiO_2)_{z1}(In_2O_3)_{w1}(M1O_2)_{v1}(M2_2O_3)_{100-z1-w1-y1} \text{(mol \%)} \quad (4)$$

wherein M1 represents at least one element selected from among Zr and Hf, M2 represents at least one element selected from among Y, Cr and Ga, while z1, w1 and v1 satisfy the relationships: $5 \leq z1 < 90$, $5 \leq w1 < 90$, $5 \leq v1 < 90$, and $15 \leq z1+w1+v1 < 100$.

In the information recording medium of the present invention, the layer of Si—In—Zr/Hf—O-based material containing M2 may contain a Si—In—Zr/Hf—O-based material containing Y as M2, which is represented by a formula (5):

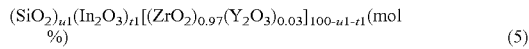

$$(SiO_2)_{u1}(In_2O_3)_{t1}[(ZrO_2)_{0.97}(Y_2O_3)_{0.03}]_{100-u1-t1} \text{(mol \%)} \quad (5)$$

wherein M1 represents at least one element selected from among Zr and Hf, M2 represents at least one element selected from among Y, Cr and Ga, while u1 and t1 satisfy relationships: $5 \leq u1 \leq 90$, $5 \leq t1 \leq 90$, and $10 \leq u1+t1 \leq 95$.

In the information recording medium of the present invention, the layer of Si—In—Zr/Hf—O-based material containing M2 may contain a Si—In—Zr/Hf—O-based material containing Y as M2, which is represented by a formula (6):

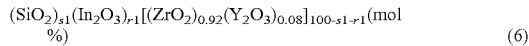

$$(SiO_2)_{s1}(In_2O_3)_{r1}[(ZrO_2)_{0.92}(Y_2O_3)_{0.08}]_{100-s1-r1} \text{(mol \%)} \quad (6)$$

wherein M1 represents at least one element selected from among Zr and Hf, M2 represents at least one element selected from among Y, Cr and Ga, while s1 and r1 satisfy relationships: $5 \leq s1 \leq 90$, $5 \leq r1 \leq 90$, and $10 \leq s1+r1 \leq 95$.

The layer of the materials s represented by the formulae (5) and (6), namely the materials s containing $Y_2O_3$, when used as the dielectric layer or the interface layer of the phase transition type information recording medium, also enable it to improve the overwrite cycle-ability, archival characteristic, recording sensitivity and signal intensity of the medium. Also the material of which a part of $ZrO_2$ is substituted by $Y_2O_3$ is stabilized and therefore makes it possible to stably form the layer of Si—In—Zr/Hf—O-based material containing $Y_2O_3$.

In the information recording medium of the present invention, the layer of the Si—In—Zr/Hf—O-based material may further contain at least one component selected from among carbon (C); oxide of at least one element selected from among Sc, La, Gd, Dy, Yb, Al, Mg, Zn, Ta, Ti, Ca, Ce, Sn, Te, Nb and Bi; nitride of at least one element selected from among Si, Cr, Al and Ge; and Si—C. The layer of the Si—In—Zr/Hf—O-based material containing these components, when used as the dielectric layer or the interface layer of the phase transition type information recording medium, also enables it to improve the overwrite cycle-ability, archival characteristic, recording sensitivity and signal intensity of the medium.

The information recording medium of the present invention may include at least one recording layer. The recording layer may be one that can undergo phase transition. The recording layer that can undergo phase transition may contain at least one element selected from among Sb, Bi, In and Sn, as well as Ge and Te.

The recording layer that can undergo phase transition may contain a material represented by one of (Ge—Sn)Te, GeTe—$Sb_2Te_3$, (Ge—Sn) Te—$Sb_2Te_3$, GeTe—$Bi_2Te_3$, (Ge—Sn) Te—$Bi_2Te_3$, GeTe—$(Sb—Bi)_2Te_3$, (Ge—Sn) Te—$(Sb—Bi)_2Te_3$, GeTe—$(Sb—In)_2Te_3$ and (Ge—Sn)Te—$(Bi—In)_2Te_3$. Such a recording layer can improve the overwrite cycle-ability of the phase transition type information recording medium.

In the information recording medium of the present invention, the layer of Si—In—Zr/Hf—O-based material may be disposed in contact with at least one surface of the recording layer. Such a constitution makes it possible to improve the overwrite cycle-ability, archival characteristic, recording sensitivity and signal intensity of the phase transition type information recording medium. The surface of the recording layer refers to the surface that delimits the region of the recording layer and makes contact with other layer. The surface of the recording layer that makes contact with the layer of Si—In—Zr/Hf—O-based material is preferably a surface perpendicular to the direction of thickness. The surface of the recording layer that makes contact with the layer of the Si—In—Zr/Hf—O-based material may be a surface parallel to the direction of thickness (for example, side face).

In the information recording medium of the present invention, the layer of Si—In—Zr/Hf—O-based material may be disposed in contact with one of the two surfaces of the recording layer that are perpendicular to the direction of thickness, and a layer containing Cr, M1 and O may be disposed in contact with the other surface. The layer containing Cr, M1 and O facilitates the crystallization of the recording layer. It is preferable that the layer containing Cr, M1 and O is provided on the surface nearer to the laser beam (the surface where the laser beam enters) when viewed from the recording layer, and the layer of Si—In—Zr/Hf—O-based material is provided on the surface away from the laser beam (the surface opposite to that where the laser beam enters) when viewed from the recording layer.

The information recording medium of the present invention may further have at least one reflective layer. The reflective layer may contain Ag as a main component. The term "main component" means that Ag is contained with a concentration not less than 50 atomic %. The reflective layer, particularly the reflective layer containing Ag is capable of improving, for example, the overwrite cycle-ability and signal intensity of the phase transition type information recording medium.

The present invention also provides a method for producing the information recording medium of the present invention so as to solve the problems described previously. The method of the present invention includes at least the step of forming the layer of Si—In—Zr/Hf—O-based material containing Si, In, M1 (M1 represents at least one element selected from among Zr and Hf) and oxygen (O) by sputtering method, wherein a sputtering target containing Si, In, M1 and O with concentration of Si not less than 0.5 atomic % is used. This production method provides the medium which, when used to produce the phase transition type information recording medium, enables it to improve the overwrite cycle-ability, archival characteristic, recording sensitivity and signal intensity.

In the method for producing the information recording medium of the present invention, the sputtering target used in the step of forming the layer of Si—In—Zr/Hf—O-based material may contain a Si—In—Zr/Hf—O-based material represented by a formula (11):

$$Si_{a2}In_{b2}M1_{c2}O_{100-a2-b2-c2}(\text{atomic \%}) \quad (11)$$

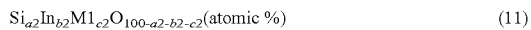

wherein M1 represents at least one element selected from among Zr and Hf, while a2, b2 and c2 satisfy relationships: $0.5 \leq a2 < 35$, $0 < b2 < 43$, $0 < c2 < 35$, and $20 < a2+b2+c2 < 45$.

In the method for producing the information recording medium of the present invention, the sputtering target used in the step of forming the layer of Si—In—Zr/Hf—O-based material may contain a Si—In—Zr/Hf—O-based material represented by a formula (12):

$$(SiO_2)_{x2}(In_2O_3)_{y2}(M1O_2)_{100-x2-y2}(\text{mol \%}) \quad (12)$$

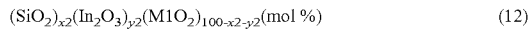

wherein M1 represents at least one element selected from among Zr and Hf, while x2 and y2 satisfy relationships: $2 < x2 \leq 95$, $0 < y2 \leq 95$ and $5 \leq x2+y2 < 100$.

Formula (12) shows preferable proportions of oxides of Si, In, M1, by taking into consideration of the fact that the sputtering target containing Si, In, M1 and oxygen may be supplied with the composition of the oxides of Si, In and M1 indicated in the specification. The present inventors have confirmed that composition of elements determined by analyzing the sputtering target with the composition indicated as described above substantially agrees with the composition of elements calculated from the indicated composition (that is, the indicated composition (nominal composition) is appropriate). Accordingly, a sputtering target provided in the form of a mixture of oxides may also be preferably used in the production method for the present invention.

In the method for producing the information recording medium of the present invention, the step of forming the layer of Si—In—Zr/Hf—O-based material may be carried out as a step of forming the layer of a Si—In—Zr/Hf—O-based material that further contains M2. In that case, a sputtering target containing Si, In, M1, M2 and O with concentration of Si not less than 0.5 atomic % is used.

In the method for producing the information recording medium of the present invention, the sputtering target used in the step of forming the layer of Si—In—Zr/Hf—O-based material may contain a Si—In—Zr/Hf—O-based material represented by a formula (13):

$$Si_{d2}In_{e2}M1_{f2}M2_{g2}O_{100-d2-e2-f2-g2}(\text{atomic \%}) \quad (13)$$

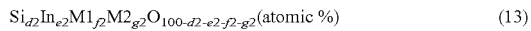

wherein M1 represents at least one element selected from among Zr and Hf, M2 represents at least one element selected from among Y, Cr and Ga, while d2, e2, f2, and g2 satisfy relationships: $0.5 \leq d2 < 34$, $0 < e2 < 43$, $0 < f2 < 34$, $0 < g2 < 41$, and $20 < d2+e2+f2+g2 < 45$.

In the method for producing the information recording medium of the present invention, the sputtering target used in the step of forming the layer of Si—In—Zr/Hf—O-based material may contain a Si—In—Zr/Hf—O-based material represented by the formula (14):

$$(SiO_2)_{z2}(In_2O_3)_{w2}(M1O_2)_{v2}(M2_2O_3)_{100-z2-w2-v2}(\text{mol \%}) \quad (14)$$

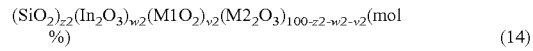

wherein M1 represents at least one element selected from among Zr and Hf, M2 represents at least one element selected from among Y, Cr and Ga, while z2, w2 and v2 satisfy relationships: $2 < z2 < 95$, $0 < w2 < 95$, $0 < v2 < 95$, and $10 \leq z2+w2+v2 < 100$. Formula (13) shows preferable proportions of oxides for the sputtering target provided in the form of a mixture of oxides, similarly to formula (12).

In the method for producing the information recording medium of the present invention, the sputtering target used in the step of forming the layer of Si—In—Zr/Hf—O-based material may contain a Si—In—Zr/Hf—O-based material represented by the formula (15):

$$(SiO_2)_{u2}(In_2O_3)_{t2}[(ZrO_2)_{0.97}(Y_2O_3)0.03]_{100-u2-t2}(\text{mol \%}) \quad (15)$$

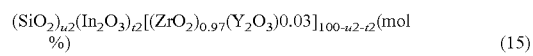

wherein M1 represents at least one element selected from among Zr and Hf, M2 represents at least one element selected from among Y, Cr and Ga, while u2 and t2 satisfy relationships: $2 < u2 \leq 95$, $2 < t2 \leq 95$, and $5 \leq u2+t2 < 100$. The sputtering target containing the material of this composition can be produced stably, and therefore enables more stable mass production of the medium having high performance as described above.

In the method for producing the information recording medium of the present invention, the sputtering target used in the step of forming the layer of Si—In—Zr/Hf—O-based material may contain a Si—In—Zr/Hf—O-based material represented by the formula (16):

$$(SiO_2)_{s2}(In_2O_3)_{r2}[(ZrO_2)_{0.92}(Y_2O_3)_{0.08}]_{100-s2-r2}(\text{mol \%}) \quad (16)$$

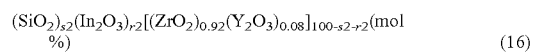

wherein M1 represents at least one element selected from among Zr and Hf, M2 represents at least one element selected from among Y, Cr and Ga, while s2 and r2 satisfy the relationships: $2 < s2 \leq 95$, $2 < r2 \leq 95$, and $5 \leq s2+r2 < 100$. The sputtering target containing the material of this composition also can be produced stably, and therefore enables further more stable mass production of the medium having high performance as described above.

In the method for producing the information recording medium of the present invention, the sputtering target used to form the layer of Si—In—Zr/Hf—O-based material may further contain at least one component selected from among carbon (C); oxide of at least one element selected from among Sc, La, Gd, Dy, Yb, Al, Mg, Zn, Ta, Ti, Ca, Ce, Sn, Te, Nb and Bi; nitride of at least one element selected from among Si. Cr, Al and Ge; and Si—C. When a target containing one or more of these components is used in the production of the phase transition type information recording medium, too, a medium of which the overwrite cycle-ability, archival characteristic, recording sensitivity and signal intensity are improved can be obtained.

In the step of forming the layer of Si—In—Zr/Hf—O-based material carried out according to the method for producing the information recording medium of the present invention, a rare gas or a mixed gas of the rare gas and $O_2$ gas may be used. In the case where the layer of the phase transition type information recording medium is of the Si—In—Zr/Hf—O-based material, the medium having the excellent performance described above can be produced more stably.

The information recording medium of the present invention is characterized by the constitution having the layer of Si—In—Zr/Hf—O-based material containing Si, In, Zr and/or Hf and O. The layer of the Si—In—Zr/Hf—O-based material can be used as a dielectric layer or an interface layer in the optical phase transition type information recording medium. Further, material transfer is less likely to occur even when the layer is provided in contact with the recording layer. As a result, the optical phase transition type information recording medium containing this layer has the overwrite cycle-ability, archival characteristic, recording sensitivity and signal intensity that are improved. The layer of the Si—In—Zr/Hf—O-based material, when used as the dielectric layer for thermally insulating the recording layer in the electrical phase transition type information recording medium, too, has increased number of overwrite cycles. The production method of the present invention also makes it possible to easily produce the information recording medium of the present invention.

DESCRIPTION OF REFERENCE NUMERALS

Figure 1:
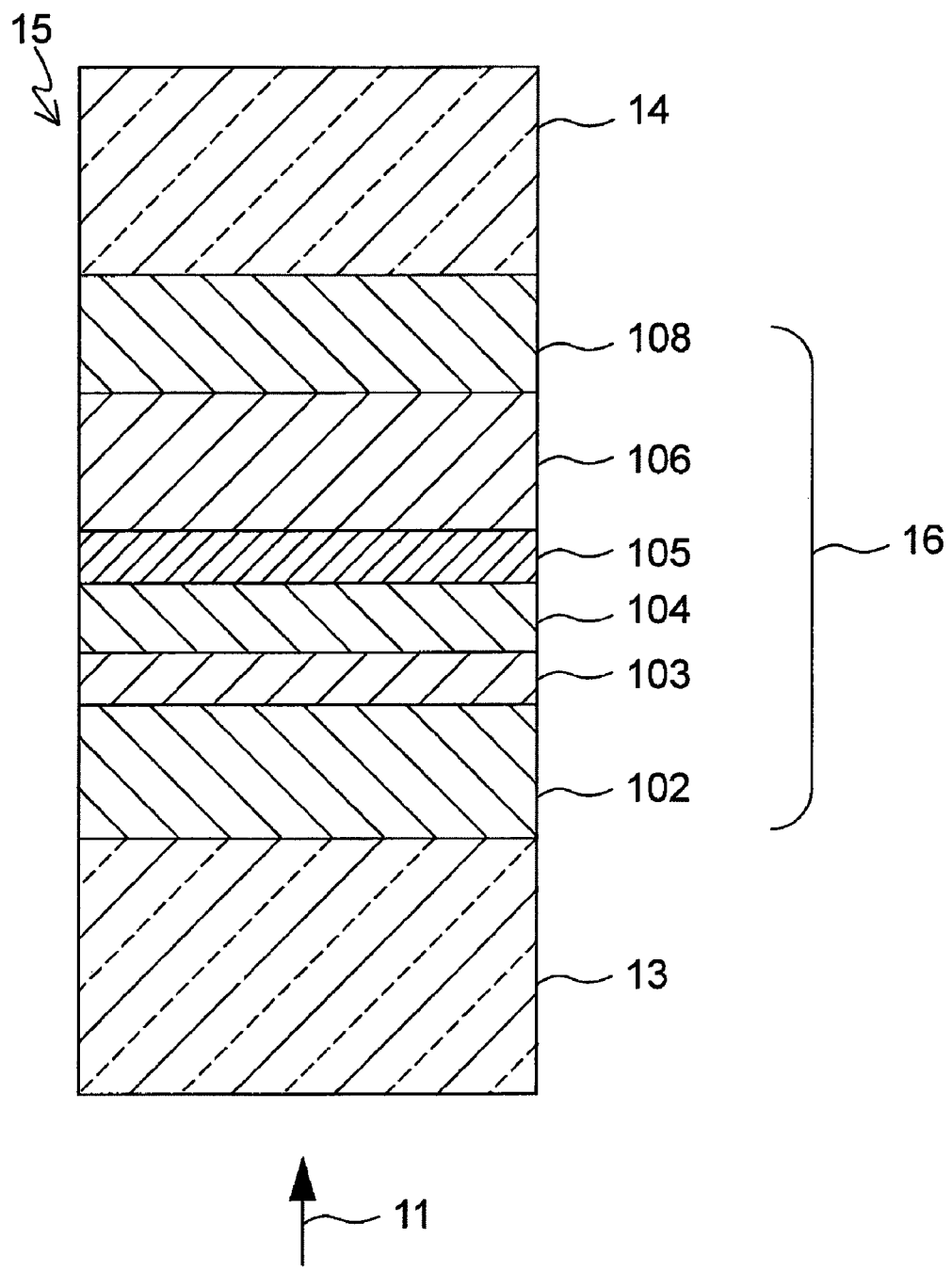
FIG. 1 is a partial sectional view showing an example of layer constitution of an information recording medium having one information layer, according to the present invention.

| | |
|---|---|
| 1, 14, 26, 30, 39 | Substrate |
| 2, 102 | Incident side dielectric layer |
| 3, 103 | Incident side interface layer |
| 4, 104 | Recording layer |
| 5, 105 | Counter-incident side interface layer |
| 6, 106 | Counter-incident side dielectric layer |
| 7 | Optical compensating layer |
| 8, 108 | Reflective layer |
| 9, 27 | Adhesive layer |
| 10, 28 | Dummy substrate |
| 11 | Laser beam |
| 12, 15, 22, 24, 29, 31, 32, 37 | Information recording medium |
| 13 | Transparent layer |
| 16, 18, 21 | Information layer |
| 17, 19, 20 | Optical separation layer |
| 23 | First information layer |
| 25 | Second information layer |
| 33 | Spindle motor |
| 34 | Objective lens |
| 35 | Semiconductor laser |
| 36 | Optical head |
| 38 | Recording/reproduction apparatus |
| 40 | Lower electrode |
| 41, 204 | First recording layer |
| 42, 304 | Second recording layer |
| 43 | Upper electrode |
| 44, 51 | Electrical information recording medium |
| 45 | Voltage applying sections |
| 46, 59 | Resistance measuring instrument |
| 47, 49 | Switch |
| 48, 58 | Pulse supply |
| 50 | Electrical information recording/reproduction apparatus |
| 52 | Word line |
| 53 | Bit line |
| 54 | Memory cell |
| 55 | Addressing circuit |
| 56 | Memory device |
| 57 | External circuit |
| 107 | Interface layer |
| 202 | First incident side dielectric layer |
| 203 | First incident side interface layer |
| 206 | First counter-incident side dielectric material layer |
| 208 | First reflective layer |
| 209 | Transmittance adjustment layer |
| 302 | Second incident side dielectric layer |
| 303 | Second incident side interface layer |
| 306 | Second counter-incident side dielectric material layer |
| 308 | Second reflective layer |
| 401 | First dielectric layer |
| 402 | Second dielectric layer |
| 501, 502, 503, 504, 505, 508, 509 | Recording waveform |
| 506, 507 | Erasing waveform |

BEST MODE FOR CARRYING OUT THE INVENTION

Embodiments of the present invention will be described below with reference to the accompanying drawings. It should be understood that the embodiments are provided as mere examples by which the present invention is not restricted. In the embodiments described below, identical components may be denoted with identical reference numerals, and duplicate description may be omitted.

First Embodiment

First embodiment, that is an example of information recording medium of the present invention will be described below. The information recording medium 15 of the first embodiment is shown in partial sectional view of FIG. 1. The information recording medium 15 is an optical information recording medium on or from which information can be recorded or reproduced by irradiating the medium with a laser beam 11.

The information recording medium 15 comprises a substrate 14, an information layer 16 formed on the substrate 14 and a transparent layer 13. The transparent layer 13 preferably has a low optical absorptance to the laser beam 11 that is used, and a low complex index of refraction in the short wavelength range. For example, the transparent layer 13 is of a photocurable resin (particularly an ultraviolet curable resin such as an epoxy resin or an acrylic resin) or a delayed-action resin, or a dielectric material. The transparent layer 13 may also be a transparent sheet or plate having disk shape of a resin such as polycarbonate, amorphous polyolefin or PMMA or glass. In this case, the transparent layer 13 may be adhered onto the incident side dielectric layer 102 by means of a photocurable resin (particularly an ultraviolet curable resin) or delayed-action resin, or an adhesive sheet.

Wavelength $\lambda$ of the laser beam 11 is preferably not longer than 450 nm when used in high-density recording, because the size of the beam spot formed by the focused laser beam 11 is determined by the wavelength $\lambda$. In general, the shorter the wavelength $\lambda$, the smaller the spot size that can be formed by the focused laser beam 11. When the wavelength $\lambda$ is shorter than 350 nm, the laser beam is absorbed more significantly by the transparent layer 13. Accordingly, the wavelength $\lambda$ is more preferably in a range from 350 nm to 450 nm.

The substrate 14 is a transparent substrate of disk shape. The substrate 14 may be of a resin such as polycarbonate, amorphous polyolefin or PMMA or glass. The substrate 14 is preferably of polycarbonate for the reason of good transfer property, ease of mass production and low cost.

The substrate 14 may have an optional guide groove formed to guide the laser beam on the surface where the information layer 16 is to be formed. The surface of the substrate 14 opposite to the surface where the information layer 16 is to be formed is preferably smooth. The substrate 14 has a thickness preferably in a range from 0.5 mm to 1.2 mm, so that sufficient strength is ensured and the information recording medium 15 has a thickness of about 1.2 mm. When the transparent layer 13 has a thickness of about 0.6 mm (which is a thickness that allows satisfactory recording and reproduction with NA=0.6), the thickness of the substrate 14 is preferably within a range from 0.55 mm to 0.65 mm. When the transparent layer 13 has a thickness of about 0.1 mm (a thickness that allows satisfactory recording and reproduction with NA=0.85), the thickness of the substrate 14 is preferably within a range from 1.05 mm to 1.15 mm.

The constitution of the information layer 16 will be described in detail below.

The information layer 16 has an incident side dielectric layer 102, an incident side interface layer 103, a recording layer 104, a counter-incident side interface layer 105, a counter-incident side dielectric layer 106 and a reflective layer 108 which are provided in this order from the side where laser beam 11 enters. The incident side interface layer 103 and the counter-incident side interface layer 105 are provided as required, and the medium 15 shown in FIG. 1 may be provided without one or both of these interface layers formed thereon.

In the information layer 16, the layer of the Si—In—Zr/Hf—O-based material constitutes one or a plurality of layers selected from among the incident side dielectric layer 102, the incident side interface layer 103, the counter-incident side interface layer 105 and the counter-incident side dielectric layer 106. In the medium 15 having the constitution shown in FIG. 1, the layer of Si—In—Zr/Hf—O-based material is preferably formed as the counter-incident side dielectric layer 106. The layer of Si—In—Zr/Hf—O-based material will be described below.

The layer of Si—In—Zr/Hf—O-based material contains at least Si, In, M1 (M1 represents at least one element selected from among Zr and Hf) and O, with the concentration of Si not less than 1 atomic %. The layer of Si—In—Zr/Hf—O-based material containing 1 atomic % or more Si, when used as the dielectric layer or the interface layer, can improve the recording sensitivity of the medium 15. Si serves to suppress the crystallization of the Si—In—Zr/Hf—O-based material. As a result, this layer suppresses the amplitude of noise from increasing in the information recording medium 15 and increases the signal intensity, when used as the counter-incident side dielectric layer 106.

In is supposed to exist in the form of oxide along with oxygen. When the layer of Si—In—Zr/Hf—O-based material is formed in contact with the recording layer, In improves the adhesion with the recording layer. When the layer of Si—In—Zr/Hf—O-based material is provided as the dielectric layer or the interface layer, In improves the archival characteristic of the medium. Zr and/or Hf are supposed to exist in the form of oxide along with oxygen. Oxides of Zr and Hf are transparent materials that have high melting points (about 2,700° C.) and lower heat conductivity among oxides. As a result, when the Si—In—Zr/Hf—O-based material that contains at least one of these is used to form the dielectric layer or the interface layer of the medium, high overwrite cycle-ability can be achieved. Also an interface layer of the Si—In—Zr/Hf—O-based material containing at least one of oxides of Zr and Hf has lower extinction coefficient and high thermal stability.

In the layer of Si—In—Zr/Hf—O-based material, it is preferable that Si and O produce $SiO_2$, In and O produce $In_2O_3$ and M1 and O produce $M1O_2$, $SiO_2$, $In_2O_3$ and $M1_2O_3$ do not contain S. As a result, the layer of the Si—In—Zr/Hf—O-based material containing these oxides is not likely to cause material transfer even when provided in contact with the recording layer. Accordingly, this layer is preferably used as the dielectric layer formed in contact with the recording layer, or as the interface layer formed in contact with the recording layer. The layer of Si—In—Zr/Hf—O-based material that does not contain S may also be formed as the incident side dielectric layer 102 (or the counter-incident side dielectric layer 106) in the constitution that has the incident side interface layer 103 (or the counter-incident side interface layer 105) as shown in the drawing. This provides such an advantage that overwrite cycle-ability is suppressed from deteriorating due to material transfer, even when the interface layer is destroyed.

The layer of the Si—In—Zr/Hf—O-based material is preferably formed as the counter-incident side dielectric layer 106, regardless of whether the interface layer is provided or not. The layer of the Si—In—Zr/Hf—O-based material contains oxide of In that has lower heat conductivity than the oxide of Cr, etc. As a result, when this material is used to form the counter-incident side dielectric layer 106 located near the reflective layer 108, heat is quickly dissipated toward the reflective layer, whereby lower output power of the laser is required for recording, that means higher recording sensitivity.

The layer of Si—In—Zr/Hf—O-based material preferably contains a material represented by the formula (1):

$$Si_{a1}In_{b1}M1_{c1}O_{100-a1-b1-c1}(\text{atomic \%}) \quad (1)$$

In the formula (1), a1, b1 and c1 preferably satisfy relationships: $1 \leq a1 < 32$, $3 < b1 < 38$, $1 < c1 < 30$, and $25 < a1+b1+c1 < 40$, and more preferably satisfy relationships: $1 < a1 < 15$, $8 < b1 < 35$, $1 < c1 < 20$, and $30 < a1+b1+c1 < 40$.

The layer of Si—In—Zr/Hf—O-based material, when represented as a layer containing the oxides of Si, In and M1, preferably contains a material represented by the formula (2):

$$(SiO_2)_{x1}(In_2O_3)_{y1}(M1I_2)_{100-x1-y1}(\text{mol \%}) \quad (2)$$

In the formula (2), x1 and y1 preferably satisfy relationships: $5 \leq x1 \leq 90$, $5 \leq y1 \leq 90$, and $10 \leq x1+y1 \leq 95$, and more preferably satisfy relationships: $10 \leq x1 \leq 50$, $30 \leq y1 \leq 80$, and $40 \leq x1+y1 \leq 90$.

The layer of Si—In—Zr/Hf—O-based material may contain M2 (M2 represents at least one element selected from among Y, Cr and Ga) in addition to Si, In, M1 and O. In this case, too, 1 atomic % or more Si is contained. Addition of M2 enables control of the stability, adhesion with the recording layer and the rate (or speed) of crystallization of the Si—In—Zr/Hf—O-based material layer.

The layer of Si—In—Zr/Hf—O-based material containing M2 preferably contains a Si—In—Zr/Hf—O-based material represented by the formula (3):

$$Si_{d1}In_{e1}M1_{f1}M2_{g1}O_{100-d1-e1-f1-g1}(\text{atomic \%}) \quad (3)$$

In the formula (3), d1, e1 f1, and g1 preferably satisfy relationships: $1 \leq d1 < 31$, $2 < e1 < 38$, $1 < f1 < 29$, $0 < g1 < 36$, and $25 < d1+e1+f1+g1 < 40$, and more preferably satisfy relationships: $1 < d1 < 15$, $8 < e1 < 35$, $1 < f1 < 20$, $0 < g1 < 23$, and $30 < d1+e1+f1+g1 < 40$.

It is assumed that M2 is also contained in the form of oxide in the layer of Si—In—Zr/Hf—O-based material. Accordingly, the layer of Si—In—Zr/Hf—O-based material containing M2, when represented as a layer containing a mixture of oxides, preferably contains a material represented by the formula (4):

$$(SiO_2)_{z1}(In_2O_3)_{w1}(M1O_2)_{v1}(M2_2O_3)_{100-z1-w1-v1}(\text{mol \%}) \quad (4)$$

In the formula (4), z1, w1 and v1 preferably satisfy relationships: $5 \leq z1 < 90$, $5 \leq w1 < 90$, $5 \leq v1 < 90$, and $15 \leq z1+w1+v1 < 100$, and more preferably satisfy relationships: $10 \leq z1 \leq 50$, $30 \leq w1 \leq 80$, $10 \leq v1 < 60$, and $50 \leq z1+w1+v1 < 100$.

When the layer of Si—In—Zr/Hf—O-based material contains Zr as M1, $ZrO_2$ may be partially stabilized by $Y_2O_3$. In this case, the layer of Si—In—Zr/Hf—O-based material preferably contains a material represented by the formula (5):

$$(SiO_2)_{u1}(In_2O_3)_{t1}[(ZrO_2)_{0.97}(Y_2O_3)_{0.03}]_{100-u1-t1}(\text{mol \%}) \quad (5)$$

In the formula (5), u1 and t1 preferably satisfy relationships: $5 \leq u1 \leq 90$, $5 \leq t1 \leq 90$, and $10 \leq u1+t1 \leq 95$, and more preferably satisfy relationships: $10 \leq u1 \leq 50$, $30 \leq t1 \leq 80$, and $40 \leq u1+t1 \leq 90$.

Alternatively, the layer of Si—In—Zr/Hf—O-based material preferably contains a material represented by the formula (6):

$$(SiO_2)_{s1}(In_2O_3)_{r1}[(ZrO_2)_{0.92}(Y_2O_3)_{0.08}]_{100-s1-r1}(\text{mol \%}) \quad (6)$$

In the formula (6), s1 and r1 preferably satisfy relationships: $5 \leq s1 \leq 90$, $5 \leq r1 \leq 90$, and $10 \leq s1+r1 \leq 95$, and more preferably satisfy relationships: $10 \leq s1 \leq 50$, $30 \leq r1 \leq 80$, and $40 \leq s1+r1 \leq 90$.

As mentioned previously, $Y_2O_3$ is a transparent material that has the function to stabilize $ZrO_2$. As a result, use of the layer of Si—In—Zr/Hf—O-based material containing $Y_2O_3$ as the dielectric layer or the interface layer results in the information recording medium 15 that has high overwrite cycle-ability and high reliability. Also in the case where the layer of Si—In—Zr/Hf—O-based material is formed by the sputtering process as described later, there is such an advantage that $Y_2O_3$ stabilizes $ZrO_2$, whereby manufacture of a sputtering target having very high density is easily produced.

The layer of the Si—In—Zr/Hf—O-based material may further contain at least one component selected from among carbon (C); oxide of at least one element selected from among Sc, La, Gd, Dy, Yb, Al, Mg, Zn, Ta, Ti, Ca, Ce, Sn, Te, Nb and Bi; nitride of at least one element selected from among Si, Cr, Al and Ge; and Si—C.

These components may be used to control the properties of the layer of Si—In—Zr/Hf—O-based material. These components may also be contained inevitably in the layer of Si—In—Zr/Hf—O-based material. The concentration of these components, when represented in terms of mol %, preferably does not exceed 20 mol %. In the case where where the layer of Si—In—Zr/Hf—O-based material contains elements other than Si, In, M1 and O, as well as M2 that may be optionally contained, such elements may be contained with a concentration of up to 10 atomic %.

The layer of Si—In—Zr/Hf—O-based material is formed as one of the incident side dielectric layer 102, the counter-incident side dielectric layer 106, the incident side interface layer 103 and the counter-incident side interface layer 105, as described previously. Function and preferable thickness of each of these layers will be described below.

The incident side dielectric layer 102 and the counter-incident side dielectric layer 106 have the functions to suppress oxidization, corrosion and deformation of the recording layer 104, control the optical distance so as to improve the light absorption efficiency by the recording layer 104 and increase the signal intensity by increasing the difference in the intensity of reflected light before and after recording. As described above, it is preferable to form the counter-incident side dielectric layer 106 from the Si—In—Zr/Hf—O-based material. Alternatively, both of the dielectric layers 102 and 106 may be formed from the Si—In—Zr/Hf—O-based material, or only the incident side dielectric layer 102 may be formed from the Si—In—Zr/Hf—O-based material.

In the case where the incident side dielectric layer 102 (or the counter-incident side dielectric layer 106) is not formed from the Si—In—Zr/Hf—O-based material, this layer may be formed from one or more oxides selected from among $TiO_2$, $ZrO_2$, $HfO_2$, $ZnO$, $Nb_2O_5$, $Ta_2O_5$, $SiO_2$, $SnO_2$, $Al_2O_3$, $Bi_2O_3$, $Cr_2O_3$, $Ca_2O_3$, $In_2O_3$, $Sc_2O_3$, $Y_2O_3$, $La_2O_3$, $Gd_2O_3$, $Dy_2O_3$, $Yb_2O_3$, $CaO$, $MgO$, $CeO_2$ and $TeO_2$. The layer may formed from of one or more nitride selected from among C—N, Ti—N, Zr—N, Nb—N, Ta—N, Si—N, Ge—N, Cr—N, Al—N, Ge—Si—N and Ge—Cr—N. Sulfides such as ZnS, carbides such as SiC, fluorides such as $LaF_3$ and C may also be used to form the incident side dielectric layer 102. The incident side dielectric layer 102 may also be formed from a mixture of one or more material selected from among those listed above.

For example, ZnS—$SiO_2$ that is a mixture of ZnS and $SiO_2$, is particularly excellent as the material to form the incident side dielectric layer 102. ZnS—$SiO_2$ is an amorphous material that has a high refractive index, a fast film formation rate, (or a deposition rate) good mechanical properties and high humidity resistance. ZnS—SiO$_2$ preferably has the composition represented by (ZnS)$_{80}$(SiO$_2$)$_{20}$ (mol %).

The thickness of the incident side dielectric layer 102 can be exactly determined by calculation based on a matrix method, so as to satisfy the conditions for achieving greater change in the amount of reflected light between a case wherein the recording layer 104 is in crystal phase and a case wherein the layer 104 is in amorphous phase.

The incident side interface layer 103 has a function to prevent material transfer between the incident side dielectric layer 102 and the recording layer 104 caused by repetitive recording. The incident side interface layer 103 also has a function to accelerate or suppress the crystallization of the recording layer 104, namely to adjust the capability to crystallize. The incident side interface layer 103 is preferably formed from a material that absorbs a less amount of light and has a high melting point so as not to melt upon recording, and has good adhesion to the recording layer 104. The material is required to have the high melting point so as not to melt during recording, whereby it is ensured that the incident side interface layer 103 is prevented from melting and mixing into the recording layer 104 when irradiated with the laser beam 11 of high power. Mixing of the material of the incident side interface layer 103 alters the composition of the recording layer 104, thereby to significantly deteriorate the overwriting performance. Good adhesion to the recording layer 104 is required to ensure high reliability.

The incident side interface layer 103 may be formed from the Si—In—Zr/Hf—O-based material. The incident side interface layer 103 may also be formed from a material other than the Si—In—Zr/Hf—O-based material. In this case, the incident side interface layer 103 may be formed from the material described in relation to the incident side dielectric layer 102.

The incident side interface layer 103 is preferably formed from a material containing Cr and O. The incident side interface layer 103 containing Cr and O assists in the crystallization of the recording layer 104 further. In this material, Cr and O preferably form Cr$_2$O$_3$. Cr$_2$O$_3$ has good adhesiveness to the recording layer 104.

The incident side interface layer 103 may also be formed from the material containing In and O. In this material, In and O preferably form In$_2$O$_3$. In$_2$O$_3$ has good adhesiveness to the recording layer 104. The incident side interface layer 103 may also be of the material containing Ga and O. In this material, Ga and O preferably form Ga$_2$O$_3$. Ga$_2$O$_3$ has good adhesiveness to the recording layer 104.

The incident side interface layer 103 may also contain at least one element selected from among Zr, Hf and Y, in addition to Cr and O or In and O. As described previously, ZrO$_2$ and HfO$_2$ are transparent materials that have melting points as high as about 2,700 to 2,800° C., and lower heat conductivity among oxides, so as to be capable of improving overwrite cycle-ability of the information recording medium. Y$_2$O$_3$ is a transparent material that has the function to stabilize ZrO$_2$ and HfO$_2$. The incident side dielectric layer 103 formed from a material prepared by mixing one or more of the three kinds of oxide with oxide of Cr or the like enables realization of the information recording medium 15 that has high overwrite cycle-ability and high reliability, even when making contact partially or entirely with the recording layer 104.

In order to ensure adhesion to the recording layer 104, the incident side interface layer 103 preferably contains 10 mol % or more Cr$_2$O$_3$, Ga$_2$O$_3$ or In$_2$O$_3$. Moreover, content of Cr$_2$O$_3$, Ga$_2$O$_3$ or In$_2$O$_3$ in the incident side interface layer 103 is preferably 70 mol % or less in order to keep the small amount of light absorbed by the incident side interface layer 103. Greater content of Cr$_2$O$_3$, Ga$_2$O$_3$ or In$_2$O$_3$ tends to increase the light absorption. The content of Cr$_2$O$_3$, Ga$_2$O$_3$ or In$_2$O$_3$ is more preferably not lower than 20 mol % and not higher than 60 mol %.

The incident side interface layer 103 may also be formed from a material containing Si in addition to Cr, Ga, In, Zr, Hf, Y and O. By containing SiO$_2$, it is made possible to form the first information layer 16 that has higher transparency and high recording performance. The incident side interface layer 103 formed from a material containing In, Zr and/or Hf and Si can become a Si—In—Zr/Hf—O-based material. The content of SiO$_2$ in the incident side interface layer 103 is preferably 5 mol % or more and, in order to ensure adhesion to the recording layer 104, preferably not lower than 50 mol %, and more preferably not lower than 10 mol % and not higher than 40 mol %.

In the case where the incident side dielectric layer 102 is formed from ZnS—SiO$_2$, the incident side interface layer 103 is preferably formed from a material containing Cr$_2$O$_3$, ZrO$_2$ and/or HfO$_2$ and SiO$_2$. Cr$_2$O$_3$ has high crystallization assisting function, and is therefore suitable for forming an interface layer disposed on the side where the laser beam enters, in a medium where information is recorded at a high speed (for example, Bluray Disk of 2-fold or 4-fold speed). While Cr$_2$O$_3$ has a higher light absorption coefficient than Ga$_2$O$_3$ and In$_2$O$_3$, significant influence is not caused on the medium as a whole due to the absorption of light by Cr$_2$O$_3$ in a layer formed with an extremely small thickness such as the incident side interface layer 103.

More specifically, it is preferable that the incident side interface layer 103 contains a material represented by the following formula:

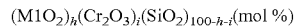

$$(M1O_2)_h(Cr_2O_3)_i(SiO_2)_{100-h-i} (\text{mol }\%)$$

wherein M1 represents at least one element selected from among Zr and Hf, while h and i satisfy relationships: $20 \leq h \leq 80$, $10 \leq i \leq 70$, and $60 \leq h+i \leq 90$. The incident side interface layer 103 may further contain Y, that may be contained in the form of Y$_2$O$_3$. In this case, Y$_2$O$_3$ may be contained in the form of substitute for a part (for example, 0.03 mol % or 0.08 mol %) of M1O$_2$ (particularly ZrO$_2$).

In order to keep the change in the intensity of reflective light from becoming too small before and after recording due to light absorption by the incident side interface layer 103, a thickness of the incident side interface layer 103 is preferably within a range from 0.5 nm to 15 nm, and more preferably from 1 nm to 10 nm.

The counter-incident side dielectric layer 106 is preferably the layer of Si—In—Zr/Hf—O-based material, as described previously. Alternatively, the counter-incident side dielectric layer 106 may be formed from a material other than the Si—In—Zr/Hf—O-based material.

The thickness of the counter-incident side dielectric layer 106 is preferably within a range from 2 nm to 75 nm, and more preferably from 2 nm to 40 nm. When the thickness is within this range, the counter-incident side dielectric layer 106 can effectively dissipate the heat generated in the recording layer 104 toward the reflective layer 108 side.

The counter-incident side interface layer 105 may be disposed between the recording layer 104 and the counter-incident side dielectric layer 106. Similarly to the incident side interface layer 103, the counter-incident side interface layer 105 prevents material transfer from taking place between the counter-incident side dielectric layer 106 and the recording layer 104 through repetitive recording operations. The counter-incident side interface layer 105 may be a layer of Si—In—Zr/Hf—O-based material, or may be a layer of other material. The layer of the other material is as described previously in relation to the incident side interface layer 102. It is preferable to form the counter-incident side interface layer 105 from a material containing In and O, in particular. It is particularly more preferable to contain an oxide in which In and O form $In_2O_3$. Accordingly, the counter-incident side interface layer 105 is preferably formed as a Si—In—Zr/Hf—O-based material.

In the case where the counter-incident side interface layer 105 and the counter-incident side dielectric layer 106 are both formed from the Si—In—Zr/Hf—O-based material, two consecutive layers come to be located on the side of the recording layer opposite to the light input side. Such a constitution makes it possible to improve the overwrite cycleability, archival characteristic, recording sensitivity and signal intensity of the medium. In this case, it is preferable that the proportion of In in the Si—In—Zr/Hf—O-based material that forms the counter-incident side interface layer 105 is higher than the proportion of In in the Si—In—Zr/Hf—O-based material that forms the counter-incident side dielectric layer 106. This is because higher proportion of In improves adhesive property. For a similar reason, the proportion of Si in the Si—In—Zr/Hf—O-based material that forms the counter-incident side interface layer 105 is preferably lower than the proportion of Si in the Si—In—Zr/Hf—O-based material that forms the counter-incident side dielectric layer 106.

More specifically, the proportion of In in the Si—In—Zr/Hf—O-based material that forms the counter-incident side interface layer 105, is preferably about 3 to 10 mol %, more preferably about 5 to 8 mol % higher than that in the counter-incident side dielectric layer 106. The proportion of Si in the Si—In—Zr/Hf—O-based material that forms the counter-incident side interface layer 105 is preferably about 1 to 15 mol %, more preferably about 2 to 10 mol % lower than that in the counter-incident side dielectric layer 106.

Alternatively, as described previously in relation to the incident side interface layer 103, the counter-incident side interface layer 105 may also be formed from a material containing Cr and O, or a material containing Ga and O. Cr and O preferably form $Cr_2O_3$ and Ga and O preferably form $Ga_2O_3$. The counter-incident side interface layer 105 may further contain at least one element selected from among Zr and Hf in addition to In and O, Cr and O or Ga and O, similarly to the incident side interface layer 103. Further in addition to these components, a material containing Si as well may be used to form the counter-incident side dielectric layer 105.

The counter-incident side interface layer 105 tends to have lower adhesiveness to the recording layer than the incident side interface layer 103 has, and therefore content of $In_2O_3$, $Cr_2O_3$ or $Ga_2O_3$ in the counter-incident side interface layer 105 is preferably higher than that in the incident side interface layer 103, to be not less than 20 mol %. The thickness of the counter-incident side interface layer 105 is preferably within a range from 0.5 nm to 15 nm, more preferably within a range from 1 nm to 10 nm, similarly to the incident side interface layer 103.

In the medium 15 shown in the drawing, the recording layer 104 is formed from a material that can undergo phase transition between crystal phase and amorphous phase when irradiated with the laser beam 11. The recording layer 104 may be formed from a material containing, for example, Ge, Te, M3 (wherein M3 represents at least one element selected from among Sb, Bi and In) and can undergo reversible phase transition. Specifically, the recording layer 104 may be formed from a material represented by a formula $Ge_A M3_B Te_{3+A}$. In this formula, A preferably satisfies a relationship: $0 < A \leq 60$, and more preferably satisfies a relationship: $4 \leq A \leq 40$. When the value of A is within this range, the amorphous phase is stabilized so that good archival characteristic can be achieved at a low transfer rate, while the increase in the melting point becomes less and the decrease in the crystallization rate become less so that good archival overwrite characteristic can be achieved at a high transfer rate. Also in this formula, B preferably satisfies a relationship: $1.5 \leq B \leq 7$, and more preferably satisfies a relationship: $2 \leq B \leq 4$. When the value of B is within this range, the amorphous phase is stabilized so that the decrease in the crystallization rate becomes less.

The recording layer 104 may also be formed from a material that is represented by a formula $(Ge-M4)_A M3_B Te_{3+A}$ (wherein M4 represents at least one element selected from among Sn and Pb) and can undergo reversible phase transition. With this composition, as the element M4 that substitutes Ge improves the capability of crystallization, sufficient level of erasing ratio can be achieved even when the thickness of the recording layer 104 is small. The element M4 is preferably Sn, because use of Pb is being regulated from the concern over the hazard thereof to the human health. In the case where this material is used, A and B in the formula preferably satisfy relationships: $0 < A \leq 60$ (more preferably $4 \leq A \leq 40$), and $1.5 \leq B \leq 7$ (more preferably $2 \leq B \leq 4$).

In the case where the recording layer 104 contains a material represented by the formula $Ge_A M3_B Te_{3+A}$ or $(Ge-M4)_A M3_B Te_{3+A}$, it is preferable that In is contained as the element M3. The recording layer 104 formed from a material containing In has the amorphous phase that is particularly stable so as to achieve good archival characteristic at a low transfer rate. In the case where a layer formed from the Si—In—Zr/Hf—O-based material is in contact with the recording layer 104 containing In, the layer of Si—In—Zr/Hf—O-based material and the recording layer 104 adhere to each other satisfactorily.

Alternatively, the recording layer 104 may also be formed from a material that is represented by a formula GeTe—SnTe and can undergo reversible phase transition. In this case, as SnTe improves the capability of crystallization, sufficient level of erase ratio can be achieved even when the thickness of the recording layer 104 is small.

The recording layer 104 may also be formed from a material containing Sb and M5 (wherein M5 represents at least one element selected from among V, Mn, Ga, Ge, Se, Ag, In, Sn, Te, Pb, Bi, Tb, Dy and Au) and can undergo reversible phase transition. Specifically, the recording layer 104 may be formed from a material of $Sb_X M5_{100-X}$(atomic %). In this formula, X preferably satisfies a relationship: $50 \leq X \leq 95$. When the value of X is within this range, a large difference in the reflectivity can be obtained between the medium 15 of which the recording layer 104 is in crystal phase and the medium 15 of which the recording layer is in amorphous phase, thereby achieving better recording and reproducing performance. When X satisfies a relationship: $75 \leq x \leq 95$, in particular, the crystallization speed of the recording layer 104 becomes especially higher, so that high overwriting performance can be achieved at a high transfer rate. When X satisfies a relationship: $50 \leq x \leq 75$, the amorphous phase is particularly stable, and therefore good recording characteristic can be achieved at a low transfer rate.

The thickness of the recording layer 104 is preferably within a range from 6 nm to 15 nm in order to achieve high recording sensitivity of the information layer 16. When the recording layer 104 has a larger thickness within this range, diffusion of heat in the direction within the plane causes a larger thermal effect to a region adjacent to the recording layer. When the recording layer 104 is thinner, reflectivity of the information layer 16 decreases. Accordingly, thickness of the recording layer 104 is more preferably within a range from 8 nm to 13 nm.

The recording layer 104 may also be formed from a material that undergoes irreversible phase transition, such as a material represented by Te—Pd—O. In this case, a thickness of the recording layer 104 is preferably within a range from 10 nm to 40 nm.

The reflective layer 108 has an optical function to increase the intensity of light absorbed by the recording layer 104. The reflective layer 108 also has a thermal function to quickly diffuse the heat generated in the recording layer 104 to facilitate the phase transition of the recording layer 104 to amorphous phase. The reflective layer 108 further has a function to protect the multi-layer film from the operating environment.

The reflective layer 108 may be formed from an element metal having a high heat conductivity such as Ag, Au, Cu or Al. An alloy such as Al—Cr, Al—Ti, Ae—Ni, Al—Cu, Au—Pd, Au—Cr, Ag—Pd, Ag—Pd—Cu, Ag—Pd—Ti, Ag—Ru—Au, Ag—Cu—Ni, Ag—Zn—Al, Ag—Nd—Au, Ag—Nd—Cu, Ag—Bi, Ag—Ga, Ag—Ga—In, Ag—Ga—Cu, Ag—In, Ag—In—Sn or Cu—Si may also be used. An alloy containing 50 atomic % or more Ag, in particular, has a high heat conductivity and is preferably used to form the reflective layer 108.

The thickness of the reflective layer 108 is preferably 30 nm or more so that the function of diffusing heat can be sufficiently performed. When the thickness of the reflective layer 108 is greater than 200 nm, however, excessive diffusion of heat would occur leading to a decrease in the recording sensitivity of the information layer 106. Accordingly, the thickness of the reflective layer 108 is preferably within a range from 30 nm to 200 nm.

An interface layer (which will hereafter be referred to as reflective-layer side interface layer for the sake of convenience in order to distinguish it from the interface layer disposed between the dielectric layer and the recording layer) may be disposed between the reflective layer 108 and the counter-incident side dielectric layer 106. In the case where the reflective-layer side interface layer is provided in the information recording medium 15 shown in FIG. 1, the interface layer may be formed as the layer indicated by reference numeral 107 between the layer indicated by reference numeral 106 and the layer indicated by reference numeral 108. In this case, the reflective-layer side interface layer may be formed from a material having a lower heat conductivity than the material of the reflective layer 108. In the case where an Ag alloy is used as the material of the reflective layer 108, the reflective-layer side interface layer may be formed from, for example, Al or an Al alloy.

Alternatively, the reflective-layer side interface layer may also be formed from an element such as Cr, Ni, Si or C, or an oxide such as $TiO_2$, $ZrO_2$, $HfO_2$, ZnO, $Nb_2O_5$, $Ta_2O_5$, $SiO_2$, $SnO_2$, $Al_2O_3$, $Bi_2O_3$, $Cr_2O_3$, $Ga_2O_3$, $In_2O_3$, $Sc_2O_3$, $Y_2O_3$, $La_2O_3$, $Gd_2O_3$, $Dy_2O_3$, $Yb_2O_3$, CaO, MgO, $CeO_2$ or $TeO_2$. The reflective-layer side interface layer may be formed from a nitride such as C—N, Ti—N, Zr—N, Nb—N, Ta—N, Si—N, Ge—N, Cr—N, Al—N, Ge—Si—N or Ge—Cr—N. Sulfides such as ZnS, carbides such as SiC, fluorides such as $LaF_3$ and C may also be used. The reflective-layer side interface layer may also be of a mixture of two or more materials selected from among those listed above. The thickness of the reflective-layer side interface layer is preferably within a range from 3 nm to 100 nm, more preferably from 10 nm to 50 nm.

In the information layer 16, it is preferable that reflectivity $R_C$ (%) of the recording layer 104 when it is in crystal phase and reflectivity $R_a$ (%) of the recording layer 104 when it is in amorphous phase satisfy a relationship $R_a<R_C$. This gives higher reflectivity in the initial state where information is not yet recorded, and thereby enables stable record reproducing operation. In order to achieve better recording and reproducing characteristic by increasing the difference in reflectivity ($R_C$-$R_a$), it is preferable that $R_c$, and $R_a$ satisfy relationships $0.2 \leq R_a \leq 10$ and $12 \leq R_C \leq 40$, more preferably $0.2 \leq R_a \leq 5$ and $12 \leq R_C \leq 30$.

The information recording medium 15 can be produced by a method described below.

First, the information layer 16 is formed on the substrate 14 (having a thickness of, for example, 1.1 mm). The information layer is formed in single-layer or multi-layer constitution. Layers that constitute the information layer can be formed successively sputtering the sputtering targets that supply the materials, in a film-forming apparatus.

Specifically, first, the reflective layer 108 is formed on the substrate 14. The reflective layer 108 can be formed by sputtering a sputtering target formed from a metal or an alloy that constitutes the reflective layer 108, in an atmosphere of rare gas (for example, argon gas) or an atmosphere of mixed gas of rare gas and reaction gas (which is at least one kind of gas selected from among $O_2$ and $N_2$).

Then the reflective-layer side interface layer is formed as required on the reflective layer 108. The reflective-layer side interface layer can be formed by sputtering a sputtering target formed from an element(s) or a compound(s) that constitutes the reflective-layer side interface layer, in the atmosphere of rare gas or the atmosphere of mixed gas of rare gas and reaction gas.

Then the counter-incident side dielectric layer 106 is formed on the reflective layer 108 or on the reflective-layer side interface layer. The counter-incident side dielectric layer 106 can be formed by sputtering a sputtering target of compound(s) (for example, $(SiO_2)_{x1}(In_2O_3)_{y1}(M1O_2)_{100-x1-y1}$ (mol %)) that constitutes the counter-incident side dielectric layer 106, in the atmosphere of rare gas or the atmosphere of mixed gas of rare gas and reaction gas (particularly $O_2$ gas). The counter-incident side dielectric layer 106 may also be formed by carrying our reactive sputtering of a sputtering target formed from a metal(s) that constitutes the counter-incident side dielectric layer 106, in the atmosphere of mixed gas of rare gas and reaction gas.

In the case where the counter-incident side dielectric layer 106 is of the Si—In—Zr/Hf—O-based material, the sputtering target (which may hereafter be referred to simply as target) preferably contains a material represented by the formula (11):

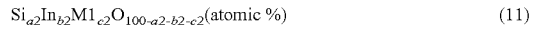

$$Si_{a2}In_{b2}M1_{c2}O_{100-a2-b2-c2} \text{(atomic \%)} \quad (11)$$

In the formula (11), a2, b2 and c2 preferably satisfy relationships: $0.5 \leq a2 < 35$, $0 < b2 < 43$, $0 < c2 < 35$, and $20 < a2+b2+c2 < 45$, and more preferably satisfy relationships: $0.5 < a2 < 20$, $3 < b2 < 40$, $0 < c2 < 25$, and $25 < a2+b2+c2 < 45$.

The layer formed by using this sputtering target contains a material represented by the formula (1). In the formula (11), proportions of Si, In, M1 and O fall in ranges which are a little different from those for formula (1). The present inventors verified that the layer that contains the material represented by the formula (1) was formed when such a target was used.

The sputtering target used to form the layer of Si—In—Zr/Hf—O-based material may contain a material represented by the formula (12):

$$(SiO_2)_{x2}(In_2O_3)_{y2}(M1O_2)_{100-x2-y2} \text{(mol \%)} \quad (12)$$

In the formula (12), x2 and y2 preferably satisfy the relationships: $2<x2\leq95$, $0<y2\leq95$, and $5\leq x2+y2<100$, and preferably satisfy the relationships: $5\leq x2\leq55$, $25\leq y2\leq85$, and $35\leq x2+y2\leq95$.

The reason for identifying the composition of the sputtering target as formula (12) is that targets that contain Si, In, M1 and O are commercialized with the proportions of oxides of Si, In, and M1 indicated. The present inventors also verified that composition of elements determined by analyzing the commercialized sputtering target by means of an X-ray micro-analyzer was substantially equal to the composition of elements calculated from the displayed composition (that is, the indicated composition (the nominal composition) was appropriate). Accordingly, a sputtering target represented by this formula can also be used satisfactorily. The same applies to the targets represented by the formulae (14), (15) and (16).

The layer formed by using the target containing the material represented by the formula (12) becomes a layer containing a material represented by the formula (1). In the formula (12), proportions of the oxides fall in ranges which are a little different from those for formula (2). The present inventors verified that the layer that contains the material represented by the formula (2) was formed when such a target was used.

In the case where the counter-incident side dielectric layer 106 is formed as the layer of Si—In—Zr/Hf—O-based material which further contains M2 (M2 represents at least one element selected from among Y, Cr and Ca), the target preferably contains a material represented by the formula (13):

$$Si_{d2}In_{e2}M1_{f2}M2_{g2}O_{100-d2-e2-f2-g2} \text{(atomic \%)} \quad (13)$$

In the formula (13), d2, e2, f2 and g2 preferably satisfy relationships: $0.5\leq d2<34$, $0<e2<43$, $0<f2<34$, $0<g2<41$, and $20<d2+e2+f2+g2<45$, and more preferably satisfy relationships: $0.5<d2<20$, $3<e2<40$, $0<f2<25$, $0<g2<28$, and $25<d2+e2+f2+g2<45$.

The layer formed by using this sputtering target contains a material represented by the formula (3). In the formula (13), proportions of Si, In, M1, M2 and O fall in ranges which are a little different from those for formula (3). The present inventors verified that the layer that contains the material represented by the formula (3) was formed when such a target was used.

The sputtering target used to form the layer of Si—In—Zr/Hf—O-based material containing M2 may contain a material represented by the formula (14):

$$(SiO_2)_{z2}(In_2O_3)_{w2}(M1O_2)_{v2}(M2_2O_3)_{100-z2-w2-v2} \text{(mol \%)} \quad (14)$$

In the formula (14), z2, w2 and v2 preferably satisfy the relationships: $2<z2<95$, $0<w2<95$, $0<v2<95$, and $10\leq z2+w2+v2<100$, and more preferably satisfy relationships: $5\leq z2\leq55$, $25\leq w2\leq85$, $5\leq v2<65$, and $45\leq z2+w2+v2<100$.

The layer formed by using the target containing a material represented by the formula (14) becomes a layer containing the material represented by the formula (4). In the formula (14), proportions of oxides fall in ranges which are a little different from those for formula (4). The present inventors verified that the layer that contains the material represented by the formula (4) was formed when such a target was used.

The sputtering target used to form the layer of Si—In—Zr/Hf—O-based material may contain a material represented by the formula (15):

$$(SiO_2)_{u2}(In_2O_3)_{t2}[(ZrO_2)_{0.97}(Y_2O_3)0.03]_{100-u2-t2} \text{(mol \%)} \quad (15)$$

In the formula (15), u2 and t2 preferably satisfy relationships: $2<u2\leq95$, $2<t2\leq95$, and $5\leq u2+t2<100$, and preferably satisfy relationships: $5\leq u2\leq55$, $25\leq t2\leq85$, and $35\leq u2+t2\leq95$.

The layer formed by using the target containing a material represented by the formula (15) becomes a layer containing the material represented by the formula (5). In the formula (15), proportions of oxides fall in ranges which are a little different from those for formula (5). The present inventors verified that the layer that contains the material represented by the formula (5) was formed when such a target was used.

The sputtering target used to form the layer of Si—In—Zr/Hf—O-based material may contain a material represented by the formula (16):

$$(SiO_2)_{s2}(In_2O_3)_{r2}[(ZrO_2)_{0.92}(Y_2O_3)_{0.08}]_{100-s2-r2} \text{(mol \%)} \quad (16)$$

In the formula (16), s2 and r2 preferably satisfy relationships: $2<s2\leq95$, $2<r2\leq95$, and $5\leq s2+r2<100$, and more preferably satisfy relationships: $5\leq s2\leq55$, $25\leq r2\leq85$, and $35\leq s2+r2\leq95$.

The layer formed by using the target containing a material represented by the formula (16) becomes a layer containing the material represented by the formula (6). In the formula (16), proportions of oxides fall in ranges which are a little different from those for formula (6). The present inventors verified that the layer that contains the material represented by the formula (6) was formed when such a target was used.

Any of the sputtering targets described above may contain at least one component selected from among carbon (C); oxide of at least one element selected from among Sc, La, Gd, Dy, Yb, Al, Mg, Zn, Ta, Ti, Ca, Ce, Sn, Te, Nb and Bi; nitride of at least one element selected from among Si, Cr, Al and Ge; and Si—C. Proportions of these components in the target are controlled so that contents of these components in the layer of Si—In—Zr/Hf—O-based material do not exceed 20 mol % or 10 atomic %.

The layer of Si—In—Zr/Hf—O-based material may also be formed by sputtering single-compound sputtering targets simultaneously, which are represented, for example, $SiO_2$, $In_2O_3$, $M1O_2$ and $M2_2O_3$, respectively, by using a plurality of powers. Alternatively, the layer of Si—In—Zr/Hf—O-based material may also be formed by dividing $SiO_2$, $In_2O_3$, $M1O_2$ and, as required, $M2_2O_3$, into two or more groups and simultaneously sputtering binary- or tertiary-component sputtering targets comprising the groups of the oxides, respectively, by using a plurality of powers. In any case, the sputtering operation may be carried out in an atmosphere of rare gas or an atmosphere of mixed gas of rare gas and reaction gas (particularly $O_2$ gas).

In the case where the counter-incident side dielectric layer 106 is not formed as the layer of Si—In—Zr/Hf—O-based material, the counter-incident side dielectric layer 106 is formed by sputtering, using a sputtering target prepared in accordance to the compounds that would constitute the counter-incident side dielectric layer 106. In this case, too, the sputtering operation may be carried out in the atmosphere of rare gas or the atmosphere of mixed gas of rare gas and reaction gas (particularly $O_2$ gas).

Then the counter-incident side interface layer 105 is formed, as required, on the counter-incident side dielectric layer 106. The counter-incident side interface layer 105 can be formed by a method similar to the method described in relation to the counter-incident side dielectric layer 106, as the layer of Si—In—Zr/Hf—O-based material or as another layer.

Then the recording layer 104 is formed on the counter-incident side dielectric layer 106 or the counter-incident side interface layer 105. The recording layer 104 can be formed, in accordance to the composition thereof, by sputtering a sputtering target formed from a Ge—Te-M3 alloy, a sputtering target formed from a Ge-M4—Te-M3 alloy, a sputtering target formed from a Ge—Sn—Te alloy, a sputtering target formed from a Sb-M5 alloy or a sputtering target formed from a Te—Pd alloy, by using a single power. The sputtering operation may be carried out in an atmosphere of rare gas or an atmosphere of mixed gas of rare gas and reaction gas.

The recording layer 104 may also be formed by simultaneously sputtering single-component sputtering targets which are represented by Ge, Te, M3, M4, Sb, M5 and Pd, respectively, by using a plurality of powers. Alternatively, the recording layer 104 may also be formed by dividing the component Ge, Te, M3, M4, Sb, M5 and Pd into two or more groups and sputtering simultaneously binary- or tertiary-component sputtering targets comprising the groups of the oxides, respectively, by using a plurality of powers. In any case, the sputtering operation may be carried out in the atmosphere of rare gas or the atmosphere of mixed gas of rare gas and reaction gas.

Then the incident side interface layer 103 is formed, as required, on the recording layer 104. The incident side interface layer 103 can be formed by a method similar to that for the counter-incident side dielectric layer 106.

Then the incident side dielectric layer 102 is formed on the recording layer 104 or the incident side interface layer 103. The incident side dielectric layer 102 can be formed by a method similar to that for the counter-incident side dielectric layer 106.

Last, the transparent layer 13 is formed on the incident side dielectric layer 102. The transparent layer 13 can be formed by applying a photocurable resin (particularly an ultraviolet curable resin) or a delayed-action resin onto the incident side dielectric layer 102 by spin coating and curing the resin. The transparent layer 13 may also be a transparent substrate of disk shape. The transparent layer 13 may be formed from a resin such as polycarbonate, amorphous polyolefin or PMMA or glass. In this case, the transparent layer 13 may also be formed by applying a photocurable resin (particularly an ultraviolet curable resin) or a delayed-action resin onto the incident side dielectric layer 102 and putting the substrate into close contact with the incident side dielectric layer 102 by spin coating and curing the resin. The substrate may also uniformly coated with an adhesive resin and put into close contact with the incident side dielectric layer 102.

After forming the incident side dielectric layer 102, or after forming the transparent layer 13, initialization process may be carried out to crystallize the recording layer 104 over the entire surface thereof. Crystallization of the recording layer 104 can be carried out by irradiating it with a laser beam.

The information recording medium 15 can be produced as described above. In this embodiment, the layers are formed by the sputtering process. But the step of forming the layers is not restricted to this, and vacuum deposition process, ion plating process, chemical vapor deposition process (CVD), molecular beam epitaxy process (MBE) or the like may also be employed.

Second Embodiment

Figure 2:
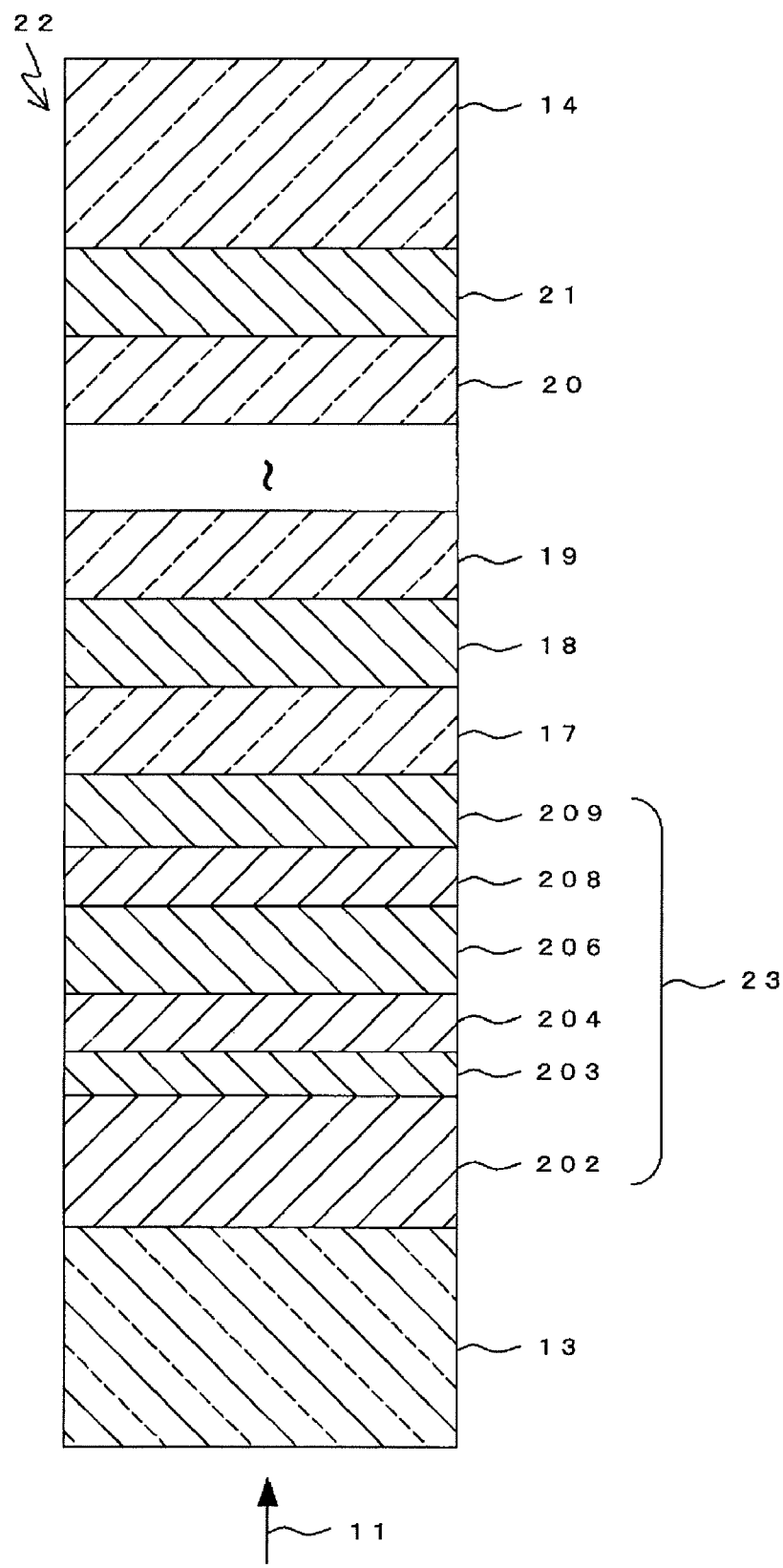
FIG. 2 is a partial sectional view showing an example of layer constitution of an information recording medium having N information layers, according to the present invention.

Another example of the information recording medium of the present invention will be described as a second embodiment. A partial sectional view of the information recording medium 22 of the second embodiment is shown in FIG. 2. The information recording medium 22 is a multi-layer optical information recording medium on and from which information can be recorded and reproduced by the laser beam 11 which is applied on one side of the medium. The information recording medium 22 is constituted from:

N sets (N is 2 or larger natural number) of information layers including the information layer 21, the information layer 18 and the first information layer 23 that are stacked successively with the optical separation layer 20, 19, 17, etc. therebetween on the substrate 14; and the transparent layers 13. The first information layer 23 and the information layer 18 that are within the first (N−1) information layers on the side where the laser beam 11 enters (the K-th information layer ($1 \leq K \leq N$) counted from the side where the laser beam 11 enters will hereafter be referred to as the K-th information layer), are light transmitting information layers. The substrate 14 and the transparent layer 13 may be formed from material similar to that described in the first embodiment, and configurations (including preferable thickness) and the functions thereof are similar to the configurations and the functions described in the first embodiment.

The optical separation layer 20, 19, 17, etc. are of a resin such as photocurable resin (particularly an ultraviolet curable resin such as epoxy resin or acrylic resin) or delayed-action resin, or a dielectric material. The optical separation layer 20, 19 and 17 preferably have low light absorptance to the laser beam 11 used, and a low complex index of refraction in the short wavelength range.

The optical separation layer 20, 19, 17, etc. are provided for the purpose of distinguishing the focusing positions of the first information layer 23, the information layers 18 and 21 of the information recording medium 22. Thicknesses of the optical separation layer 20, 19, 17, etc. must not be smaller than the focal depth $\Delta Z$ that is determined by the numerical aperture NA of the objective lens and the wavelength $\lambda$ of the laser beam 11. If it is assumed that a reference intensity of the focused point of light is 80% of that when there is no aberration, $\Delta Z$ can be approximated as $\Delta Z = \lambda / \{2(NA)^2\}$. When $\lambda = 405$ nm and NA=0.85, $\Delta Z = 0.280$ μm is obtained which means that a region within ±0.3 μm falls in the focal depth. This implies that the optical separation layer 20, 19, 17, etc. must have a thickness not less than 0.6 μm.

The distance between two neighboring information layers and the distance between the first information layer 23 and the N-th information layer that is farthest therefrom are preferably set so that the laser beam 11 can be focused by using the objective lens. Accordingly, total thickness of the optical separation layer 20, 19, 17, etc. is preferably set within a tolerance (for example, 50 μm or less) permitted by the objective lens.

The optical separation layer 20, 19, 17, etc. may have a guide groove formed as required to guide the laser beam on the surface where the laser beam 11 enters. In this case, information can be recorded on and reproduced from the K-th information layer (K is a natural number satisfying $1 < K \leq N$) by means of the laser beam 11 that has transmitted through the first to (K−1)th information layers by irradiating only on one side with the laser beam 11.

Any of the first to N-th information layers may be used as a read-only memory (ROM) information layer for reproduction only or a write once (WO) information layer that allows writing only once.

The constitution of the first information layer 23 will be described in detail below.

The first information layer 23 includes a first incident side dielectric layer 202, a first incident side interface layer 203, a first recording layer 204, a first counter-incident side dielectric layer 206, a first reflective layer 208 and a transmittance adjustment layer 209, that are disposed in this order from the side where the laser beam 11 enters.

The first incident side dielectric layer 202 serves, similarly to the incident side dielectric layer 102 of the first embodiment, to adjust the optical distance so as to improve the light absorption efficiency of the first recording layer 204 and increase the difference in the reflected light intensity before and after recording so as to increase the signal intensity. The first incident side dielectric layer 202 can be formed by using a material similar to that used for the incident side dielectric layer 102 of the first embodiment.

The thickness of the first incident side dielectric layer 202 can be exactly determined by calculation based on a matrix method, so as to satisfy the conditions for achieving greater change between the intensity of light reflected by the first recording layer 204 in crystal phase and that reflected by the first recording layer 204 in amorphous phase; achieving greater absorption of light by the first recording layer 204; and higher transmittance of the first information layer 23.

The first incident side interface layer 203 can be formed by using a material similar to that used for the incident side interface layer 103 of the first embodiment. Configurations (including preferable thickness) and the functions of the first incident side interface layer 203 are similar to those of the incident side interface layer 103 of the first embodiment. The first incident side interface layer 103 may or may not be provided as required.

The first counter-incident side dielectric layer 206 has a function similar to that of the first incident side dielectric layer 202. The first counter-incident side dielectric layer 206 can be formed by using a material similar to that used for the counter-incident side dielectric layer 106 of the first embodiment. The thickness of the first counter-incident side dielectric layer 206 is preferably within a range from 0.5 nm to 75 nm, more preferably from 1 nm to 40 nm. The first counter-incident side dielectric layer 206 having a thickness within this range is capable of diffusing heat generated in the first recording layer 204 efficiently toward the first reflective layer 208.

The first counter-incident side interface layer may also be disposed between the first recording layer 204 and the first counter-incident side dielectric layer 206. The first counter-incident side interface layer can be formed by using a material similar to that used for the counter-incident side interface layer 105 of the first embodiment. Preferable thickness of the first counter-incident side interface layer is the same as that of the counter-incident side interface layer 105 of the first embodiment. In the case where the first counter-incident side interface layer is provided in the medium shown in FIG. 2, the layer can be identified as a layer indicated by the reference numeral 205 located between the layer indicated by, for example, the reference numeral 204 and the layer indicated by the reference numeral 206.

The first recording layer 204 is formed from a material that can undergo phase transition between crystal phase and amorphous phase when irradiated with the laser beam 11. The first recording layer 204 may be formed from a material represented by a formula $Ge_A M3_B Te_{3+A}$, $(Ge-M4)_A M3_B Te_{3+A}$ or GeTe—SnTe, as described previously. The elements represented by M3 and M4 in these formulae and preferable ranges of A and B are as described in relation to the first embodiment, and will be omitted here.

The first information layer 23 is required to have high transmittance to light, in order to have the laser beam, with a sufficient amount of light required for recording and reproducing information, reach the information layer located farther than the first information layer 23 from the side where the laser beam 11 enters. For this reason, thickness of the first recording layer 204 is preferably 9 nm or less, and more preferably within a range from 2 nm to 8 nm.

The first recording layer 204 may be formed from a material that undergoes irreversible phase transition such as a material represented by Te—Pd—O. In this case, a thickness of the first recording layer 204 is preferably within a range from 5 nm to 30 nm.

The first reflective layer 208 has an optical function to increase the amount of light absorbed by the first recording layer 204. The first reflective layer 208 also has a thermal function to quickly diffuse the heat generated in the first recording layer 204 and facilitate the phase transition of the first recording layer 204 into amorphous phase. The first reflective layer 208 further has a function to protect the multi-layer film from the operating environment.

The first reflective layer 208 can be formed by using a material similar to that used for the reflective layer 108 of the first embodiment. An Ag alloy, that has a high thermal conductivity, is particularly preferable as the material for the first reflective layer 208. The thickness of the first reflective layer 208 is preferably within a range from 3 nm to 15 nm, and more preferably within a range from 6 nm to 12 nm, in order to increase the transmittance of the first information layer 23. The first reflective layer 208 having a thickness in this range is capable of achieving sufficient heat diffusion, ensuring satisfactory level of reflectivity of the first information layer 23 and increasing the transmittance of the first information layer 23 to a sufficiently high level.

The transmittance layer 209 is formed from a dielectric material, and has the function to adjust the transmittance of the first information layer 23. The transmittance adjustment layer 209 enables it to increase both the transmittance $T_C$ (%) of the first information layer 23 when the first recording layer 204 is in crystal phase and the transmittance $T_a$ (%) of the first information layer 23 when the first recording layer 204 is in amorphous phase. Specifically, the transmittance of the first information layer 23 provided with the transmittance adjustment layer 209 is about 2% to 10% higher than that of the layer without the transmittance adjustment layer 209. The transmittance adjustment layer 209 effectively diffuses the heat generated in the first recording layer 204.

A refractive index $n_t$ and an extinction coefficient $k_t$ of the transmittance adjustment layer 209 are preferably set to satisfy $2.0 \leq n_t$ and $k_t \leq 0.1$, more preferably $2.4 \leq n_t \leq 3.0$ and $k_t \leq 0.05$, so as to have greater effect of increasing the transmittance $T_C$ and $T_a$ of the first information layer 23.

It is preferable that a thickness L of the counter-incident side dielectric layer 209 satisfies relationship: $(1/32)\lambda/n_t \leq L \leq (3/16)\lambda/n_t$ or $(17/32)\lambda/n_t \leq L \leq (11/16)\lambda/n_t$, and more preferably $(1/16)\lambda/n_t \leq L \leq (5/32)\lambda/n_t$ or $(9/16)\lambda/n_t \leq L \leq (21/32)\lambda/n_t$. When the wavelength $\lambda$ of the laser beam 11 and the refractive index $n_t$ of the transmittance adjustment layer 209 are set so as to satisfy the relationships: $350 \text{ nm} \leq \lambda \leq 450 \text{ nm}$ and $2.0 \leq n_t \leq 3.0$, for example, a preferable range of L becomes $3 \text{ nm} \leq L \leq 40 \text{ nm}$ or $60 \text{ nm} \leq L \leq 130 \text{ nm}$, and more preferable range of L becomes $7 \text{ nm} \leq L \leq 30 \text{ nm}$ or $65 \text{ nm} \leq L \leq 120 \text{ nm}$. Both the transmittance $T_c$ and $T_a$ of the first information layer 23 can be increased by setting the value of L in this range.

The transmittance adjustment layer 209 may be formed from one or more oxides selected from among $TiO_2$, $ZrO_2$, $HfO_2$, ZnO, $Nb_2O_5$, $Ta_2O_5$, $SiO_2$, $Al_2O_3$, $Bi_2O_3$, $CeO_2$, $Cr_2O_3$, $Ga_2O_3$ and Sr—O. The layer may be formed from one or more nitride selected from among Ti—N, Zr—N, Nb—N, Ta—N, Si—N, Ge—N, Cr—N, Al—N, Ge—Si—N and Ge—Cr—N. Sulfides such as ZnS may also be used. The transmittance adjustment layer 209 may also be formed from a mixture of one or more material selected from among those listed above. It is particularly preferable to use $TiO_2$ or a material containing $TiO_2$. Since these material have a high refractive index (n=2.6 to 2.8) and low extinction coefficient (k=0.0 to 0.05), the transmittance adjustment layer 209 formed from one of these materials enables it to further increase the transmittance of the first information layer 23.

Values of the transmittance $T_c$ and $T_a$ of the first information layer 23 preferably satisfy relationships: $40 < T_c$ and $40 < T_a$, and more preferably satisfy relationships: $46 < T_c$ and $46 < T_a$, in order to have the laser beam, with a sufficient amount of light required for recording and reproducing information, reach the information layer located farther than the first information layer 23 from the side where the laser beam 11 enters.

Values of transmittance $T_c$ and $T_a$ of the first information layer 23 preferably satisfy a relationship: $-5 \leq (T_c - T_a) \leq 5$, and more preferably satisfy a relationship: $-3 \leq (T_c - T_a) \leq 3$. When $T_c$ and $T_a$ are in this range, there occurs less influence of a change in transmittance due to the state of the first recording layer 204 of the first information layer 23 and good recording and reproducing characteristics can be obtained, when recording or reproducing information on or from the information layer located farther than the first information layer 23 from the side where the laser beam 11 enters.

In the first information layer 23, it is preferable that reflectivity $R_{C1}$ (%) of the first recording layer 204 when it is in crystal phase and reflectivity $R_{a1}$ (%) of the first recording layer 204 when it is in amorphous phase satisfy inequality $R_{a1} < R_{C1}$. This enables it to achieve a higher reflectivity in the initial state where information is not yet recorded, thereby enabling stable recording and reproducing operation. In order to achieve better recording and reproducing characteristic by increasing the difference in reflectivity ($R_{C1} - R_{a1}$), it is preferable that $R_a$ and $R_{C1}$ satisfy relationships: $0.1 \leq R_{a1} \leq 5$ and $4 \leq R_{C1} \leq 15$, and more preferably satisfy relationships: $0.1 \leq R_{a1} \leq 3$ and $4 \leq R_{C1} \leq 10$.

The information recording medium 22 can be produced as described below.

First, (N−1) information layers are formed successively with the optical separation layer therebetween on the substrate 14 (having a thickness of, for example, 1.1 mm). The information layer may be a single layer or multiple layers. The layers that constitute the information layers can be formed by successively sputtering the sputtering targets that supply the materials within a film-forming apparatus. The optical separation layer can be formed by applying a photocurable resin (particularly an ultraviolet curable resin) or delayed-action resin onto the information layer, then rotating the substrate 14 so as to spread the resin uniformly (spin coating) and curing the resin. In the case where the optical separation layer has a guide groove for the laser beam 11, the guide groove can be formed by putting the resin that has not yet cured, into contact with the substrate (die) whereon the groove has been formed, rotating the substrate 14 together with the die for spin coating, then curing the resin and then removing the substrate (die).

After forming the (N−1) information layers with the optical separation layer therebetween on the substrate 14, the optical separation layer 17 is further formed.

Then the first information layer 23 is formed on the optical separation layer 17. Specifically, first the (N−1) information layers are formed with the optical separation layer therebetween on the substrate, then the optical separation layer 17 is formed on the second information layer. Then the substrate 14 is put into the film-forming apparatus and the transmittance adjustment layer 209 is formed on the optical separation layer 17. The transmittance adjustment layer 209 can be formed by a method similar to that for the counter-incident side dielectric layer 106 of the first embodiment.

Then the first reflective layer 208 is formed on the transmittance adjustment layer 209. The first reflective layer 108 can be formed by a method similar to that for the reflective layer 108 of the first embodiment. Then the first counter-incident side dielectric layer 206 is formed on the first reflective layer 208. The first counter-incident side dielectric layer 206 can be formed by a method similar to that for the counter-incident side dielectric layer 106 of the first embodiment.

Then the first counter-incident side interface layer is formed as required on the first counter-incident side dielectric layer 206. The first counter-incident side interface layer can be formed by a method similar to that for the counter-incident side dielectric layer 106 of the first embodiment.

Then the first recording layer 204 is formed on the first counter-incident side interface layer or the first counter-incident side dielectric layer 206. The first recording layer 204 can be formed by a method similar to that for the recording layer 104 of the first embodiment by using a sputtering target that is based on the composition of the layer 204. Then the first incident side interface layer 203 is formed on the first recording layer 204. The first incident side interface layer 203 can be formed by a method similar to that for the counter-incident side dielectric layer 106 of the first embodiment.

Then the first incident side dielectric layer 202 is formed on the first incident side interface layer 203. The first incident side dielectric layer 202 can be formed by a method similar to that for the counter-incident side dielectric layer 106 of the first embodiment. Last, the transparent layer 13 is formed on the incident side dielectric layer 202. The transparent layer 13 can be formed by the method described in the first embodiment.

After forming the first incident side dielectric layer 202, or after forming the transparent layer 13, initialization process may be carried out to crystallize the first recording layer 204 over the entire surface thereof, as required. Crystallization of the first recording layer 204 can be carried out by irradiating it with laser beam. Also the recording layers of other information layers may be initialized in this stage as required.

The information recording medium 22 can be produced as described above. In this embodiment, the layers are formed by the sputtering process. But the technique of forming the layers is not restricted to this, and vacuum vapor deposition process, ion plating process, CVD process, MBE process or the like may be employed.

Third Embodiment

Figure 3:
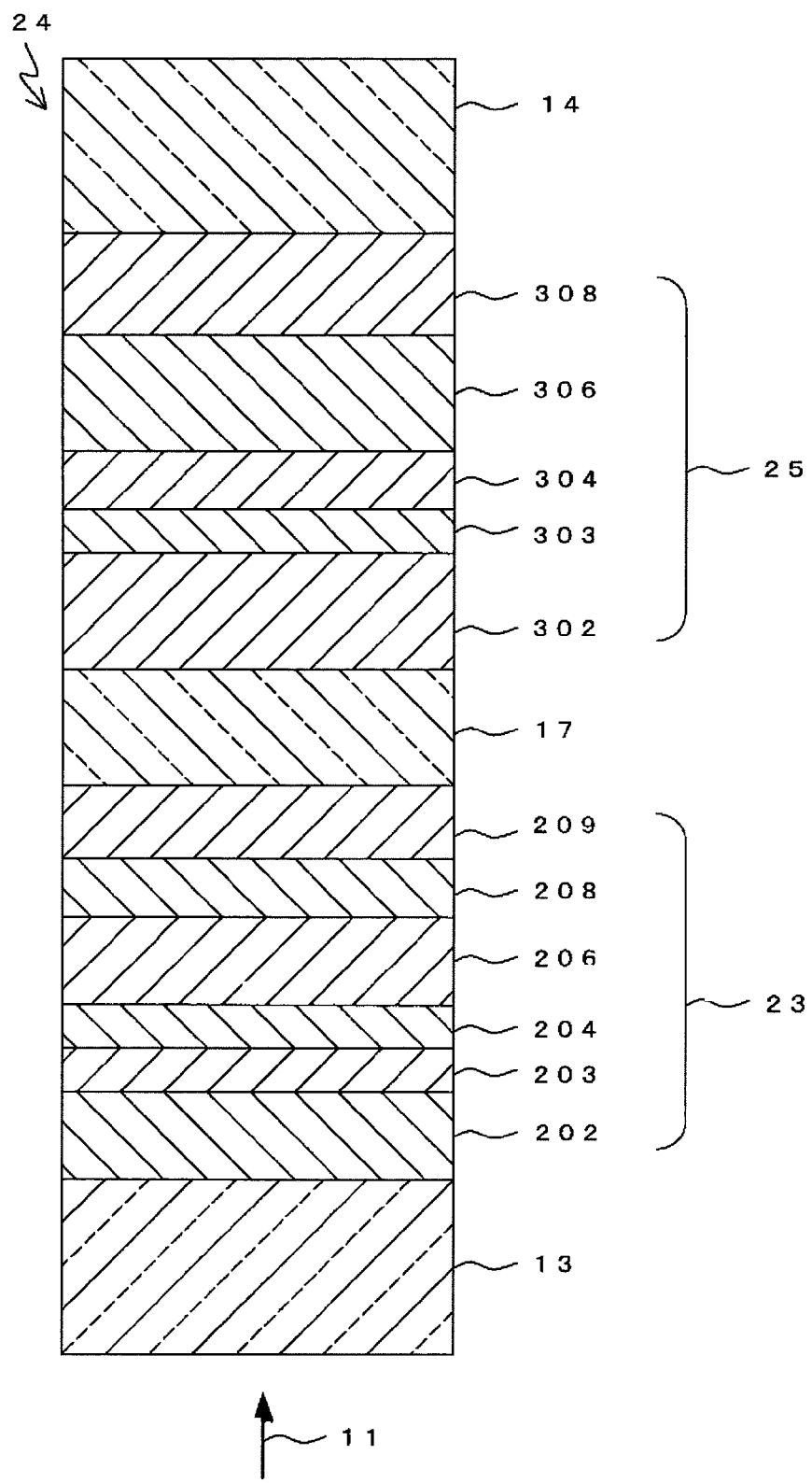
FIG. 3 is a partial sectional view showing an example of layer constitution of an information recording medium having two information layers, according to the present invention.

Another example of the information recording medium that is constituted from two sets of information layers, namely by setting N=2 in the multi-layer optical information recording medium according to the second embodiment of the present invention, will be described as the third embodiment. A partial sectional view of the information recording medium 24 of the third embodiment is shown in FIG. 3. The information recording medium 24 is a double-layer optical information recording medium on and from which information can be recorded and reproduced by irradiation of the laser beam 11 which is applied on one side of the medium.

The information recording medium 24 is constituted from a second information layer 25, the optical separation layer 17, the first information layer 23 and the transparent layer 13 which are formed successively on the substrate 14. The substrate 14, the optical separation layer 17, the first information layer 23 and the transparent layer 13 may be formed from materials similar to those described in the first and second embodiments, and configurations (including a preferable thickness) and the functions thereof are similar to the configurations and the functions of the layers described in the first and second embodiments.

The constitution of the second information layer 25 will be described in detail below.

The second information layer 25 comprises a second incident side dielectric layer 302, a second incident side interface layer 303, a second recording layer 304, a second counter-incident side dielectric layer 306 and a second reflective layer 308, that are disposed in this order from the side where the laser beam 11 enters. Recording and reproduction of information on and from the second information layer 25 are carried out by means of the laser beam 11 that has transmitted through the transparent layer 13, the first information layer 23 and the optical separation layer 17.

The second incident side dielectric layer 302 can be formed by using a material similar to that used for the incident side dielectric layer 102 of the first embodiment, and the function thereof is similar to that of the incident side dielectric layer 102 of the first embodiment.

The thickness of the second incident side dielectric layer 302 can be exactly determined by calculation based on the matrix method, so as to achieve greater change between the intensity of light reflected by the second recording layer 304 in crystal phase and that reflected by the second recording layer 304 in amorphous phase.

The second incident side interface layer 303 can be formed by using a material similar to that used for the incident side interface layer 103 of the first embodiment. Functions and configurations (including a preferable thickness) of the second incident side interface layer 303 are similar to those of the incident side interface layer 103 of the first embodiment. The second incident side interface layer 303 may or may not be provided as required.

The second counter-incident side dielectric layer 306 can be formed by using a material similar to that used for the counter-incident side dielectric layer 106 of the first embodiment. Functions and configurations (including a preferable thickness) of the second counter-incident side dielectric layer are similar to those of the counter-incident side dielectric layer 106 of the first embodiment.

The second counter-incident side interface layer may also be disposed between the second recording layer 304 and the second counter-incident side dielectric layer 306. The second counter-incident side interface layer can be formed by using a material similar to that used for the counter-incident side interface layer 105 of the first embodiment. Functions and configurations (including a preferable thickness) of the second counter-incident side interface layer are the same as those of the counter-incident side interface layer 105 of the first embodiment. In the case where the second counter-incident side interface layer is provided in the medium shown in FIG. 3, the layer can be identified as a layer indicated by the reference numeral 305 located between the layer indicated by the reference numeral 304 and the layer indicated by the reference numeral 306.

The second recording layer 304 is formed from a material similar to that used for the recording layer 104 of the first embodiment. In the case where the material of the second recording layer 304 is one that can undergo reversible phase transition (such as $Ge_A M3_B Te_{3+A}$), the thickness thereof is preferably in a range from 6 nm to 15 nm in order to improve the recording sensitivity of the second information layer 25. When the second recording layer 304 has a higher thickness within this range, diffusion of heat in the direction within the plane causes a larger thermal effect to a region adjacent to the recording section. When the second recording layer 304 is thinner, the reflectivity of the second information layer 25 decreases. Accordingly, the thickness of the second recording layer 304 is more preferably within a range from 8 nm to 13 nm. In the case where the second recording layer 304 is formed from a material that undergoes irreversible phase transition (for example, Te—Pd—O), the thickness of the second recording layer 304 is preferably in a range from 10 nm to 40 nm similarly to the case of the first embodiment.

The second reflective layer 308 can be formed by using a material similar to that used for the reflective layer 108 of the first embodiment. Functions and configurations (including preferable thickness) of the second reflective layer are similar to those of the reflective layer 108 of the first embodiment.

The second counter-incident side interface layer may also be disposed between the second reflective layer 308 and the second counter-incident side dielectric layer 306. The second counter-incident side interface layer can be formed by using a material similar to that used for the reflective-layer side interface layer described in the first embodiment. Functions and configurations (including a preferable thickness) of the second reflective-layer side interface layer are similar to those of the interface layer 107 of the first embodiment. In the case where the reflective-layer side interface layer is provided in the medium shown in FIG. 3, the layer can be identified as a layer indicated by the reference numeral 307 located between the layer indicated by the reference numeral 306 and the layer indicated by the reference numeral 308.

The information recording medium 24 can be produced by a method described below.

First, the second information layer 25 is formed on the substrate 14 (having a thickness of, for example, 1.1 mm) that is placed in a film-forming apparatus.

Then the second reflective layer 308 is formed on the substrate 14. In the case where the substrate 14 has a guide groove formed thereon for guiding the laser beam 11, the second reflective layer 308 is formed on the side where the guide groove is formed. The second reflective layer 308 can be formed by a method similar to that for the reflective layer 108 of the first embodiment.

Then the second reflective-layer side interface layer is formed as required on the second reflective layer 308. The reflective-layer side interface layer can be formed by a method similar to that for the counter-incident side dielectric layer 106 of the first embodiment.

Then the second counter-incident side dielectric layer 306 is formed on the second reflective layer 308 or on the second reflective-layer side interface layer. The second counter-incident side dielectric layer 306 can be formed by a method similar to that for the counter-incident side dielectric layer 106 of the first embodiment. Then the second counter-incident side interface layer is formed as required on the second counter-incident side dielectric layer 306. The second counter-incident side interface layer can be formed by a method similar to that for the counter-incident side dielectric layer 106 of the first embodiment.

Then the second recording layer 304 is formed on the second counter-incident side dielectric layer 306 or on the second counter-incident side interface layer. The second recording layer 304 can be formed by a method similar to that for the recording layer 104 of the first embodiment by using a sputtering target that is based on the composition of the layer 304.

Then the second incident side interface layer 303 is formed as required on the second recording layer 304. The second incident side interface layer 303 can be formed by a method similar to that for the counter-incident side dielectric layer 106 of the first embodiment. Then the second incident side dielectric layer 302 is formed on the second recording layer 304 or on the second incident side interface layer 303. The second incident side dielectric layer 302 can be formed by a method similar to that for the counter-incident side dielectric layer 106 of the first embodiment. The second information 25 is formed as described above.

Then the optical separation layer 17 is formed on the second incident side dielectric layer 302 of the second information layer 25. The optical separation layer 17 can be formed by applying a photocurable resin (particularly an ultraviolet curable resin) or delayed-action resin onto the second incident side dielectric layer 302, then carrying out spin coating operation and curing the resin. In the case where the optical separation layer 17 has a guide groove for the laser beam 11, the guide groove can be formed by putting the resin that has not yet cured into contact with the substrate (die) whereon the groove has been formed, rotating the substrate 14 together with the die for spin coating, then curing the resin and then removing the substrate (die).

After forming the second incident side dielectric layer 302, or after forming the optical separation layer 17, initialization process may be carried out to crystallize the second recording layer 304 over the entire surface thereof, if necessary. Crystallization of the second recording layer 304 can be carried out by irradiating it with laser beam.

Then the first information layer 23 is formed on the optical separation layer 17. Specifically, the transmittance adjustment layer 209, the first reflective layer 208, the first counter-incident side dielectric layer 206, the first recording layer 204, the first incident side interface layer 203, and the first incident side dielectric layer 202 are formed in this order on the optical separation layer 17. The first counter-incident side interface layer may be formed as required between the first counter-incident side dielectric layer 206 and the first recording layer 204. These layers can be formed by a method similar to that described in the second embodiment. Last, the transparent layer 13 is formed on the first counter-incident side dielectric layer 202. The transparent layer 13 can be formed by a method similar to that described in the first embodiment.

After forming the first incident side dielectric layer 202, or after forming the transparent layer 13, initialization process may be carried out as required to crystallize the first recording layer 204 over the entire surface thereof. Crystallization of the first recording layer 204 can be carried out by irradiation of the laser beam.

After forming the first incident side dielectric layer 202, or after forming the transparent layer 13, initialization process may be carried out as required to crystallize the second recording layer 304 and the first recording layer 204 over the entire surface thereof. In this case, crystallization of the second recording layer 304 is preferably carried out first, since the output power of laser required for carrying out the crystallization of the second recording layer 304 increases when crystallization of the first recording layer 204 is carried out first.

The information recording medium 24 can be produced as described above. In this embodiment, the layers are formed by the sputtering process. But the step of forming the layers is not restricted to this, and vacuum vapor deposition process, ion plating process, CVD process, MBE process or the like may be employed.

Fourth Embodiment

Figure 4:
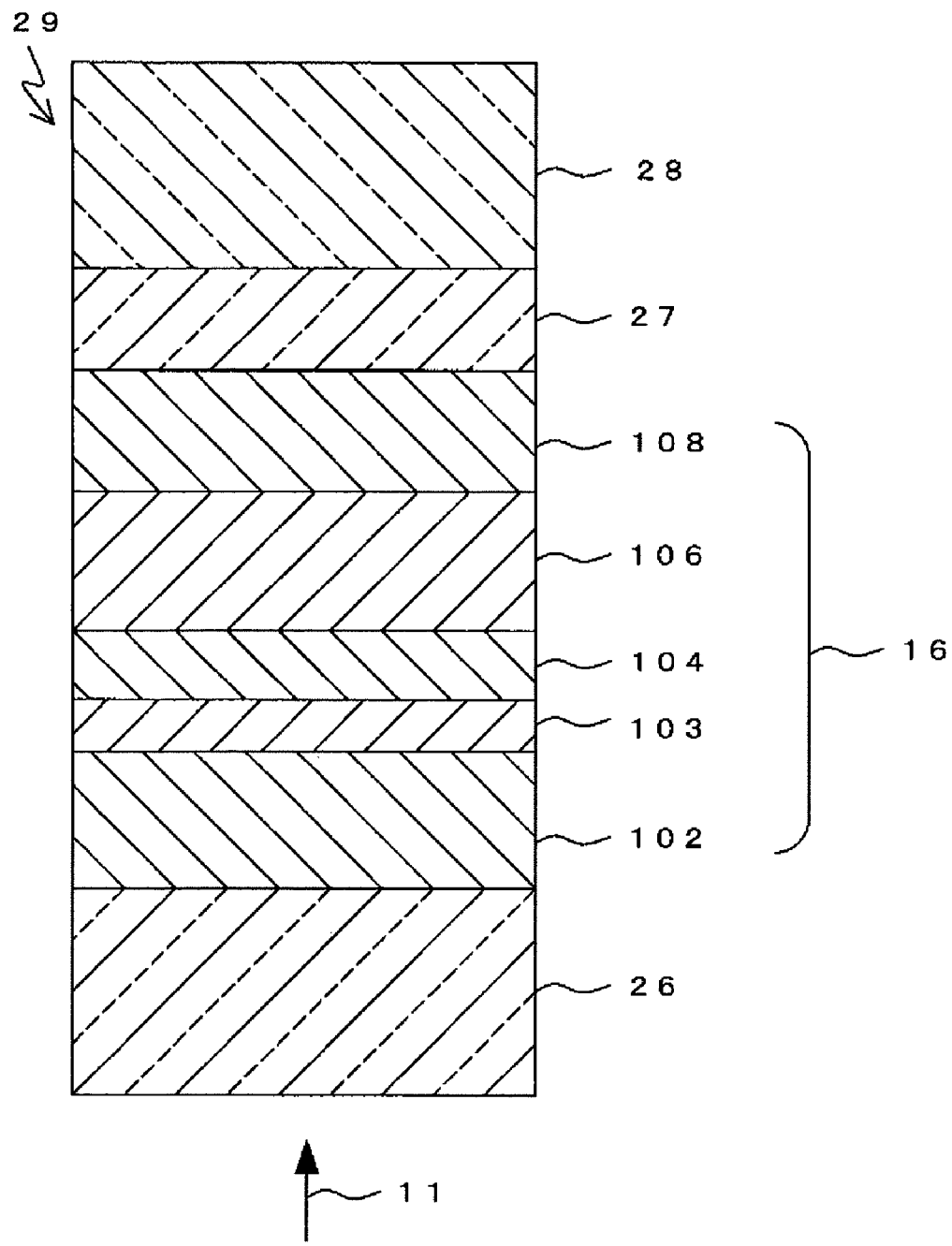
FIG. 4 is a partial sectional view showing an example of layer constitution of the information recording medium having one information layer, according to the present invention.

Another example of the information recording medium of the present invention will be described as the fourth embodiment. A partial sectional view of the information recording medium 29 of the fourth embodiment is shown in FIG. 4. The information recording medium 29 is an optical information recording medium on and from which information can be recorded and reproduced by irradiation of the laser beam 11 similarly to the information recording medium 15 of the first embodiment.

The information recording medium 29 has such a constitution wherein a dummy substrate 28 is adhered on the information layer 16 formed on the substrate 26 by means of an adhesive layer 27. The substrate 26 and the dummy substrate 28 are transparent substrates of disk shape. The substrate 26 and the dummy substrate 28 may be formed from a resin such as polycarbonate, amorphous polyolefin or PMMA or glass, similarly to the substrate 14 of the first embodiment. The substrate 26 and the dummy substrate 28 are preferably formed of polycarbonate for the reason of good transfer property, ease of mass production and low cost.

The substrate 26 may have a guide groove formed as required to guide the laser beam on the surface of the incident side dielectric layer 102 side. The surface of the substrate 26 opposite to the incident side dielectric layer 102 side and the surface of the dummy substrate 28 opposite to the adhesive layer 27 side are preferably smooth. The substrate 26 and the dummy substrate 28 have a thickness preferably in a range from 0.3 mm to 0.9 mm, so as to ensure a sufficient strength and to enable the information recording medium 29 to have a thickness of about 1.2 mm.

The adhesive layer 27 is formed preferably from a resin such as photocurable resin (particularly an ultraviolet curable resin such as epoxy resin or an acrylic resin) or delayed-action resin, that has a low light absorptance to the laser beam 11 used, and a low complex rebirefringence coefficient in the short wavelength range. The thickness of the adhesive layer 27 is preferably within a range from 0.6 µm to 50 µm, for the same reason as that cited in relation to the optical separation layer 19 and 17.

Description will be omitted for the portion identified with the same reference numeral as that in the first embodiment.

The information recording medium 29 can be produced by a method described below.

First, the information layer 16 is formed on the substrate 26 (having a thickness of, for example, 0.6 mm). In the case where the substrate 26 has guide groove formed thereon for guiding the laser beam 11, the information layer 16 is formed on the side where the guide groove is formed. Specifically, the substrate 26 is placed in a film-forming apparatus, so as to successively form the incident side dielectric layer 102, the incident side interface layer 103, the recording layer 104, the counter-incident side dielectric layer 106 and the reflective layer 108. The counter-incident side interface layer may be formed as required between the recording layer 104 and the counter-incident side dielectric layer 106. Moreover, reflective-layer side interface layer may be formed as required between the counter-incident side dielectric layer 106 and the reflective layer 108. The method for forming the layers is similar to the method for forming each of the layers of the first embodiment.

Then the dummy substrate 28 (having a thickness of, for example, 0.6 mm) is laminated by using the adhesive layer 27 onto the substrate 26 whereon the information layer 16 has been formed. Specifically, a photocurable resin (particularly an ultraviolet curable resin) or delayed-action resin is applied onto the dummy substrate 28, spin coating operation is carried out with the substrate 26 having the information layer 16 formed thereon being put into close contact with the dummy substrate 28, and the resin is cured. Alternatively, the dummy substrate 28 may also be uniformly coated with an adhesive resin in advance and put into close contact with the substrate 26 having the information layer 16 formed thereon.

After the substrate 26 is adhered to the dummy substrate 28, initialization process may be carried out to crystallize the recording layer 104 over the entire surface thereof, as required. Crystallization of the recording layer 104 can be carried out by irradiation with laser beam.

The information recording medium 29 can be produced as described above. In this embodiment, the layers are formed by the sputtering process. But the step of forming the layers is not restricted to this, and vacuum vapor deposition process, ion plating process, CVD process, MBE process or the like may be employed.

Fifth Embodiment

Figure 5:
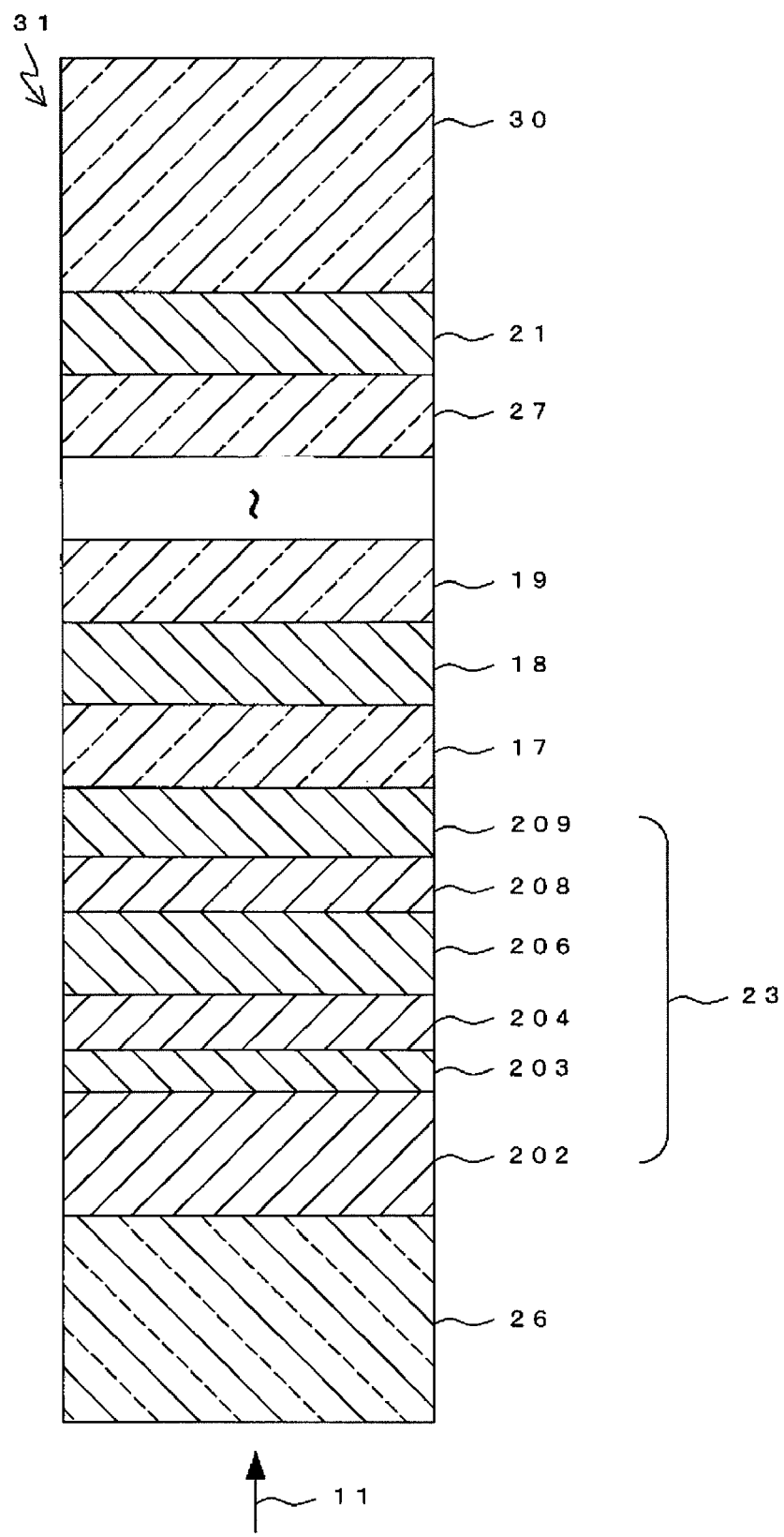
FIG. 5 is a partial sectional view showing an example of layer constitution of the information recording medium having N information layers, according to the present invention.

Another example of the information recording medium of the present invention will be described as the fifth embodiment. A partial sectional view of the information recording medium 31 of the fifth embodiment is shown in FIG. 5. The information recording medium 31 is a multi-layer optical information recording medium on and from which information can be recorded and reproduced by irradiation of the laser beam 11 on one side thereof, similarly to the information recording medium 22 of the second embodiment. The information recording medium 31 has a constitution wherein the information layer 21 formed on the substrate 30 is put into close contact with a stack containing (N−1) information layers including the first information layer 23 and the information layer 18 that are formed successively with the optical separation layer 17, 19, etc. therebetween, on the substrate 26. The adhesive layer 27 is disposed between the stack and the information layer 21. This medium 31 has N information layers.

The substrate 30 is a transparent substrate of disk shape. The substrate 30 may be formed from a resin such as polycarbonate, amorphous polyolefin or PMMA or glass, similarly to the substrate 14. The substrate 30 is preferably formed from polycarbonate for the reason of good transfer property, ease of mass production and low cost.

The substrate 30 may have a guide groove formed as required to guide the laser beam on the surface of the information layer 21. The surface of the substrate 30 opposite to the information layer 21 side is preferably smooth. The substrate 30 has a thickness preferably in a range from 0.3 mm to 0.9 mm, so as to ensure a sufficient strength and enable the information recording medium 31 to have a thickness of about 1.2 mm.

Description will be omitted for the portion identified with the same reference numeral as that in the second and fourth embodiments.

The information recording medium 31 can be produced by a method described below.

First, the first information layer 23 is formed on the substrate 26 (having a thickness of, for example, 0.6 mm). In the case where the substrate 26 has a guide groove formed thereon for guiding the laser beam 11, the first information layer 23 is formed on the side where the guide groove is formed. Specifically, the substrate 26 is placed in a film-forming apparatus, and then the first incident side dielectric layer 202, the first incident side interface layer 203, the first recording layer 204, the first counter-incident side dielectric layer 206, the first reflective layer 208 and the transmittance adjustment layer 209 are successively formed. The first counter-incident side interface layer may be formed as required between the first recording layer 204 and the first counter-incident side dielectric layer 206. Method for forming each of the layers is similar to the method for forming each of the layers of the second embodiment. Then (N-2) information layers are formed successively with the optical separation layer therebetween.

Meanwhile the information layer 21 is formed on the substrate 30 (having a thickness of, for example, 0.6 mm). The information layer comprises a single-layer or multi-layer constitution, and these layers can be formed by sputtering the sputtering targets that supply the materials for the layers in a film-forming apparatus.

Last, the substrate 26 having the information layers formed thereon is laminated by using the adhesive layer 27 onto the substrate 30 whereon the information layer 21 has been formed. Specifically, a light-curable resin (particularly an ultraviolet curable resin) or a delayed-action resin is applied onto the information layer 21, spin coating operation is carried out with the substrate 26 having the first information layer 23 formed thereon being put into close contact with the information layer 21, and the resin is cured. Alternatively, the information layer 21 may also be uniformly coated with an adhesive resin in advance and put into close contact with the substrate 26.

After the substrate 26 is adhered to the substrate 30, the initialization process may be carried out to crystallize the first recording layer 204 over the entire surface thereof, as required. The crystallization of the first recording layer 204 can be carried out by irradiation of the laser beam.

The information recording medium 31 can be produced as described above. In this embodiment, the layers are formed by the sputtering process. But the step of forming the layers is not restricted to this, and vacuum vapor deposition process, ion plating process, CVD process, MBE process or the like may be employed.

Sixth Embodiment

Figure 6:
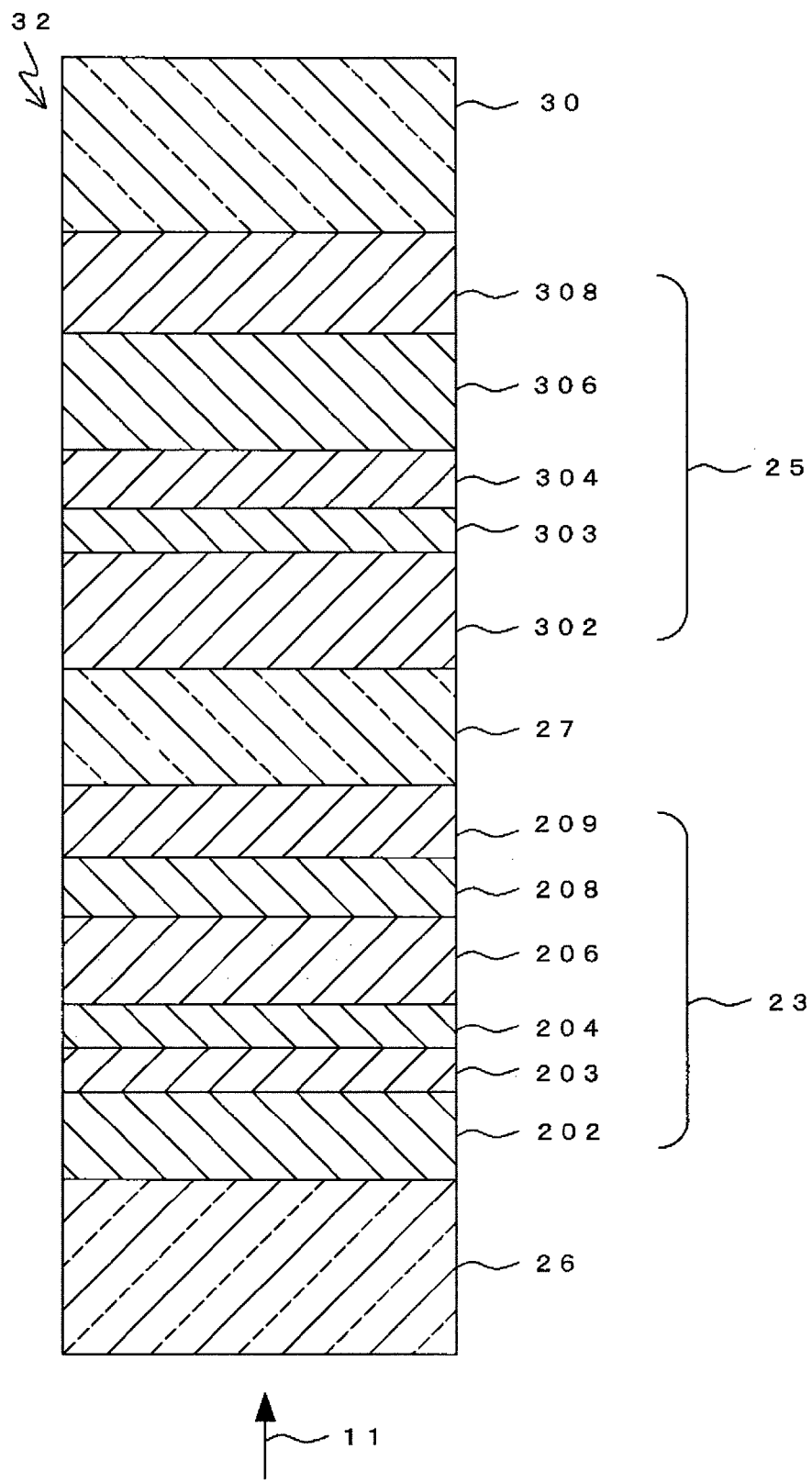
FIG. 6 is a partial sectional view showing an example of layer constitution of the information recording medium having two information layers, according to the present invention.

Another example of the information recording medium that is constituted from two information layers, namely by setting N=2 in the multi-layer optical information recording medium according to the fifth embodiment of the present invention will be described as the sixth embodiment. A partial sectional view of the information recording medium 32 of the sixth embodiment is shown in FIG. 6. The information recording medium 32 is a double-layer optical information recording medium on or from which information can be recorded and reproduced by irradiation of the laser beam 11 on one side thereof, similarly to the information recording medium 24 of the third embodiment.

The information recording medium 32 has a constitution wherein the second information layer 25 formed on the substrate 30 is put into close contact with a stack constituted by forming the first information layer 23 on the substrate 26 with the adhesive layer 27 therebetween.

The substrate 30 may have a guide groove formed as required to guide the laser beam on the surface thereof on the side of the second reflective layer 308. The surface of the substrate 30 opposite to the side of the second reflective layer 308 is preferably smooth.

Description will be omitted for the portion identified with the same reference numeral as that in the second, fourth and fifth embodiments.

The information recording medium 32 can be produced by a method described below.

First, the first information layer 23 is formed on the substrate 26 (having a thickness of, for example, 0.6 mm) by a method similar to that of the fifth embodiment. After forming the transmittance adjustment layer 209, initialization process may be carried out to crystallize the first recording layer 204 over the entire surface thereof, as required. The crystallization of the first recording layer 204 can be carried out by irradiating it with laser beam.

Meanwhile the second information layer 25 is formed on the substrate 30 (having a thickness of, for example, 0.6 mm). In the case where the substrate 30 has guide groove formed thereon for guiding the laser beam 11, the second information layer 25 is formed on the side where the guide groove is formed. Specifically, the substrate 30 is placed in a film-forming apparatus, and the second reflective layer 308, the second counter-incident side dielectric layer 306, the second recording layer 304, the second incident side interface layer 303 and the second incident side dielectric layer 302 and formed successively. The second counter-incident side interface layer may be formed as required between the second recording layer 304 and the second counter-incident side dielectric layer 306. Moreover, a reflective side interface layer may be formed as required between the second reflective layer 308 and the second counter-incident side dielectric layer 306. Method for forming each of the layers is similar to the method for forming each of the layers of the third embodiment.

After forming the second incident side dielectric layer 302, the initialization process may be carried out to crystallize the second recording layer 304 over the entire surface thereof, as required. Crystallization of the second recording layer 304 can be carried out by irradiating it with laser beam.

Last, the substrate 26 having the first information layer 23 formed thereon is laminated by using the adhesive layer 27 onto the substrate 30 whereon the second information layer 25 has been formed. Specifically, a photocurable resin (particularly an ultraviolet curable resin) or delayed-action resin is applied onto the first information layer 23 or the second information layer 25. Then spin coating operation is carried out with the second incident side dielectric layer 302, which is formed on the substrate 26, being put into close contact with the transmittance adjustment layer 209 formed on the substrate 30, and the resin is cured. Alternatively, the first information layer 23 or the second information layer 25 may also be uniformly coated with an adhesive resin in advance and the substrate 26 and the substrate 30 may be put into close contact with each other.

Then, the initialization process may be carried out to crystallize the second recording layer 304 and the first recording layer 204 over the entire surface thereof, as required. In this case, it is preferable to crystallize the second recording layer 304 first, for the same reason as cited in the third embodiment.

The information recording medium 32 can be produced as described above. In this embodiment, the layers are formed by the sputtering process. But the step of forming the layers is not restricted to this, and vacuum vapor deposition process, ion plating process, CVD process, MBE process or the like may be employed.

Seventh Embodiment

The seventh embodiment is a method for recording or reproducing information on or from the information recording medium of the present invention described in the first, second, third, fourth, fifth and sixth embodiments.

Figure 7:
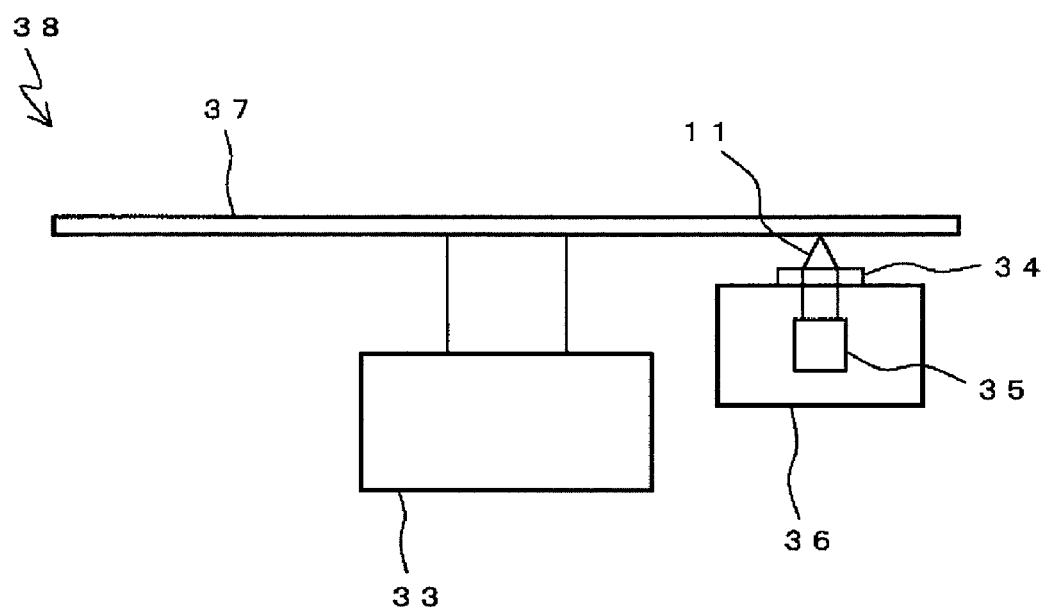
FIG. 7 schematically shows a part of the constitution of recording/reproduction apparatus used in recording and reproduction of the information recording medium of the present invention.

Constitution of a part of a recording/reproduction apparatus 38 used in the method for recording and reproducing information of the present invention is schematically shown in FIG. 7. The recording/reproduction apparatus 38 shown in FIG. 7 are provided with a spindle motor that drives an information recording medium 37 to rotate, a semiconductor laser 35 and an optical head 36 having an objective lens 34 that focuses the laser beam 11 emitted by the semiconductor laser 35. The information recording medium 37 is the information recording medium described in the first, second, third, fourth, fifth and sixth embodiments, having a single information layer (for example, the information layer 16) or a plurality of information layers (for example, the first information layer 23 and the second information layer 25). The objective lens 34 focuses the laser beam 11 on the information layer.

Recording, erasing and overwriting information on the information recording medium are carried out by modulating the power of the laser beam 11 between a peak power ($P_p$ (mW)) of a high power level and a bias power ($P_b$ (mW)) of a low power level. Irradiation of the laser beam 11 at the peak power turns the recording layer locally into amorphous phase, with the portion of amorphous phase becoming a recording mark. The portion between the recording marks is irradiated with the laser beam 11 of bias power so that crystal phase (erased portion) is formed.

The laser beam 11 at the peak power is emitted in the form of a train of pulses. The pulse train may be subjected to binary modulation between the peak power and the bias power. Alternatively, the pulse train may also be modulated among three values or four values over a range from 0 mW to the peak power by adding a cooling power level ($P_c$ (mW)) and a bottom power level ($P_b$ (mW)) that are lower than the bias power.

Recorded information is reproduced by using a detector that detects a signal obtained from the information recording medium by irradiating it with the laser beam 11 at the reproduction power level. The reproduction power level ($P_r$ (mW)) is set so as to satisfy the following conditions:

Power level lower than the peak power and bias power;

The optical state of the recorded mark does not change the optical state when irradiated with the laser beam 11 of the reproduction power level; and The information recording medium reflects light of an intensity high enough to reproduce the recording mark.

Numerical aperture NA of the objective lens 34 is preferably in a range from 0.5 to 1.1 and more preferably from 0.6 to 0.9, so as to keep the diameter of the laser beam spot within a range from about 0.4 µm to 0.7 µm. A wavelength of the laser beam 11 is preferably not longer than 450 nm, more preferably in a range from 350 nm to 450 nm. This is because the information recording medium of the present invention is provided with the layer of the Si—In—Zr/Hf—O-based material so that to medium is suitable for recording and reproducing information by means of leaser beam of such a short wavelength. A linear speed of the information recording medium during recording is preferably in a range from 1 m/second to 20 m/second, more preferably from 2 m/second to 15 m/second, so that the crystallization is less likely to occur by the light for reproduction and sufficient erase characteristic is ensured. It goes without saying that a wavelength, a numerical aperture of the objective lens and a linear velocity other than those described above may be employed depending on the type of the information recording medium. For example, the laser beam of wavelength from 650 nm to 670 nm may be used.

In the information recording medium 24 and the information recording medium 32 provided with two information layers, recording of information on the first information layer 23 is carried out by means of the laser beam 11 that has transmitted through the transparent layer 13, with the laser beam 11 being focused onto the first recording layer 204. Information recorded in the first information layer 23 is reproduced by detecting the laser beam 11 that has been reflected on the first recording layer 204 and transmitted through the transparent layer 13. Recording of information on the second information layer 25 is carried out by means of the laser beam 11 that has transmitted through the transparent layer 13, the first information layer 23 and the optical separation layer 17, with the laser beam 11 being focused onto the second recording layer 304. Information recorded from the second information layer 25 is reproduced by detecting the laser beam 11 that has been reflected on the second recording layer 304 and transmitted through the optical separation layer 17, the first information layer 23 and the transparent layer 13.

In the case where the substrate 14, the optical separation layer 20, 19 and 17 have guide grooves formed thereon for guiding the laser beam 11, information may be recorded either on the surface located near the side where the laser beam 11 enters (groove) or on the surface located away from the side where the laser beam 11 enters (land). Alternatively, information may be recorded on both the groove and land.

Performance of the information recording medium can be evaluated as described below by using the recording/reproduction apparatus. First, the laser beam 11 is power-modulated between 0 and $P_p$ (mW), and random signals are recorded which have mark length from 0.149 μm (2T) to 0.596 μm (8T) by (1-7) modulation scheme. Jitters (error of mark position) between the leading edges and trailing edges of the recording marks are determined with a time interval analyzer, to evaluate the recording characteristic. Smaller value of the jitter means higher recording performance. $P_p$ and $P_b$ are set so as to minimize the mean value of the jitters between the leading edges and trailing edges of the recording marks (mean jitter). Optimum value of $P_p$ determined in this process is taken as the recording sensitivity.

Signal intensity is evaluated as follows. First, the laser beam 11 is power-modulated between 0 and $P_p$ (mW), and signals with mark lengths of 0.149 μm (2T) and 0.671 μm (9T) are recorded alternately 10 times, namely 2T signal is recorded 5 times and 9T signal is recorded 5 times, followed by overwriting of 2T signal at the last. The ratio (CNR: carrier to noise ratio) of the signal amplitude (carrier level) at the frequency of 2T signal that has been overwritten at the last to the noise amplitude (noise level) is determined with a spectrum analyzer, so as to evaluate the signal intensity. Higher value of CNR indicates higher signal intensity.

The number of overwrite cycles is evaluated in a procedure described below. First, the laser beam 11 is power-modulated between 0 and $P_p$ (mW), and random signals are recorded with mark length from 0.149 μm (2T) to 0.596 μm (8T) on the same groove. Jitters between the leading edges and trailing edges at each overwriting are determined with a time interval analyzer, to evaluate the number of overwriting cycles. The number of overwriting cycles at which the jitter increases by 3% over the mean jitter between the leading edges and trailing edges at the first overwriting operation is taken as the upper limit. $P_p$, $P_b$, $P_c$ and $P_B$ are set so as to minimize the mean value of the jitters.

Archival characteristic is evaluated as follows. First, a signal is recorded under the optimum conditions. Then the medium is exposed to an environment wherein a temperature is 80° C. and relative humidity is 85%, for 100 hours. Values of jitter before and after the exposure are determined with a time interval analyzer. Archival characteristic can be evaluated by the change in jitter.

Eighth Embodiment

Figure 8:
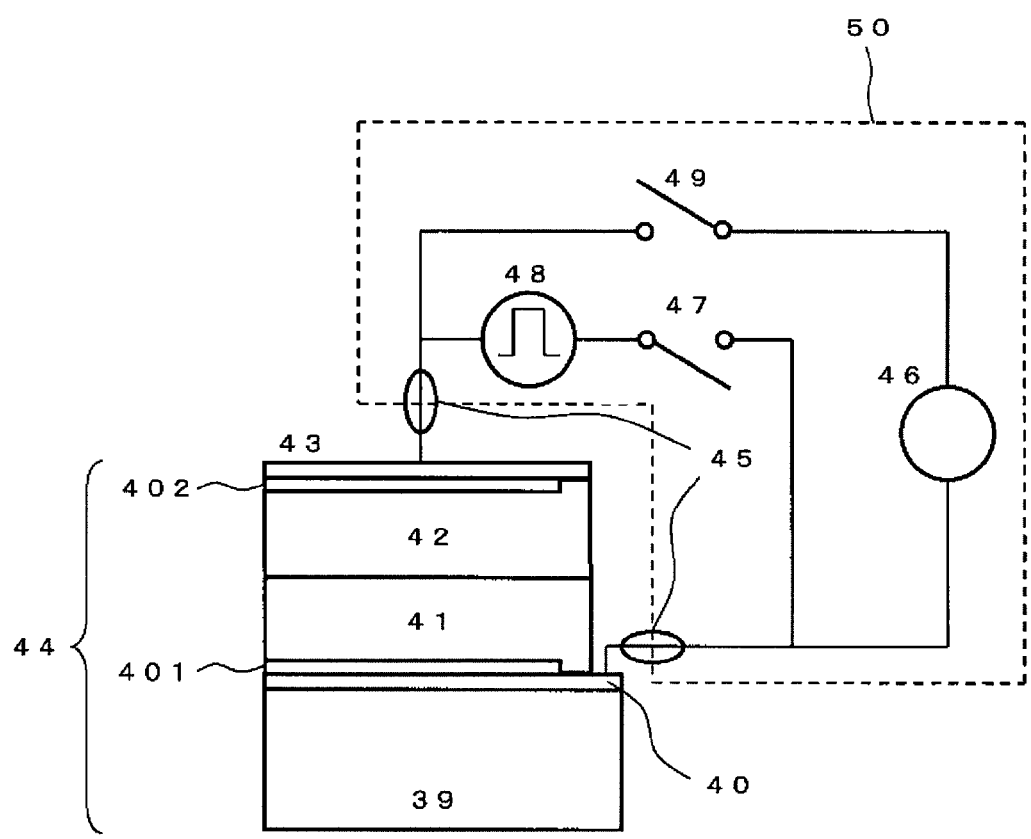
FIG. 8 schematically shows a part of the constitution of the information recording medium, according to the present invention and the electrical information recording/reproduction apparatus.

Another example of the information recording medium of the present invention will be described as the eighth embodiment. An example of an electrical information recording medium 44 of the eighth embodiment is shown in FIG. 8. The electrical information recording medium 44 is an information recording medium on and from which information can be recorded and reproduced by applying an electrical energy (particularly current).

A substrate 39 may be of a resin such as polycarbonate, glass, ceramics such as $Al_2O_3$, semiconductor such as Si or metal such as Cu. An example wherein an Si substrate is used will be described here. The electrical information recording medium 44 is constituted by forming a lower electrode 40, a first dielectric layer 401, a first recording layer 41, a second recording layer 42, a second dielectric layer 402 and an upper electrode 43 in this order on the substrate 39. The lower electrode 40 and the upper electrode 43 are formed for the purpose of supplying electrical current to the first recording layer 41 and the second recording layer 42. The first dielectric layer 401 is provided for the purpose of adjusting amount of electrical energy supplied to the first recording layer 41, and the second dielectric layer 402 is provided for the purpose of adjusting the amount of electrical energy supplied to the second recording layer 42.

In this embodiment, at least one of the first dielectric layer 401 and the second dielectric layer 402 is formed from a Si—In—Zr/Hf—O-based material. The other dielectric layer may be of other material described in relation to the incident side dielectric layer 102 of the first embodiment.

The first recording layer 41 and the second recording layer 42 are formed from a material that can undergo reversible phase transition between crystal phase and amorphous phase due to the Joule heat generated by supplying the electrical current. This medium utilizes the difference in resistivity between crystal phase and amorphous phase for recording information. The first recording layer 41 and the second recording layer 42 may be formed from a material similar to that used for the recording layer 104 of the first embodiment. The first recording layer 41 and the second recording layer 42 are designed to differentiate the layer thickness and/or the material composition, so as to have different values of resistivity. The first recording layer 41 and the second recording layer 42 can be formed by a method similar to that employed for the recording layer 104 of the first embodiment.

The lower electrode 40 and the upper electrode 43 can be of an element metal such as Al, Au, Ag, Cu, Pt or the like, or an alloy based on one or more elements of these elements as the main component with one or more kinds of other element added to improve the humidity resistance or to control the heat conductivity. The lower electrode 40 and the upper electrode 43 can be formed by sputtering a target formed from the metal or alloy that forms the electrode in an Ar gas atmosphere. In addition to sputtering, other process such as vacuum vapor deposition process, ion plating process, CVD process or MBE process may also be employed.

The electrical information recording medium 44 is electrically connected with application parts 45 to an electrical information recording/reproduction apparatus 50. A pulsed power supply 48 of the recording/reproduction apparatus 50 is connected with a switch 47 between the lower electrode 40 and the upper electrode 43 so as to supply current pulse to the first recording layer 41 and the second recording layer 42. A resistance meter 46 is connected with a switch 49 between the lower electrode 40 and the upper electrode 43 so as to detect the change in the resistance due to phase transition in the first recording layer 41 and the second recording layer 42.

The first recording layer 41 or the second recording layer 42 that is in amorphous phase (the state of high resistance) can be turned into crystal phase (the state of low resistance) by closing the switch 47 (the switch 49 is opened) so as to supply current pulses between the electrodes. The current pulses are supplied in such a manner as the portion supplied with the electrical pulses is kept at a temperature higher than the crystallization temperature of the material and lower than the melting point for the period of crystallization. The material can be turned from crystal phase back into the amorphous phase by supplying electrical pulses having amplitude higher than that used for crystallization for a shorter period of time so as to heat the recording layer to a temperature higher than the melting point and melt it, then cooling down quickly. The pulsed power supply 48 of the electrical information recording/reproduction apparatus 50 is a power supply that is capable of delivering recording and erasing pulses of waveforms shown in FIG. 11.

Resistance $r_{a1}$ when the first recording layer 41 is in amorphous phase, resistance $r_{c1}$ when the first recording layer 41 is in crystal phase, resistance $r_{a2}$ when the second recording layer 42 is in amorphous phase and resistance $r_{c2}$ when the second recording layer 42 is in crystal phase are set so as to satisfy relationships $r_{c1} \leq r_{c2} < r_{a1} < r_{a2}$ or $r_{c1} \leq r_{c2} < r_{a2} < r_{a1}$ or $r_{c2} \leq r_{c1} < r_{a1} < r_{a2}$, or $r_{c2} \leq r_{c1} < r_{a2} < r_{a1}$, so that the sum of the resistances of the first recording layer 41 and the second recording layer 42 can be set to four different values of $r_{a1}+r_{a2}$, $r_{a1}+r_{c2}$, $r_{c1}+r_{a2}$ and $r_{c1}+r_{c2}$. As a result, binary information of four distinct states can be detected simultaneously by measuring the resistance between the electrodes with the resistance meter 46.

Figure 9:
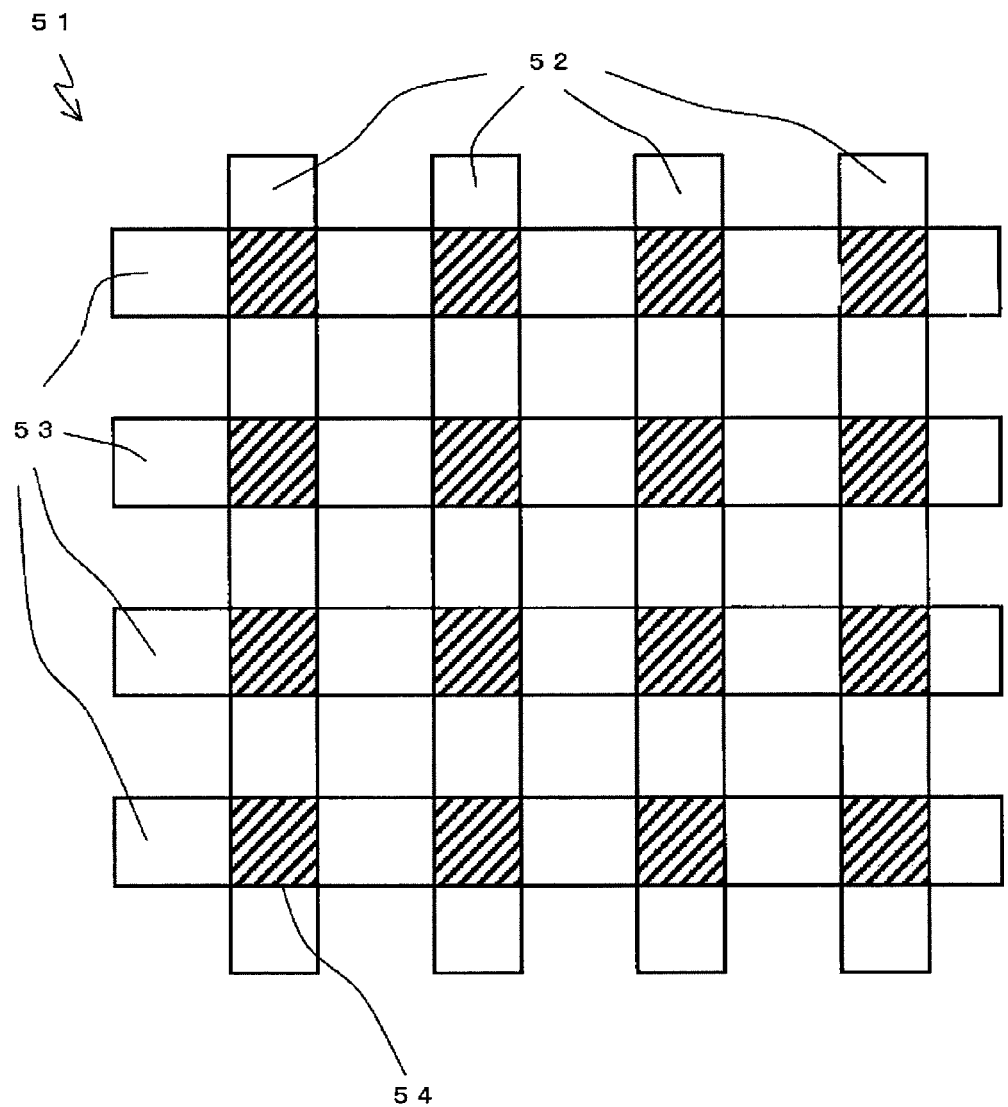
FIG. 9 schematically shows a part of the constitution of an electrical information recording medium of the present invention having large storage capacity.

The electrical information recording medium 51 having a large storage capacity shown in FIG. 9 can be constituted by disposing multitude of the electrical information recording medium 44 in a matrix array. Each memory cell 54 has a tiny region having constitution similar to that of the electrical information recording medium 44. Recording and reproduction of information in each of the memory cell 54 are carried out by designating a single word line 52 and a single bit line 53.

Figure 10:
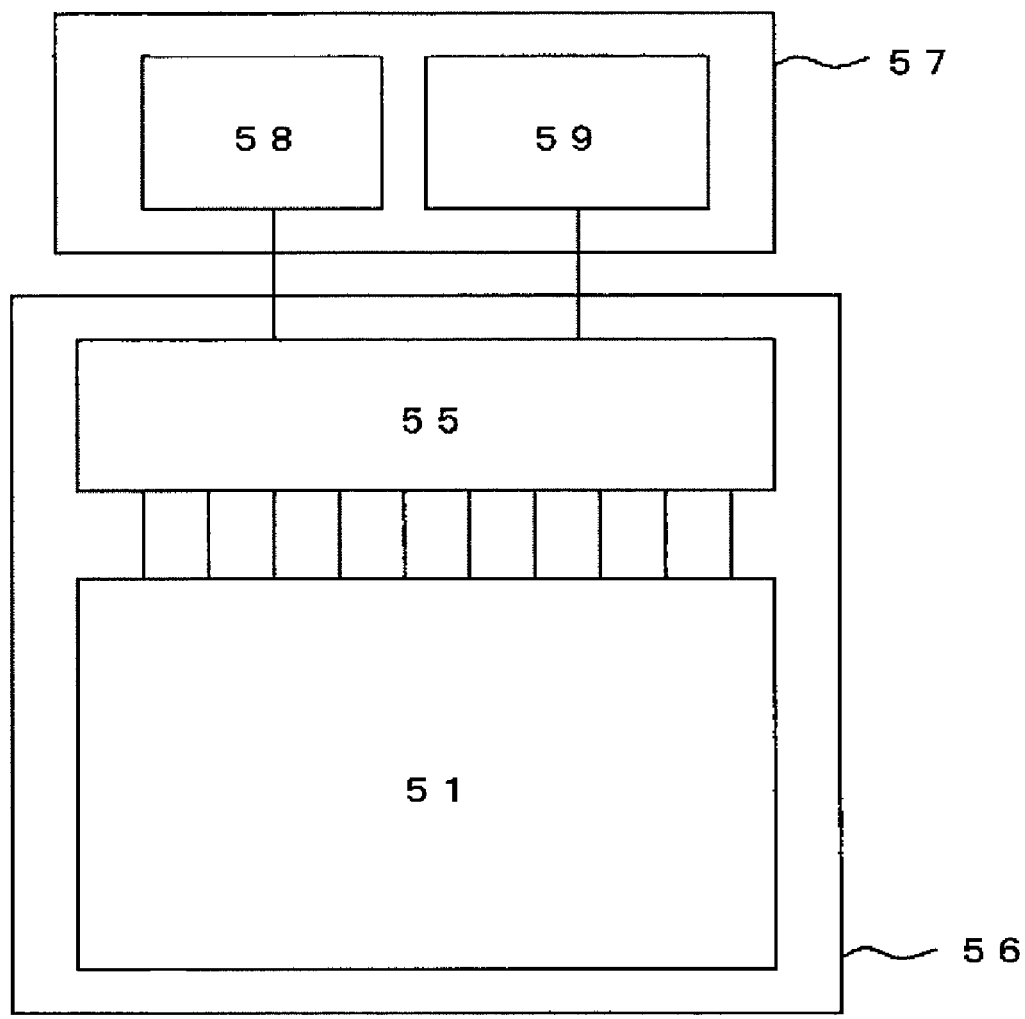
FIG. 10 schematically shows a part of the constitution of the electrical information recording medium of the present invention and a recording and reproduction system therefor.

FIG. 10 shows an example of constitution of an information recording system that uses the electrical information recording medium 51. A storage apparatus 56 is constituted from the electrical information recording medium 51 and an addressing circuit 55. The word line 52 and the bit line 53 of the electrical information recording medium 51 are designated by the addressing circuit 55, so as to record and reproduce information on and from each of the memory cells 54. With the storage apparatus 56 electrically connected to an external circuit 57 constituted from at least the pulsed power supply 58 and the resistance meter 59, information can be recorded and reproduced on and from the electrical information recording medium 51.

EXAMPLES

The present invention will be described more specifically by way of Examples.

Example 1

In Example 1, the information recording medium 15 shown in FIG. 1 was made, and the relations between the material of the counter-incident side dielectric layer 106 and recording sensitivity of the information layer 16, overwrite cycle-ability and signal intensity were studied. Specifically, samples 1-1 to 1-29 of the information recording medium 15 including the information layers 16 having the counter-incident side dielectric layers 106 formed from different materials were made, and the recording sensitivity, overwrite cycle-ability and signal intensity of the information layer 16 were determined.

Samples were made as follows. First, the substrate 14 made of polycarbonate (120 mm in diameter, 1.1 mm in thickness) was prepared with guide groove (20 nm in depth, 0.32 µm in track pitch) formed thereon for guiding the laser beam 11. An Ag—Pd—Cu layer (80 nm in thickness) as the reflective layer 108, the counter-incident side dielectric layer 106 (25 nm in thickness), a $Ge_{45}In_1Bi_3Te_{51}$ layer (10 nm in thickness) as the recording layer 104, a $(Cr_2O_3)_{50}(ZrO_2)_{50}$ layer (5 nm in thickness) as the incident side interface layer 103, and a $(ZnS)_{80}(SiO_2)_2O$ layer (60 nm in thickness) as the incident side dielectric layer 102 were formed successively by sputtering on the polycarbonate substrate.

Provided in the film-forming apparatus used for sputtering of the layers are an alloy sputtering target for forming the reflective layer 108, a sputtering target for forming the counter-incident side dielectric layer 106, an alloy sputtering target for forming the recording layer 104, a sputtering target for forming the incident side interface layer 103 and a sputtering target for forming the incident side dielectric layer 102. All the sputtering targets were 100 mm in diameter and 6 mm in thickness.

In this Example, a sputtering target made of Ag—Pd—Cu alloy was used to form the reflective layer 108. Similar targets were used also in forming the reflective layers in other Examples. A sputtering target made of Ge—In—Bi—Te alloy was used to form the recording layer 104. Similar targets were used also in forming the recording layers in other Examples.

Under the conditions employed in this Example, composition of the sputtering target was similar to the composition of the layer formed by sputtering that was determined by analysis, as long as the dielectric layer or the interface layer was formed from a Si—In—Zr/Hf—O-based material or other oxide-based material. Accordingly, it was assumed that compositions of the dielectric layer and the interface layer were the same as the compositions of the sputtering targets for forming these layers. The compositions of the dielectric layer and the interface layer described above are the compositions of the sputtering targets. This applies also to the Examples described below.

The reflective layer 108 was formed by supplying electrical power of 200 W from a DC power supply in an Ar gas atmosphere having a pressure of 0.4 Pa. The counter-incident side dielectric layer 106 was formed by supplying electrical power of 400 W from an RF power supply in an Ar gas atmosphere having a pressure of 0.15 Pa. The recording layer 104 was formed by supplying electrical power of 100 W from a DC power supply in an Ar gas atmosphere having a pressure of 0.15 Pa. The incident side interface layer 103 was formed by supplying electrical power of 400 W from an RF power supply in an Ar gas atmosphere having a pressure of 0.15 Pa. The incident side dielectric layer 102 was formed by supplying electrical power of 400 W from an RF power supply in an atmosphere of mixed gas of Ar and $O_2$ (containing 3% by volume of $O_2$) having a pressure of 0.15 Pa.

Then the incident side dielectric layer 102 was coated with an ultraviolet curable resin (acrylic resin). The resin layer was made uniform by rotating the substrate 14. The resin was cured by irradiating it with ultraviolet ray. This resulted in the transparent layer 13 having a thickness of 100 μm formed from the resin. Then initialization process was carried out in which the recording layer 104 was crystallized by the laser beam. In this way, a plurality of samples having counter-incident side dielectric layer 106 formed from different materials were made.

Recording sensitivity and overwrite cycle-ability of the information layer 16 were determined for each sample by using the recording/reproduction apparatus 38 shown in FIG. 7. The determinations were made with the laser beam 11 having a wavelength of 405 nm, and the objective lens 34 having a numerical aperture NA of 0.85. The sample was rotated at linear velocities of 4.9 m/second and 9.8 m/second during determination and a minimum mark length (2T) was 0.149 μm. Information was recorded on the groove.

The material forming the counter-incident side dielectric layer 106 of the information layer 16, recording sensitivity, overwrite cycle-ability and signal intensity of the information layer 16 of the information recording medium. 1.5 are shown in Table 1 for the linear velocity of 4.9 m/second (1×) and in Table 2 for the linear velocity of 9.8 m/second (2×). In the Tables, recording sensitivity at 1× are indicated with A, B and C, A being less than 6 mW, B being 6 mW or more and less than 7 mW and C being 7 mW or more. Recording sensitivity at 2× are indicated with A, B and C, A being less than 7 mW, B being 7 mW or more and less than 8 mW and C being 8 mW or more. For the overwrite cycle-ability, number of repetitive overwriting cycles 1,000 or more is indicated with A, number of cycles not less than 500 and less than 1,000 is indicated with B and number of cycles less than 500 is indicated with C. For signal intensity is indicated with A, B and C, A being less than 40 dB, B being 40 dB or more and less than 45 dB and C being 45 dB and more.

TABLE 1

| Sam. No. | Material for Reflective Layer Side Dielectric layer 106 (mol %) | Reduction into Elemental Composition (atomic %) | Re. Sensi. | Ov. Cycle-Ability | Sig. Inten. |
|---|---|---|---|---|---|
| 1-1 | $(ZnS)_{80}(SiO_2)_{20}$ | $Zn_{36.4}S_{36.4}Si_{9.1}O_{18.1}$ | A | C | A |
| 1-2 | $(In_2O_3)_{50}(ZrO_2)_{50}$ | $In_{25.0}Zr_{12.5}O_{62.5}$ | B | A | B |
| 1-3 | $(SiO_2)_5(In_2O_3)_{50}(ZrO_2)_{45}$ | $Si_{1.3}In_{25.0}Zr_{11.2}O_{62.5}$ | A | A | A |
| 1-4 | $(SiO_2)_{15}(In_2O_3)_{50}(ZrO_2)_{35}$ | $Si_{3.8}In_{25.0}Zr_{8.7}O_{62.5}$ | A | A | A |
| 1-5 | $(SiO_2)_{25}(In_2O_3)_{50}(ZrO_2)_{25}$ | $Si_{6.3}In_{25.0}Zr_{6.2}O_{62.5}$ | A | A | A |
| 1-6 | $(SiO_2)_5(In_2O_3)_5(ZrO_2)_{90}$ | $Si_{1.6}In_{3.2}Zr_{29.0}O_{66.2}$ | A | A | A |
| 1-7 | $(SiO_2)_{90}(In_2O_3)_5(ZrO_2)_5$ | $Si_{29.0}In_{3.2}Zr_{1.6}O_{66.2}$ | A | A | A |
| 1-8 | $(SiO_2)_5(In_2O_3)_{90}(ZrO_2)_5$ | $Si_{1.0}In_{37.5}Zr_{1.0}O_{60.5}$ | A | A | A |
| 1-9 | $(SiO_2)_5(In_2O_3)_{50}[(ZrO_2)_{0.97}(Y_2O_3)_{0.03}]_{45}$ | $Si_{1.2}In_{24.8}Zr_{10.8}Y_{0.7}O_{62.5}$ | A | A | A |
| 1-10 | $(SiO_2)_{15}(In_2O_3)_{50}[(ZrO_2)_{0.97}(Y_2O_3)_{0.03}]_{35}$ | $Si_{3.7}In_{24.9}Zr_{8.4}Y_{0.5}O_{62.5}$ | A | A | A |
| 1-11 | $(SiO_2)_{25}(In_2O_3)_{50}[(ZrO_2)_{0.97}(Y_2O_3)_{0.03}]_{25}$ | $Si_{6.2}In_{24.9}Zr_{6.0}Y_{0.4}O_{62.5}$ | A | A | A |
| 1-12 | $(SiO_2)_5(In_2O_3)_5[(ZrO_2)_{0.97}(Y_2O_3)_{0.03}]_{90}$ | $Si_{1.6}In_{3.2}Zr_{27.7}Y_{1.7}O_{65.8}$ | A | A | A |
| 1-13 | $(SiO_2)_{90}(In_2O_3)_5[(ZrO_2)_{0.97}(Y_2O_3)_{0.03}]_5$ | $Si_{29.0}In_{3.2}Zr_{1.6}Y_{0.1}O_{66.1}$ | A | A | A |
| 1-14 | $(SiO_2)_5(In_2O_3)_{90}[(ZrO_2)_{0.97}(Y_2O_3)_{0.03}]_5$ | $Si_{1.0}In_{37.5}Zr_{1.0}Y_{0.1}O_{60.4}$ | A | A | A |
| 1-15 | $(SiO_2)_5(In_2O_3)_{50}[(ZrO_2)_{0.92}(Y_2O_3)_{0.08}]_{45}$ | $Si_{1.2}In_{24.6}Zr_{10.2}Y_{1.8}O_{62.2}$ | A | A | A |
| 1-16 | $(SiO_2)_{15}(In_2O_3)_{50}[(ZrO_2)_{0.92}(Y_2O_3)_{0.08}]_{35}$ | $Si_{3.7}In_{24.7}Zr_{7.9}Y_{1.4}O_{62.3}$ | A | A | A |
| 1-17 | $(SiO_2)_{25}(In_2O_3)_{50}[(ZrO_2)_{0.92}(Y_2O_3)_{0.08}]_{25}$ | $Si_{6.2}In_{24.8}Zr_{5.7}Y_{1.0}O_{62.3}$ | A | A | A |
| 1-18 | $(SiO_2)_5(In_2O_3)_5[(ZrO_2)_{0.92}(Y_2O_3)_{0.08}]_{90}$ | $Si_{1.5}In_{3.1}Zr_{25.5}Y_{4.4}O_{65.5}$ | A | A | A |
| 1-19 | $(SiO_2)_{90}(In_2O_3)_5[(ZrO_2)_{0.92}(Y_2O_3)_{0.08}]_5$ | $Si_{29.0}In_{3.2}Zr_{1.5}Y_{0.3}O_{66.0}$ | A | A | A |
| 1-20 | $(SiO_2)_5(In_2O_3)_{90}[(ZrO_2)_{0.92}(Y_2O_3)_{0.08}]_5$ | $Si_{1.0}In_{37.4}Zr_{1.0}Y_{0.2}O_{60.4}$ | A | A | A |
| 1-21 | $(SiO_2)_{25}(In_2O_3)_{40}(ZrO_2)_{25}(Cr_2O_3)_{10}$ | $Si_{6.3}In_{20.0}Zr_{6.3}Cr_{5.0}O_{62.4}$ | A | A | A |
| 1-22 | $(SiO_2)_{25}(In_2O_3)_{40}(Cr_2O_3)_{10}[(ZrO_2)_{0.97}(Y_2O_3)_{0.03}]_{25}$ | $Si_{6.2}In_{19.9}Zr_{6.0}Y_{0.4}Cr_{5.0}O_{62.5}$ | A | A | A |
| 1-23 | $(SiO_2)_{25}(In_2O_3)_{40}(Cr_2O_3)_{10}[(ZrO_2)_{0.92}(Y_2O_3)_{0.08}]_{25}$ | $Si_{6.2}In_{19.8}Zr_{5.7}Y_{1.0}Cr_{5.0}O_{62.3}$ | A | A | A |
| 1-24 | $(SiO_2)_{25}(In_2O_3)_{40}(ZrO_2)_{25}(Ga_2O_3)_{10}$ | $Si_{6.3}In_{20.0}Zr_{6.3}Ga_{5.0}O_{62.4}$ | A | A | A |
| 1-25 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.9}Zr_{6.0}Y_{0.4}Ga_{5.0}O_{62.5}$ | A | A | A |
| 1-26 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.8}Zr_{5.7}Y_{1.0}Ga_{5.0}O_{62.3}$ | A | A | A |
| 1-27 | $(SiO_2)_{25}(In_2O_3)_{50}(HfO_2)_{25}$ | $Si_{6.3}In_{25.0}Hf_{6.2}O_{62.5}$ | A | A | A |
| 1-28 | $(SiO_2)_{25}(In_2O_3)_{50}(ZrO_2)_{15}(HfO_2)_{10}$ | $Si_{6.3}In_{25.0}Zr_{3.8}Hf_{2.5}O_{62.4}$ | A | A | A |
| 1-29 | $(SiO_2)_{25}(In_2O_3)_{50}(ZrO_2)_{10}(HfO_2)_{10}(Y_2O_3)_5$ | $Si_{6.1}In_{24.4}Zr_{2.4}Hf_{2.4}Y_{2.4}O_{62.3}$ | A | A | A |

TABLE 2

| Sam. No. | Material for Reflective Layer Side Dielectric layer 106 (mol %) | Reduction into Elemental Composition (atomic %) | Re. Sensi. | Ov. Cycle-Ability | Sig. Inten. |
|---|---|---|---|---|---|
| 1-1 | $(ZnS)_{80}(SiO_2)_{20}$ | $Zn_{36.4}S_{36.4}Si_{9.1}O_{18.1}$ | A | C | A |
| 1-2 | $(In_2O_3)_{50}(ZrO_2)_{50}$ | $In_{25.0}Zr_{12.5}O_{62.5}$ | A | A | B |
| 1-3 | $(SiO_2)_5(In_2O_3)_{50}(ZrO_2)_{45}$ | $Si_{1.3}In_{25.0}Zr_{11.2}O_{62.5}$ | A | A | A |
| 1-4 | $(SiO_2)_{15}(In_2O_3)_{50}(ZrO_2)_{35}$ | $Si_{3.8}In_{25.0}Zr_{8.7}O_{62.5}$ | A | A | A |
| 1-5 | $(SiO_2)_{25}(In_2O_3)_{50}(ZrO_2)_{25}$ | $Si_{6.3}In_{25.0}Zr_{6.2}O_{62.5}$ | A | A | A |
| 1-6 | $(SiO_2)_5(In_2O_3)_5(ZrO_2)_{90}$ | $Si_{1.6}In_{3.2}Zr_{29.0}O_{66.2}$ | A | A | A |
| 1-7 | $(SiO_2)_{90}(In_2O_3)_5(ZrO_2)_5$ | $Si_{29.0}In_{3.2}Zr_{1.6}O_{66.2}$ | A | A | A |
| 1-8 | $(SiO_2)_5(In_2O_3)_{90}(ZrO_2)_5$ | $Si_{1.0}In_{37.5}Zr_{1.0}O_{60.5}$ | A | A | A |
| 1-9 | $(SiO_2)_5(In_2O_3)_{50}[(ZrO_2)_{0.97}(Y_2O_3)_{0.03}]_{45}$ | $Si_{1.2}In_{24.8}Zr_{10.8}Y_{0.7}O_{62.5}$ | A | A | A |

TABLE 2-continued

| Sam. No. | Material for Reflective Layer Side Dielectric layer 106 (mol %) | Reduction into Elemental Composition (atomic %) | Re. Sensi. | Ov. Cycle-Ability | Sig. Inten. |
|---|---|---|---|---|---|
| 1-10 | $(SiO_2)_{15}(In_2O_3)_{50}[(ZrO_2)_{0.97}(Y_2O_3)_{0.03}]_{35}$ | $Si_{3.7}In_{24.9}Zr_{8.4}Y_{0.5}O_{62.5}$ | A | A | A |
| 1-11 | $(SiO_2)_{25}(In_2O_3)_{50}[(ZrO_2)_{0.97}(Y_2O_3)_{0.03}]_{25}$ | $Si_{6.2}In_{24.9}Zr_{6.0}Y_{0.4}O_{62.5}$ | A | A | A |
| 1-12 | $(SiO_2)_5(In_2O_3)_5[(ZrO_2)_{0.97}(Y_2O_3)_{0.03}]_{90}$ | $Si_{1.6}In_{3.2}Zr_{27.7}Y_{1.7}O_{65.8}$ | A | A | A |
| 1-13 | $(SiO_2)_{90}(In_2O_3)_5[(ZrO_2)_{0.97}(Y_2O_3)_{0.03}]_5$ | $Si_{29.0}In_{3.2}Zr_{1.6}Y_{0.1}O_{66.1}$ | A | A | A |
| 1-14 | $(SiO_2)_5(In_2O_3)_{90}[(ZrO_2)_{0.97}(Y_2O_3)_{0.03}]_5$ | $Si_{1.0}In_{37.5}Zr_{1.0}Y_{0.1}O_{60.4}$ | A | A | A |
| 1-15 | $(SiO_2)_5(In_2O_3)_{50}[(ZrO_2)_{0.92}(Y_2O_3)_{0.08}]_{45}$ | $Si_{1.2}In_{24.6}Zr_{10.2}Y_{1.8}O_{62.2}$ | A | A | A |
| 1-16 | $(SiO_2)_{15}(In_2O_3)_{50}[(ZrO_2)_{0.92}(Y_2O_3)_{0.08}]_{35}$ | $Si_{3.7}In_{24.7}Zr_{7.9}Y_{1.4}O_{62.3}$ | A | A | A |
| 1-17 | $(SiO_2)_{25}(In_2O_3)_{50}[(ZrO_2)_{0.92}(Y_2O_3)_{0.08}]_{25}$ | $Si_{6.2}In_{24.8}Zr_{5.7}Y_{1.0}O_{62.3}$ | A | A | A |
| 1-18 | $(SiO_2)_5(In_2O_3)_5[(ZrO_2)_{0.92}(Y_2O_3)_{0.08}]_{90}$ | $Si_{1.5}In_{3.1}Zr_{25.5}Y_{4.4}O_{65.5}$ | A | A | A |
| 1-19 | $(SiO_2)_{90}(In_2O_3)_5[(ZrO_2)_{0.92}(Y_2O_3)_{0.08}]_5$ | $Si_{29.0}In_{3.2}Zr_{1.5}Y_{0.3}O_{66.0}$ | A | A | A |
| 1-20 | $(SiO_2)_5(In_2O_3)_{90}[(ZrO_2)_{0.92}(Y_2O_3)_{0.08}]_5$ | $Si_{1.0}In_{37.4}Zr_{1.0}Y_{0.2}O_{60.4}$ | A | A | A |
| 1-21 | $(SiO_2)_{25}(In_2O_3)_{40}(ZrO_2)_{25}(Cr_2O_3)_{10}$ | $Si_{6.3}In_{20.0}Zr_{6.3}Cr_{5.0}O_{62.4}$ | A | A | A |
| 1-22 | $(SiO_2)_{25}(In_2O_3)_{40}(Cr_2O_3)_{10}[(ZrO_2)_{0.97}(Y_2O_3)_{0.03}]_{25}$ | $Si_{6.2}In_{19.9}Zr_{6.0}Y_{0.4}Cr_{5.0}O_{62.5}$ | A | A | A |
| 1-23 | $(SiO_2)_{25}(In_2O_3)_{40}(Cr_2O_3)_{10}[(ZrO_2)_{0.92}(Y_2O_3)_{0.08}]_{25}$ | $Si_{6.2}In_{19.8}Zr_{5.7}Y_{1.0}Cr_{5.0}O_{62.3}$ | A | A | A |
| 1-24 | $(SiO_2)_{25}(In_2O_3)_{40}(ZrO_2)_{25}(Ga_2O_3)_{10}$ | $Si_{6.3}In_{20.0}Zr_{6.3}Ga_{5.0}O_{62.4}$ | A | A | A |
| 1-25 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.9}Zr_{6.0}Y_{0.4}Ga_{5.0}O_{62.5}$ | A | A | A |
| 1-26 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.8}Zr_{5.7}Y_{1.0}Ga_{5.0}O_{62.3}$ | A | A | A |
| 1-27 | $(SiO_2)_{25}(In_2O_3)_{50}(HfO_2)_{25}$ | $Si_{6.3}In_{25.0}Hf_{6.2}O_{62.5}$ | A | A | A |
| 1-28 | $(SiO_2)_{25}(In_2O_3)_{50}(ZrO_2)_{15}(HfO_2)_{10}$ | $Si_{6.3}In_{25.0}Zr_{3.8}Hf_{2.5}O_{62.4}$ | A | A | A |
| 1-29 | $(SiO_2)_{25}(In_2O_3)_{50}(ZrO_2)_{10}(HfO_2)_{10}(Y_2O_3)_5$ | $Si_{6.1}In_{24.4}Zr_{2.4}Hf_{2.4}Y_{2.4}O_{62.3}$ | A | A | A |

The results described above showed low overwrite cycle-ability at 1× and 2× due to the diffusion of sulfur contained in ZnS into the recording layer in sample 1-1 having the counter-incident side dielectric layer 106 of $(ZnS)_{80}(SiO_2)_{20}$. Sample 1-2 having the counter-incident side dielectric layer 106 formed from $(In_2O_3)_{50}(ZrO_2)_{50}$ showed recording sensitivity and signal intensity at 1× that were a little lower, and signal intensity at 2× that was a little lower. Samples 1-3 to 1-29 having the counter-incident side dielectric layer 106 formed from a material that contains at least Si, In and O with a concentration of $SiO_2$ not lower than 5 mol % and a concentration of Si not lower than 1 atomic % showed recording sensitivity, overwrite cycle-ability and signal intensity that were all at satisfactory levels. These results showed that the medium 15 having high performance can be obtained when the counter-incident side dielectric layer 106 contains 5 mol % or more $SiO_2$ and 1 atomic % or more Si.

Example 2

In Example 2, the information recording medium 24 shown in FIG. 3 was made, and the relations between the material of the second counter-incident side dielectric layer 306, and recording sensitivity, overwrite cycle-ability and signal intensity of the second information layer 25 were studied. Specifically, samples 2-1 to 2-29 of the information recording medium 24 including the second information layers 25 having the second counter-incident side dielectric layers 306 of different materials were made, and recording sensitivity, overwrite cycle-ability and signal intensity of the second information layer 25 were determined.

Samples were made as follows. First, the substrate 14 made of polycarbonate (120 mm in diameter, 1.1 mm in thickness) was prepared with guide groove (20 nm in depth, 0.32 μm in track pitch) formed thereon for guiding the laser beam 11. An Ag—Pd—Cu layer (80 nm in thickness) as the second reflective layer 208, the second counter-incident side dielectric layer 306 (25 nm in thickness), a $Ge_{45}In_1Bi_3Te_{51}$ layer (10 nm in thickness) as the second recording layer 304, a $(Cr_2O_3)_{50}$ $(ZrO_2)_{50}$ layer (5 nm in thickness) as the second incident side interface layer 303, and a $(ZnS)_{80}(SiO_2)_{20}$ layer (60 nm in thickness) as the second incident side dielectric layer 302 were formed successively by sputtering on the polycarbonate substrate.

The second reflective layer 308 was formed by supplying electrical power of 200 W from a DC power supply in an Ar gas atmosphere having a pressure of 0.4 Pa. The second counter-incident side dielectric layer 306 was formed by supplying electrical power of 400 W from an RF power supply in an Ar gas atmosphere having a pressure of 0.15 Pa. The second recording layer 304 was formed by supplying electrical power of 100 W from a DC power supply in an Ar gas atmosphere having a pressure of 0.15 Pa. The second incident side interface layer 303 was formed by supplying electrical power of 400 W from an RF power supply in an Ar gas atmosphere having a pressure of 0.15 Pa. The second incident side dielectric layer 302 was formed by supplying electrical power of 400 W from an RF power supply in the atmosphere of mixed gas of Ar and $O_2$ (containing 3% by volume of $O_2$) having a pressure of 0.15 Pa.

Then the second incident side dielectric layer 302 was coated with an ultraviolet curable resin (acrylic resin), over which a substrate having guide groove (20 nm in depth, 0.32 μm in track pitch) formed thereon was placed in contact therewith and was rotated so as to make the resin layer uniform. The resin was cured, and then the substrate was removed. This process resulted in the optical separation layer 17 having a thickness of 25 μm with the guide groove for guiding the laser beam 11, formed on the side of the first information layer 23.

A $TiO_2$ layer (20 nm in thickness) as the transmittance adjustment layer 209, an Ag—Pd—Cu layer (10 nm in thickness) as the first reflective layer 208, a $(SiO_2)_{25}(In_2O_3)_{50}$ $(ZrO_2)_{25}$ layer (15 nm in thickness) as the first counter-incident side dielectric layer 206, a $Ge_{45}In_1Bi_3Te_{51}$ layer (6 nm in thickness) as the first recording layer 204, a $(SiO_2)_{25}(Cr_2O_3)_{50}(ZrO_2)_{25}$ layer (5 nm in thickness) as the first incident side interface layer 203 and a $(ZnS)_{80}(SiO_2)_{20}$ layer (40 nm in thickness) as the first incident side dielectric layer 202 were formed successively by sputtering on the optical separation layer 17.

The transmittance adjustment layer 209 was formed by supplying electrical power of 400 W from an RF power supply in an atmosphere of mixed gas of Ar and $O_2$ (containing 3% by volume of $O_2$) having a pressure of 0.15 Pa. The first reflective layer 208 was formed by supplying electrical power of 100 W from a DC power supply in an Ar gas atmosphere having a pressure of 0.4 Pa. The first counter-incident side dielectric layer 206 was formed by supplying electrical power of 400 W from an RF power supply in an Ar gas atmosphere having a pressure of 0.15 Pa. The first recording layer 204 was formed by supplying electrical power of 50 W from a DC power supply in an Ar gas atmosphere having a pressure of 0.15 Pa. The first incident side interface layer 203 was formed by supplying electrical power of 400 W from an RF power supply in an Ar gas atmosphere having a pressure of 0.15 Pa. The first incident side dielectric layer 202 was formed by supplying electrical power of 400 W from an RF power supply in an atmosphere of mixed gas of Ar and $O_2$ (containing 3% by volume of $O_2$) having a pressure of 0.15 Pa.

Then the first incident side dielectric layer 202 was coated with an ultraviolet curable resin (acrylic resin). The resin layer was made uniform by rotating the substrate 14. The resin was cured by irradiating it with ultraviolet ray. This resulted in the transparent layer 13 having a thickness of 75 μm of the resin. Then initialization process was carried out in which the second recording layer 304 and the first recording layer 204 were crystallized by the laser beam. In this way, a plurality of samples having the second counter-incident side dielectric layers 306 formed from different materials were made.

Recording sensitivity, overwrite cycle-ability and signal intensity of the second information layer 25 were determined for each sample by using the recording/reproduction apparatus 38 shown in FIG. 7. The determinations were made with the laser beam 11 having a wavelength of 405 nm, and the objective lens 34 having a numerical aperture NA of 0.85. The sample was rotated at linear velocities of 4.9 m/second and 9.8 m/second during determination and a minimum mark length (2T) was 0.149 μm. Information was recorded in the groove.

The material forming the second counter-incident side dielectric layer 306 of the second information layer 25, recording sensitivity and overwrite cycle-ability of the second information layer 25 of the information recording medium 24 are shown in Table 3 for linear velocity of 4.9 m/second (1×) and in Table 4 for linear velocity of 9.8 m/second (2×). In the Tables, recording sensitivity at 1× are indicated with A, B, and C, A being less than 12 mW, B being 12 mW or more and less than 14 mW and C being 14 mW or more. Recording sensitivity at 2× are indicated with A, B, and C, A being less than 14 mW, B being 14 mW or more and less than 16 mW and C being 16 mW or more. For the overwrite cycle-ability, number of repetitive overwriting cycles 1,000 or more is indicated with A, number of cycles not less than 500 and less than 1,000 is indicated with B, and number of cycles less than 500 is indicated with C. For signal intensity is indicated with A, B and C, A being less than 40 dB, B being 40 dB or more and less than 45 dB and C being 45 dB and more.

TABLE 3

| Sam. No. | Material for Second Reflective Layer Side Dielectric Layer 306 (mol %) | Reduction into Elementary Composition (atomic %) | Re. Sensi. | Ov. Cyle-Ability | Sig. Inten. |
| --- | --- | --- | --- | --- | --- |
| 2-1 | $(ZnS)_{80}(SiO_2)_{20}$ | $Zn_{36.4}S_{36.4}Si_{9.1}O_{18.1}$ | A | C | A |
| 2-2 | $(In_2O_3)_{50}(ZrO_2)_{50}$ | $In_{25.0}Zr_{12.5}O_{62.5}$ | B | A | B |
| 2-3 | $(SiO_2)_5(In_2O_3)_{50}(ZrO_2)_{45}$ | $Si_{1.3}In_{25.0}Zr_{11.2}O_{62.5}$ | A | A | A |
| 2-4 | $(SiO_2)_{15}(In_2O_3)_{50}(ZrO_2)_{35}$ | $Si_{3.8}In_{25.0}Zr_{8.7}O_{62.5}$ | A | A | A |
| 2-5 | $(SiO_2)_{25}(In_2O_3)_{50}(ZrO_2)_{25}$ | $Si_{6.3}In_{25.0}Zr_{6.2}O_{62.5}$ | A | A | A |
| 2-6 | $(SiO_2)_5(In_2O_3)_5(ZrO_2)_{90}$ | $Si_{1.6}In_{3.2}Zr_{29.0}O_{66.2}$ | A | A | A |
| 2-7 | $(SiO_2)_{90}(In_2O_3)_5(ZrO_2)_5$ | $Si_{29.0}In_{3.2}Zr_{1.6}O_{66.2}$ | A | A | A |
| 2-8 | $(SiO_2)_5(In_2O_3)_{90}(ZrO_2)_5$ | $Si_{1.0}In_{37.5}Zr_{1.0}O_{60.5}$ | A | A | A |
| 2-9 | $(SiO_2)_5(In_2O_3)_{50}[(ZrO_2)_{0.97}(Y_2O_3)_{0.03}]_{45}$ | $Si_{1.2}In_{24.8}Zr_{10.8}Y_{0.7}O_{62.5}$ | A | A | A |
| 2-10 | $(SiO_2)_{15}(In_2O_3)_{50}[(ZrO_2)_{0.97}(Y_2O_3)_{0.03}]_{35}$ | $Si_{3.7}In_{24.9}Zr_{8.4}Y_{0.5}O_{62.5}$ | A | A | A |
| 2-11 | $(SiO_2)_{25}(In_2O_3)_{50}[(ZrO_2)_{0.97}(Y_2O_3)_{0.03}]_{25}$ | $Si_{6.2}In_{24.9}Zr_{6.0}Y_{0.4}O_{62.5}$ | A | A | A |
| 2-12 | $(SiO_2)_5(In_2O_3)_5[(ZrO_2)_{0.97}(Y_2O_3)_{0.03}]_{90}$ | $Si_{1.6}In_{3.2}Zr_{27.7}Y_{1.7}O_{65.8}$ | A | A | A |
| 2-13 | $(SiO_2)_{90}(In_2O_3)_5[(ZrO_2)_{0.97}(Y_2O_3)_{0.03}]_5$ | $Si_{29.0}In_{3.2}Zr_{1.6}Y_{0.1}O_{66.1}$ | A | A | A |
| 2-14 | $(SiO_2)_5(In_2O_3)_{90}[(ZrO_2)_{0.97}(Y_2O_3)_{0.03}]_5$ | $Si_{1.0}In_{37.5}Zr_{1.0}Y_{0.1}O_{60.4}$ | A | A | A |
| 2-15 | $(SiO_2)_5(In_2O_3)_{50}[(ZrO_2)_{0.92}(Y_2O_3)_{0.08}]_{45}$ | $Si_{1.2}In_{24.6}Zr_{10.2}Y_{1.8}O_{62.2}$ | A | A | A |
| 2-16 | $(SiO_2)_{15}(In_2O_3)_{50}[(ZrO_2)_{0.92}(Y_2O_3)_{0.08}]_{35}$ | $Si_{3.7}In_{24.7}Zr_{7.9}Y_{1.4}O_{62.3}$ | A | A | A |
| 2-17 | $(SiO_2)_{25}(In_2O_3)_{50}[(ZrO_2)_{0.92}(Y_2O_3)_{0.08}]_{25}$ | $Si_{6.2}In_{24.8}Zr_{5.7}Y_{1.0}O_{62.3}$ | A | A | A |
| 2-18 | $(SiO_2)_5(In_2O_3)_5[(ZrO_2)_{0.92}(Y_2O_3)_{0.08}]_{90}$ | $Si_{1.5}In_{3.1}Zr_{25.5}Y_{4.4}O_{65.5}$ | A | A | A |
| 2-19 | $(SiO_2)_{90}(In_2O_3)_5[(ZrO_2)_{0.92}(Y_2O_3)_{0.08}]_5$ | $Si_{29.0}In_{3.2}Zr_{1.5}Y_{0.3}O_{66.0}$ | A | A | A |
| 2-20 | $(SiO_2)_5(In_2O_3)_{90}[(ZrO_2)_{0.92}(Y_2O_3)_{0.08}]_5$ | $Si_{1.0}In_{37.4}Zr_{1.0}Y_{0.2}O_{60.4}$ | A | A | A |
| 2-21 | $(SiO_2)_{25}(In_2O_3)_{40}(ZrO_2)_{25}(Cr_2O_3)_{10}$ | $Si_{6.3}In_{20.0}Zr_{6.3}Cr_{5.0}O_{62.4}$ | A | A | A |
| 2-22 | $(SiO_2)_{25}(In_2O_3)_{40}(Cr_2O_3)_{10}[(ZrO_2)_{0.97}(Y_2O_3)_{0.03}]_{25}$ | $Si_{6.2}In_{19.9}Zr_{6.0}Y_{0.4}Cr_{5.0}O_{62.5}$ | A | A | A |
| 2-23 | $(SiO_2)_{25}(In_2O_3)_{40}(Cr_2O_3)_{10}[(ZrO_2)_{0.92}(Y_2O_3)_{0.08}]_{25}$ | $Si_{6.2}In_{19.8}Zr_{5.7}Y_{1.0}Cr_{5.0}O_{62.3}$ | A | A | A |
| 2-24 | $(SiO_2)_{25}(In_2O_3)_{40}(ZrO_2)_{25}(Ga_2O_3)_{10}$ | $Si_{6.3}In_{20.0}Zr_{6.3}Ga_{5.0}O_{62.4}$ | A | A | A |
| 2-25 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.9}Zr_{6.0}Y_{0.4}Ga_{5.0}O_{62.5}$ | A | A | A |
| 2-26 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.8}Zr_{5.7}Y_{1.0}Ga_{5.0}O_{62.3}$ | A | A | A |
| 2-27 | $(SiO_2)_{25}(In_2O_3)_{50}(HfO_2)_{25}$ | $Si_{6.3}In_{25.0}Hf_{6.2}O_{62.5}$ | A | A | A |
| 2-28 | $(SiO_2)_{25}(In_2O_3)_{50}(ZrO_2)_{15}(HfO_2)_{10}$ | $Si_{6.3}In_{25.0}Zr_{3.8}Hf_{2.5}O_{62.4}$ | A | A | A |
| 2-29 | $(SiO_2)_{25}(In_2O_3)_{50}(ZrO_2)_{10}(HfO_2)_{10}(Y_2O_3)_5$ | $Si_{6.1}In_{24.4}Zr_{2.4}Hf_{2.4}Y_{2.4}O_{62.3}$ | A | A | A |

TABLE 4

| Sam. No. | Material for Second Reflective Layer Side Dielectric Layer 306 (mol %) | Reduction into Elementary Composition (atomic %) | Re. Sensi. | Ov. Cyle-Ability | Sig. Inten. |
| --- | --- | --- | --- | --- | --- |
| 2-1 | $(ZnS)_{80}(SiO_2)_{20}$ | $Zn_{36.4}S_{36.4}Si_{9.1}O_{18.1}$ | A | C | A |
| 2-2 | $(In_2O_3)_{50}(ZrO_2)_{50}$ | $In_{25.0}Zr_{12.5}O_{62.5}$ | A | A | B |

TABLE 4-continued

| Sam. No. | Material for Second Reflective Layer Side Dielectric Layer 306 (mol %) | Reduction into Elementary Composition (atomic %) | Re. Sensi. | Ov. Cyle-Ability | Sig. Inten. |
|---|---|---|---|---|---|
| 2-3 | $(SiO_2)_5(In_2O_3)_{50}(ZrO_2)_{45}$ | $Si_{1.3}In_{25.0}Zr_{11.2}O_{62.5}$ | A | A | A |
| 2-4 | $(SiO_2)_{15}(In_2O_3)_{50}(ZrO_2)_{35}$ | $Si_{3.8}In_{25.0}Zr_{8.7}O_{62.5}$ | A | A | A |
| 2-5 | $(SiO_2)_{25}(In_2O_3)_{50}(ZrO_2)_{25}$ | $Si_{6.3}In_{25.0}Zr_{6.2}O_{62.5}$ | A | A | A |
| 2-6 | $(SiO_2)_5(In_2O_3)_5(ZrO_2)_{90}$ | $Si_{1.6}In_{3.2}Zr_{29.0}O_{66.2}$ | A | A | A |
| 2-7 | $(SiO_2)_{90}(In_2O_3)_5(ZrO_2)_5$ | $Si_{29.0}In_{3.2}Zr_{1.6}O_{66.2}$ | A | A | A |
| 2-8 | $(SiO_2)_5(In_2O_3)_{90}(ZrO_2)_5$ | $Si_{1.0}In_{37.5}Zr_{1.0}O_{60.5}$ | A | A | A |
| 2-9 | $(SiO_2)_5(In_2O_3)_{50}[(ZrO_2)_{0.97}(Y_2O_3)_{0.03}]_{45}$ | $Si_{1.2}In_{24.8}Zr_{10.8}Y_{0.7}O_{62.5}$ | A | A | A |
| 2-10 | $(SiO_2)_{15}(In_2O_3)_{50}[(ZrO_2)_{0.97}(Y_2O_3)_{0.03}]_{35}$ | $Si_{3.7}In_{24.9}Zr_{8.4}Y_{0.5}O_{62.5}$ | A | A | A |
| 2-11 | $(SiO_2)_{25}(In_2O_3)_{50}[(ZrO_2)_{0.97}(Y_2O_3)_{0.03}]_{25}$ | $Si_{6.2}In_{24.9}Zr_{6.0}Y_{0.4}O_{62.5}$ | A | A | A |
| 2-12 | $(SiO_2)_5(In_2O_3)_5[(ZrO_2)_{0.97}(Y_2O_3)_{0.03}]_{90}$ | $Si_{1.6}In_{3.2}Zr_{27.7}Y_{1.7}O_{65.8}$ | A | A | A |
| 2-13 | $(SiO_2)_{90}(In_2O_3)_5[(ZrO_2)_{0.97}(Y_2O_3)_{0.03}]_5$ | $Si_{29.0}In_{3.2}Zr_{1.6}Y_{0.1}O_{66.1}$ | A | A | A |
| 2-14 | $(SiO_2)_5(In_2O_3)_{90}[(ZrO_2)_{0.97}(Y_2O_3)_{0.03}]_5$ | $Si_{1.0}In_{37.5}Zr_{1.0}Y_{0.1}O_{60.4}$ | A | A | A |
| 2-15 | $(SiO_2)_5(In_2O_3)_{50}[(ZrO_2)_{0.92}(Y_2O_3)_{0.08}]_{45}$ | $Si_{1.2}In_{24.6}Zr_{10.2}Y_{1.8}O_{62.2}$ | A | A | A |
| 2-16 | $(SiO_2)_{15}(In_2O_3)_{50}[(ZrO_2)_{0.92}(Y_2O_3)_{0.08}]_{35}$ | $Si_{3.7}In_{24.7}Zr_{7.9}Y_{1.4}O_{62.3}$ | A | A | A |
| 2-17 | $(SiO_2)_{25}(In_2O_3)_{50}[(ZrO_2)_{0.92}(Y_2O_3)_{0.08}]_{25}$ | $Si_{6.2}In_{24.8}Zr_{5.7}Y_{1.0}O_{62.3}$ | A | A | A |
| 2-18 | $(SiO_2)_5(In_2O_3)_5[(ZrO_2)_{0.92}(Y_2O_3)_{0.08}]_{90}$ | $Si_{1.5}In_{3.1}Zr_{25.5}Y_{4.4}O_{65.5}$ | A | A | A |
| 2-19 | $(SiO_2)_{90}(In_2O_3)_5[(ZrO_2)_{0.92}(Y_2O_3)_{0.08}]_5$ | $Si_{29.0}In_{3.2}Zr_{1.5}Y_{0.3}O_{66.0}$ | A | A | A |
| 2-20 | $(SiO_2)_5(In_2O_3)_{90}[(ZrO_2)_{0.92}(Y_2O_3)_{0.08}]_5$ | $Si_{1.0}In_{37.4}Zr_{1.0}Y_{0.2}O_{60.4}$ | A | A | A |
| 2-21 | $(SiO_2)_{25}(In_2O_3)_{40}(ZrO_2)_{25}(Cr_2O_3)_{10}$ | $Si_{6.3}In_{20.0}Zr_{6.3}Cr_{5.0}O_{62.4}$ | A | A | A |
| 2-22 | $(SiO_2)_{25}(In_2O_3)_{40}(Cr_2O_3)_{10}[(ZrO_2)_{0.97}(Y_2O_3)_{0.03}]_{25}$ | $Si_{6.2}In_{19.9}Zr_{6.0}Y_{0.4}Cr_{5.0}O_{62.5}$ | A | A | A |
| 2-23 | $(SiO_2)_{25}(In_2O_3)_{40}(Cr_2O_3)_{10}[(ZrO_2)_{0.92}(Y_2O_3)_{0.08}]_{25}$ | $Si_{6.2}In_{19.8}Zr_{5.7}Y_{1.0}Cr_{5.0}O_{62.3}$ | A | A | A |
| 2-24 | $(SiO_2)_{25}(In_2O_3)_{40}(ZrO_2)_{25}(Ga_2O_3)_{10}$ | $Si_{6.3}In_{20.0}Zr_{6.3}Ga_{5.0}O_{62.4}$ | A | A | A |
| 2-25 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.9}Zr_{6.0}Y_{0.4}Ga_{5.0}O_{62.5}$ | A | A | A |
| 2-26 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.8}Zr_{5.7}Y_{1.0}Ga_{5.0}O_{62.3}$ | A | A | A |
| 2-27 | $(SiO_2)_{25}(In_2O_3)_{50}(HfO_2)_{25}$ | $Si_{6.3}In_{25.0}Hf_{6.2}O_{62.5}$ | A | A | A |
| 2-28 | $(SiO_2)_{25}(In_2O_3)_{50}(ZrO_2)_{15}(HfO_2)_{10}$ | $Si_{6.3}In_{25.0}Zr_{3.8}Hf_{2.5}O_{62.4}$ | A | A | A |
| 2-29 | $(SiO_2)_{25}(In_2O_3)_{50}(ZrO_2)_{10}(HfO_2)_{10}(Y_2O_3)_5$ | $Si_{6.1}In_{24.4}Zr_{2.4}Hf_{2.4}Y_{2.4}O_{62.3}$ | A | A | A |

The results described above showed low overwrite cycle-ability at 1× and 2× due to the diffusion of sulfur contained in ZnS into the recording layer in sample 2-1 having the counter-incident side dielectric layer 306 formed from $(ZnS)_{80}(SiO_2)_{20}$ layer. Sample 2-2 having the counter-incident side dielectric layer 306 formed from $(In_2O_3)_{50}(ZrO_2)_{50}$ showed recording sensitivity and signal intensity at 1× that were a little lower, and signal intensity at 2× that was a little lower. Samples 2-3 to 2-29 having the counter-incident side dielectric layer 306 formed from a material that contains at least Si, In and O with a concentration of $SiO_2$ not lower than 5 mol % and a concentration of Si not lower than 1 atomic % showed recording sensitivity, overwrite cycle-ability and signal intensity all satisfactory levels. These results showed that the medium 24 having high performance can be obtained when the counter-incident side dielectric layer 306 contains 5 mol % or more $SiO_2$ and 1 atomic % or more Si.

Example 3

In Example 3, the information recording medium 24 shown in FIG. 3 was made, and the relations between the material of the first counter-incident side dielectric layer 206 and recording sensitivity, overwrite cycle-ability and signal intensity of the first information layer 23 were studied. Specifically, samples 3-1 to 3-29 of the information recording medium 24 including the first information layers 23 having the first counter-incident side dielectric layers 206 formed from different materials were made, and recording sensitivity, overwrite cycle-ability and signal intensity of the first information layer 23 were determined.

Samples were made as follows. First, the substrate 14 made of polycarbonate (120 mm in diameter, 1.1 mm in thickness) was prepared with a guide groove (20 nm in depth, 0.32 μm in track pitch) formed thereon for guiding the laser beam 11. An Ag—Pd—Cu layer (80 nm in thickness) as the second reflective layer 208, a $(SiO_2)_{15}(In_2O_3)_{50}(ZrO_2)_{25}$ layer (15 nm in thickness) as the second incident side dielectric layer 306, a $(SiO_2)_{15}(In_2O_3)_{35}(ZrO_2)_{50}$ layer (10 nm in thickness) as the second counter-incident side interface layer (not shown), a $Ge_{45}In_1Bi_3Te_{51}$ layer (10 nm in thickness) as the second recording layer 304, a $(Cr_2O_3)_{50}(ZrO_2)_{50}$ layer (5 nm in thickness) as the second incident side interface layer 303, and a $(ZnS)_{80}(SiO_2)_{20}$ layer (60 nm in thickness) as the second incident side dielectric layer 302 were formed successively by sputtering on the polycarbonate substrate.

The second reflective layer 308 was formed by supplying electrical power of 200 W from a DC power supply in an Ar gas atmosphere having a pressure of 0.4 Pa. The second counter-incident side dielectric layer 306 was formed by supplying electrical power of 400 W from an RF power supply in an Ar gas atmosphere having a pressure of 0.15 Pa. The second recording layer 304 was formed by supplying electrical power of 100 W from a DC power supply in an Ar gas atmosphere having a pressure of 0.15 Pa. The second incident side interface layer 303 was formed by supplying electrical power of 400 W from an RF power supply in an Ar gas atmosphere having a pressure of 0.15 Pa. The second incident side dielectric layer 302 was formed by supplying electrical power of 400 W from an RF power supply in an atmosphere of mixed gas of Ar and $O_2$ (containing 3% by volume of $O_2$) having a pressure of 0.15 Pa.

Then the second counter-incident side dielectric layer 302 was coated with an ultraviolet curable resin (acrylic resin), over which a substrate having a guide groove (20 nm in depth, 0.32 μm in track pitch) formed thereon was placed in contact therewith and was rotated so as to make the resin layer uniform. The resin was cured, and then the substrate was removed. This process resulted in the optical separation layer 17 having a thickness of 25 μm with the guide groove for guiding the laser beam 11 formed on the side of the first information layer 23.

A $TiO_2$ layer (20 nm in thickness) as the transmittance adjustment layer 209, an Ag—Pd—Cu layer (10 nm in thickness) as the first reflective layer 208, the first counter-incident side dielectric layer 206 (15 nm in thickness), a $Ge_{45}In_1Bi_3Te_{51}$ layer (6 nm in thickness) as the first recording layer 204, a $(SiO_2)_{25}(Cr_2O_3)_{50}(ZrO_2)_{25}$ layer (5 nm in thickness) as the first incident side interface layer 203 and a $(ZnS)_{80}(SiO_2)_{20}$ layer (40 nm in thickness) as the first incident side dielectric layer 202 were formed successively by sputtering on the optical separation layer 17.

The transmittance adjustment layer 209 was formed by supplying electrical power of 400 W from an RF power supply in an atmosphere of mixed gas of Ar and $O_2$ (containing 3% by volume of $O_2$) having a pressure of 0.15 Pa. The first reflective layer 208 was formed by supplying electrical power of 100 W from a DC power supply in an Ar gas atmosphere having a pressure of 0.4 Pa. The first counter-incident side dielectric layer 206 was formed by supplying electrical power of 400 W from an RF power supply in an Ar gas atmosphere having a pressure of 0.15 Pa. The first recording layer 204 was formed by supplying electrical power of 50 W from a DC power supply in an Ar gas atmosphere having a pressure of 0.15 Pa. The first incident side interface layer 203 was formed by supplying electrical power of 400 W from an RF power supply in an Ar gas atmosphere having a pressure of 0.15 Pa. The first incident side dielectric layer 202 was formed by supplying electrical power of 400 W from an RF power supply in an atmosphere of mixed gas of Ar and $O_2$ (containing 3% by volume of $O_2$) having a pressure of 0.15 Pa.

Then the first incident side dielectric layer 202 was coated with an ultraviolet curable resin (acrylic resin). The resin layer was made uniform by rotating the substrate 14. The resin was cured by irradiation of ultraviolet ray. This resulted in the transparent layer 13 having a thickness of 75 μm of the resin. Then initialization process was carried out in which the second recording layer 304 and the first recording layer 204 were crystallized by the laser beam. In this way, a plurality of samples having the first counter-incident side dielectric layer 206 of different materials were made.

Recording sensitivity, overwrite cycle-ability and signal intensity of the first information layer 23 were determined for each sample by using the recording/reproduction apparatus 38 shown in FIG. 7. The determinations were made with the laser beam 11 having a wavelength of 405 nm, the objective lens 34 having a numerical aperture NA of 0.85. The sample was rotated at linear velocities of 4.9 m/second and 9.8 m/second during determination and a minimum mark length (2T) was 0.149 μm. Information was recorded on the groove.

The material forming the first counter-incident side dielectric layer 206 of the first information layer 23, recording sensitivity, overwrite cycle-ability and signal intensity of the first information layer 23 of the information recording medium 24 are shown in Table 5 for linear velocity of 4.9 m/second (1×) and in Table 6 for linear velocity of 9.8 m/second (2×). In the Tables, recording sensitivity at 1× are indicated with A, B and C, A being less than 12 mW, B being 12 mW or more and less than 14 mW and C being 14 mW or more. Recording sensitivity at 2× are indicated with A, B and C, A being less than 14 mW, B being 14 mW or more and less than 16 mW and C being 16 mW or more. For the overwrite cycle-ability: number of repetitive overwriting cycles 1,000 or more is indicated with A, number of cycles not less than 500 and less than 1,000 is indicated with B and number of cycles less than 500 is indicated with C. For signal intensity dB is indicated with C, B and A, C being less than 40 dB, B being 40 dB or more and less than 45 dB and A being 45 dB and more.

TABLE 5

| Sam. No. | Material for First Reflective Layer Side Dielectric Layer 206 (mol %) | Reduction into Elemental Composition (atomic %) | Re. Sensi. | Ov. Cycle- Ability | Sig. Inten. |
|---|---|---|---|---|---|
| 3-1 | $(ZnS)_{80}(SiO_2)_{20}$ | $Zn_{36.4}S_{36.4}Si_{9.1}O_{18.1}$ | A | C | A |
| 3-2 | $(In_2O_3)_{50}(ZrO_2)_{50}$ | $In_{25.0}Zr_{12.5}O_{62.5}$ | B | A | B |
| 3-3 | $(SiO_2)_5(In_2O_3)_{50}(ZrO_2)_{45}$ | $Si_{1.3}In_{25.0}Zr_{11.2}O_{62.5}$ | A | A | A |
| 3-4 | $(SiO_2)_{15}(In_2O_3)_{50}(ZrO_2)_{35}$ | $Si_{3.8}In_{25.0}Zr_{8.7}O_{62.5}$ | A | A | A |
| 3-5 | $(SiO_2)_{25}(In_2O_3)_{50}(ZrO_2)_{25}$ | $Si_{6.3}In_{25.0}Zr_{6.2}O_{62.5}$ | A | A | A |
| 3-6 | $(SiO_2)_5(In_2O_3)_5(ZrO_2)_{90}$ | $Si_{1.6}In_{3.2}Zr_{29.0}O_{66.2}$ | A | A | A |
| 3-7 | $(SiO_2)_{90}(In_2O_3)_5(ZrO_2)_5$ | $Si_{29.0}In_{3.2}Zr_{1.6}O_{66.2}$ | A | A | A |
| 3-8 | $(SiO_2)_5(In_2O_3)_{90}(ZrO_2)_5$ | $Si_{1.0}In_{37.5}Zr_{1.0}O_{60.5}$ | A | A | A |
| 3-9 | $(SiO_2)_5(In_2O_3)_{50}[(ZrO_2)_{0.97}(Y_2O_3)_{0.03}]_{45}$ | $Si_{1.2}In_{24.8}Zr_{10.8}Y_{0.7}O_{62.5}$ | A | A | A |
| 3-10 | $(SiO_2)_{15}(In_2O_3)_{50}[(ZrO_2)_{0.97}(Y_2O_3)_{0.03}]_{35}$ | $Si_{3.7}In_{24.9}Zr_{8.4}Y_{0.5}O_{62.5}$ | A | A | A |
| 3-11 | $(SiO_2)_{25}(In_2O_3)_{50}[(ZrO_2)_{0.97}(Y_2O_3)_{0.03}]_{25}$ | $Si_{6.2}In_{24.9}Zr_{6.0}Y_{0.4}O_{62.5}$ | A | A | A |
| 3-12 | $(SiO_2)_5(In_2O_3)_5[(ZrO_2)_{0.97}(Y_2O_3)_{0.03}]_{90}$ | $Si_{1.6}In_{3.2}Zr_{27.7}Y_{1.7}O_{65.8}$ | A | A | A |
| 3-13 | $(SiO_2)_{90}(In_2O_3)_5[(ZrO_2)_{0.97}(Y_2O_3)_{0.03}]_5$ | $Si_{29.0}In_{3.2}Zr_{1.6}Y_{0.1}O_{66.1}$ | A | A | A |
| 3-14 | $(SiO_2)_5(In_2O_3)_{90}[(ZrO_2)_{0.97}(Y_2O_3)_{0.03}]_5$ | $Si_{1.0}In_{37.5}Zr_{1.0}Y_{0.1}O_{60.4}$ | A | A | A |
| 3-15 | $(SiO_2)_5(In_2O_3)_{50}[(ZrO_2)_{0.92}(Y_2O_3)_{0.08}]_{45}$ | $Si_{1.2}In_{24.6}Zr_{10.2}Y_{1.8}O_{62.2}$ | A | A | A |
| 3-16 | $(SiO_2)_{15}(In_2O_3)_{50}[(ZrO_2)_{0.92}(Y_2O_3)_{0.08}]_{35}$ | $Si_{3.7}In_{24.7}Zr_{7.9}Y_{1.4}O_{62.3}$ | A | A | A |
| 3-17 | $(SiO_2)_{25}(In_2O_3)_{50}[(ZrO_2)_{0.92}(Y_2O_3)_{0.08}]_{25}$ | $Si_{6.2}In_{24.8}Zr_{5.7}Y_{1.0}O_{62.3}$ | A | A | A |
| 3-18 | $(SiO_2)_5(In_2O_3)_5[(ZrO_2)_{0.92}(Y_2O_3)_{0.08}]_{90}$ | $Si_{1.5}In_{3.1}Zr_{25.5}Y_{4.4}O_{65.5}$ | A | A | A |
| 3-19 | $(SiO_2)_{90}(In_2O_3)_5[(ZrO_2)_{0.92}(Y_2O_3)_{0.08}]_5$ | $Si_{29.0}In_{3.2}Zr_{1.5}Y_{0.3}O_{66.0}$ | A | A | A |
| 3-20 | $(SiO_2)_5(In_2O_3)_{90}[(ZrO_2)_{0.92}(Y_2O_3)_{0.08}]_5$ | $Si_{1.0}In_{37.4}Zr_{1.0}Y_{0.2}O_{60.4}$ | A | A | A |
| 3-21 | $(SiO_2)_{25}(In_2O_3)_{40}(ZrO_2)_{25}(Cr_2O_3)_{10}$ | $Si_{6.3}In_{20.0}Zr_{6.3}Cr_{5.0}O_{62.4}$ | A | A | A |
| 3-22 | $(SiO_2)_{25}(In_2O_3)_{40}(Cr_2O_3)_{10}[(ZrO_2)_{0.97}(Y_2O_3)_{0.03}]_{25}$ | $Si_{6.2}In_{19.9}Zr_{6.0}Y_{0.4}Cr_{5.0}O_{62.5}$ | A | A | A |
| 3-23 | $(SiO_2)_{25}(In_2O_3)_{40}(Cr_2O_3)_{10}[(ZrO_2)_{0.92}(Y_2O_3)_{0.08}]_{25}$ | $Si_{6.2}In_{19.8}Zr_{5.7}Y_{1.0}Cr_{5.0}O_{62.3}$ | A | A | A |
| 3-24 | $(SiO_2)_{25}(In_2O_3)_{40}(ZrO_2)_{25}(Ga_2O_3)_{10}$ | $Si_{6.3}In_{20.0}Zr_{6.3}Ga_{5.0}O_{62.4}$ | A | A | A |
| 3-25 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.9}Zr_{6.0}Y_{0.4}Ga_{5.0}O_{62.5}$ | A | A | A |
| 3-26 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.8}Zr_{5.7}Y_{1.0}Ga_{5.0}O_{62.3}$ | A | A | A |
| 3-27 | $(SiO_2)_{25}(In_2O_3)_{50}(HfO_2)_{25}$ | $Si_{6.3}In_{25.0}Hf_{6.2}O_{62.5}$ | A | A | A |
| 3-28 | $(SiO_2)_{25}(In_2O_3)_{50}(ZrO_2)_{15}(HfO_2)_{10}$ | $Si_{6.3}In_{25.0}Zr_{3.8}Hf_{2.5}O_{62.4}$ | A | A | A |
| 3-29 | $(SiO_2)_{25}(In_2O_3)_{50}(ZrO_2)_{10}(HfO_2)_{10}(Y_2O_3)_5$ | $Si_{6.1}In_{24.4}Zr_{2.4}Hf_{2.4}Y_{2.4}O_{62.3}$ | A | A | A |

TABLE 6

| Sam. No. | Material for First Reflective Layer Side Dielectric Layer 206 (mol %) | Reduction into Elemental Composition (atomic %) | Re. Sensi. | Ov. Cycle-Ability | Sig. Inten. |
|---|---|---|---|---|---|
| 3-1 | $(ZnS)_{80}(SiO_2)_{20}$ | $Zn_{36.4}S_{36.4}Si_{9.1}O_{18.1}$ | A | C | A |
| 3-2 | $(In_2O_3)_{50}(ZrO_2)_{50}$ | $In_{25.0}Zr_{12.5}O_{62.5}$ | A | A | B |
| 3-3 | $(SiO_2)_5(In_2O_3)_{50}(ZrO_2)_{45}$ | $Si_{1.3}In_{25.0}Zr_{11.2}O_{62.5}$ | A | A | A |
| 3-4 | $(SiO_2)_{15}(In_2O_3)_{50}(ZrO_2)_{35}$ | $Si_{3.8}In_{25.0}Zr_{8.7}O_{62.5}$ | A | A | A |
| 3-5 | $(SiO_2)_{25}(In_2O_3)_{50}(ZrO_2)_{25}$ | $Si_{6.3}In_{25.0}Zr_{6.2}O_{62.5}$ | A | A | A |
| 3-6 | $(SiO_2)_5(In_2O_3)_5(ZrO_2)_{90}$ | $Si_{1.6}In_{3.2}Zr_{29.0}O_{66.2}$ | A | A | A |
| 3-7 | $(SiO_2)_{90}(In_2O_3)_5(ZrO_2)_5$ | $Si_{29.0}In_{3.2}Zr_{1.6}O_{66.2}$ | A | A | A |
| 3-8 | $(SiO_2)_5(In_2O_3)_{90}(ZrO_2)_5$ | $Si_{1.0}In_{37.5}Zr_{1.0}O_{60.5}$ | A | A | A |
| 3-9 | $(SiO_2)_5(In_2O_3)_{50}[(ZrO_2)_{0.97}(Y_2O_3)_{0.03}]_{45}$ | $Si_{1.2}In_{24.8}Zr_{10.8}Y_{0.7}O_{62.5}$ | A | A | A |
| 3-10 | $(SiO_2)_{15}(In_2O_3)_{50}[(ZrO_2)_{0.97}(Y_2O_3)_{0.03}]_{35}$ | $Si_{3.7}In_{24.9}Zr_{8.4}Y_{0.5}O_{62.5}$ | A | A | A |
| 3-11 | $(SiO_2)_{25}(In_2O_3)_{50}[(ZrO_2)_{0.97}(Y_2O_3)_{0.03}]_{25}$ | $Si_{6.2}In_{24.9}Zr_{6.0}Y_{0.4}O_{62.5}$ | A | A | A |
| 3-12 | $(SiO_2)_5(In_2O_3)_5[(ZrO_2)_{0.97}(Y_2O_3)_{0.03}]_{90}$ | $Si_{1.6}In_{3.2}Zr_{27.7}Y_{1.7}O_{65.8}$ | A | A | A |
| 3-13 | $(SiO_2)_{90}(In_2O_3)_5[(ZrO_2)_{0.97}(Y_2O_3)_{0.03}]_5$ | $Si_{29.0}In_{3.2}Zr_{1.6}Y_{0.1}O_{66.1}$ | A | A | A |
| 3-14 | $(SiO_2)_5(In_2O_3)_{90}[(ZrO_2)_{0.97}(Y_2O_3)_{0.03}]_5$ | $Si_{1.0}In_{37.5}Zr_{1.0}Y_{0.1}O_{60.4}$ | A | A | A |
| 3-15 | $(SiO_2)_5(In_2O_3)_{50}[(ZrO_2)_{0.92}(Y_2O_3)_{0.08}]_{45}$ | $Si_{1.2}In_{24.6}Zr_{10.2}Y_{1.8}O_{62.2}$ | A | A | A |
| 3-16 | $(SiO_2)_{15}(In_2O_3)_{50}[(ZrO_2)_{0.92}(Y_2O_3)_{0.08}]_{35}$ | $Si_{3.7}In_{24.7}Zr_{7.9}Y_{1.4}O_{62.3}$ | A | A | A |
| 3-17 | $(SiO_2)_{25}(In_2O_3)_{50}[(ZrO_2)_{0.92}(Y_2O_3)_{0.08}]_{25}$ | $Si_{6.2}In_{24.8}Zr_{5.7}Y_{1.0}O_{62.3}$ | A | A | A |
| 3-18 | $(SiO_2)_5(In_2O_3)_5[(ZrO_2)_{0.92}(Y_2O_3)_{0.08}]_{90}$ | $Si_{1.5}In_{3.1}Zr_{25.5}Y_{4.4}O_{65.5}$ | A | A | A |
| 3-19 | $(SiO_2)_{90}(In_2O_3)_5[(ZrO_2)_{0.92}(Y_2O_3)_{0.08}]_5$ | $Si_{29.0}In_{3.2}Zr_{1.5}Y_{0.3}O_{66.0}$ | A | A | A |
| 3-20 | $(SiO_2)_5(In_2O_3)_{90}[(ZrO_2)_{0.92}(Y_2O_3)_{0.08}]_5$ | $Si_{1.0}In_{37.4}Zr_{1.0}Y_{0.2}O_{60.4}$ | A | A | A |
| 3-21 | $(SiO_2)_{25}(In_2O_3)_{40}(ZrO_2)_{25}(Cr_2O_3)_{10}$ | $Si_{6.3}In_{20.0}Zr_{6.3}Cr_{5.0}O_{62.4}$ | A | A | A |
| 3-22 | $(SiO_2)_{25}(In_2O_3)_{40}(Cr_2O_3)_{10}[(ZrO_2)_{0.97}(Y_2O_3)_{0.03}]_{25}$ | $Si_{6.2}In_{19.9}Zr_{6.0}Y_{0.4}Cr_{5.0}O_{62.5}$ | A | A | A |
| 3-23 | $(SiO_2)_{25}(In_2O_3)_{40}(Cr_2O_3)_{10}[(ZrO_2)_{0.92}(Y_2O_3)_{0.08}]_{25}$ | $Si_{6.2}In_{19.8}Zr_{5.7}Y_{1.0}Cr_{5.0}O_{62.3}$ | A | A | A |
| 3-24 | $(SiO_2)_{25}(In_2O_3)_{40}(ZrO_2)_{25}(Ga_2O_3)_{10}$ | $Si_{6.3}In_{20.0}Zr_{6.3}Ga_{5.0}O_{62.4}$ | A | A | A |
| 3-25 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.9}Zr_{6.0}Y_{0.4}Ga_{5.0}O_{62.5}$ | A | A | A |
| 3-26 | $(SiO_2)_{25}(In_2O_3)_{40}(Ga_2O_3)_{10}[(ZrO_2)_{0.97}(Y_2O_3)_{0.03}]_{25}$ | $Si_{6.2}In_{19.8}Zr_{5.7}Y_{1.0}Ga_{5.0}O_{62.3}$ | A | A | A |
| 3-27 | $(SiO_2)_{25}(In_2O_3)_{50}(HfO_2)_{25}$ | $Si_{6.3}In_{25.0}Hf_{6.2}O_{62.5}$ | A | A | A |
| 3-28 | $(SiO_2)_{25}(In_2O_3)_{50}(ZrO_2)_{15}(HfO_2)_{10}$ | $Si_{6.3}In_{25.0}Zr_{3.8}Hf_{2.5}O_{62.4}$ | A | A | A |
| 3-29 | $(SiO_2)_{25}(In_2O_3)_{50}(ZrO_2)_{10}(HfO_2)_{10}(Y_2O_3)_5$ | $Si_{6.1}In_{24.4}Zr_{2.4}Hf_{2.4}Y_{2.4}O_{62.3}$ | A | A | A |

The results described above showed low overwrite cycle-ability at 1× and 2× due to the diffusion of sulfur contained in ZnS into the recording layer in sample 3-1 having the first counter-incident side dielectric layer 206 of $(ZnS)_{80}(SiO_2)_{20}$. Sample 3-2 having the first counter-incident side dielectric layer 206 formed from $(In_2O_3)_{50}(ZrO_2)_{50}$ showed recording sensitivity and signal intensity at 1× that were a little lower, and signal intensity at 2× that was a little lower. Samples 3-3 to 3-29 having the first counter-incident side dielectric layer 206 formed from a material that contains at least Si, In and O with a concentration of $SiO_2$ not lower than 5 mol % and a concentration of Si not lower than 1 atomic % showed recording sensitivity, overwrite cycle-ability and signal intensity all at satisfactory levels. These results showed that the medium 24 having high performance can be obtained when the first counter-incident side dielectric layer 206 contains 5 mol % or more $SiO_2$ and 1 atomic % or more Si.

Example 4

In Example 4, the information recording medium 29 shown in FIG. 4 was made, and was tested similarly to Example 1.

Samples were made as follows. First, the substrate 26 made of polycarbonate (120 mm in diameter, 0.6 mm in thickness) was prepared with a guide groove (40 nm in depth, 0.344 μm in track pitch) formed thereon for guiding the laser beam 11. A $(ZnS)_{80}(SiO_2)_{20}$ layer (60 nm in thickness) as the incident side dielectric layer 102, a $(Cr_2O_3)_{50}(ZrO_2)_{50}$ layer (5 nm in thickness) as the incident side interface layer 103, a $Ge_{45}In_1Bi_3Te_{51}$ layer (10 nm in thickness) as the recording layer 104, the counter-incident side dielectric layer 106 (25 nm in thickness) and an Ag—Pd—Cu layer (80 nm in thickness) as the reflective layer 108 were formed successively by sputtering on the polycarbonate substrate. The film-forming apparatus used, the sputtering target and the film-forming conditions (type of gas, pressure and electrical power supplied) were similar to those employed in Example 1.

Then the dummy substrate 28 was coated with an ultraviolet curable resin (acrylic resin), and was put into close contact with the resin of the reflective layer 108 of the substrate 26. The resin layer with a uniform thickness of 20 μm was formed between the substrate 26 and the dummy substrate 28 by rotating the substrate 26. The resin was cured by irradiation of ultraviolet ray. Thus the substrate 26 was adhered with the adhesive layer 27 onto the dummy substrate 28. Last, initialization process was carried out in which the recording layer 104 was crystallized over the entire surface thereof by the laser beam.

Recording sensitivity, overwrite cycle-ability and signal sensitivity of the information layer 16 of the information recording medium 29 were determined for each sample by the methods similar to that employed in Example 1. The determinations were made with the laser beam 11 having a wavelength of 405 nm, the objective lens 34 having a numerical aperture NA of 0.65. The sample was rotated at linear velocities of 8.6 m/second and 17.2 m/second during determination and a minimum mark length was 0.294 μm. Information was recorded on the groove.

The determination showed low overwrite cycle-ability at 1× and 2× due to the diffusion of sulfur contained in ZnS into the recording layer in the sample having the counter-incident side dielectric layer 106 formed from $(ZnS)_{80}(SiO_2)_{20}$ similarly to Example 1. Sample having the counter-incident side dielectric layer 106 formed from $(In_2O_3)_{50}(ZrO_2)_{50}$ showed recording sensitivity and signal intensity at 1× that were a little lower, and signal intensity at 2× that was a little lower. Sample having the counter-incident side dielectric layer 106 formed from a material that contains at least Si, In and O with a concentration of $SiO_2$ not lower than 5 mol % and a concentration of Si not lower than 1 atomic % showed recording sensitivity, overwrite cycle-ability and signal intensity that were all at satisfactory levels. These results showed that the medium 29 having high performance can be obtained when the counter-incident side dielectric layer 106 contains 5 mol % or more $SiO_2$ and 1 atomic % or more Si.

Example 5

In Example 5, the information recording medium 32 shown in FIG. 6 was made, and was tested similarly to Example 2.

Samples were made as follows. First, the substrate 26 made of polycarbonate (120 mm in diameter, 0.6 mm in thickness) was prepared with a guide groove (40 nm in depth, 0.344 μm in track pitch) formed thereon for guiding the laser beam 11. A $(ZnS)_{80}(SiO_2)_{20}$ layer (40 nm in thickness) as the first incident side dielectric layer 202, a $(SiO_2)_{25}(Cr_2O_3)_{50}(ZrO_2)_{25}$ layer (5 nm in thickness) as the first incident side interface layer 203, a $Ge_{45}In_1Bi_3Te_{51}$ layer (6 nm in thickness) as the first recording layer 204, a $(SiO_2)_{25}(In_2O_3)_{50}(ZrO_2)_{25}$ layer (10 nm in thickness) as the first counter-incident side dielectric layer 206, an Ag—Pd—Cu layer (10 nm in thickness) as the first reflective layer 208 and a $TiO_2$ layer (20 nm in thickness) as the transmittance adjustment layer 209 were formed successively by sputtering on the polycarbonate substrate. The film-forming apparatus used, the sputtering target and the film-forming conditions (type of gas, pressure and electrical power supplied) were similar to those employed to form the first information layer 23 in Example 2.

The substrate 30 made of polycarbonate (120 mm in diameter, 0.58 mm in thickness) was prepared with guide groove (40 nm in depth, 0.344 μm in track pitch) formed thereon for guiding the laser beam 11. An Ag—Pd—Cu layer (80 nm in thickness) as the second reflective layer 208, the counter-incident side dielectric layer 306 (25 nm in thickness), a $Ge_{45}In_1Bi_3Te_{51}$ layer (10 nm in thickness) as the second recording layer 304, a $(Cr_2O_3)_{50}(ZrO_2)_{50}$ layer (5 nm in thickness) as the second incident side interface layer 303 and a $(ZnS)_{80}(SiO_2)_{20}$ layer (60 nm in thickness) as the second incident side dielectric layer 302 were formed successively by sputtering on the polycarbonate substrate. The film-forming apparatus used, the sputtering target and the film-forming conditions (type of gas, pressure and electrical power supplied) were similar to those employed to form the second information layer 25 in Example 2.

Then the second incident side dielectric layer 302 of the substrate 30 was coated with an ultraviolet curable resin (acrylic resin), and was put into close contact with the resin of the transmittance adjustment layer 209 of the substrate 26. The resin layer with uniform thickness of 20 μm was formed between the second incident side dielectric layer 302 and the transmittance adjustment layer 209 by rotating the substrate 30. The resin was cured by irradiating it with ultraviolet ray. Thus the substrate 26 was adhered with the adhesive layer 27 onto the substrate 30. Last, initialization process was carried out in which the second recording layer 304 and the first recording layer 204 were crystallized over the entire surface thereof by the laser beam.

Recording sensitivity, overwrite cycle-ability and signal sensitivity of the second information layer 25 of the information recording medium 32 were determined for each sample by the methods similar to those employed in Example 2. The determinations were made by using the laser beam 11 having wavelength of 405 nm, the objective lens 34 having a numerical aperture NA of 0.65. The sample was rotated at linear velocities of 8.6 m/second and 17.2 m/second during determinations and a minimum mark length was 0.294 μm. Information was recorded in the groove.

The determination showed low overwrite cycle-ability at 1× and 2× due to the diffusion of sulfur contained in ZnS into the recording layer in the sample having the second counter-incident side dielectric layer 306 formed from $(ZnS)_{80}(SiO_2)_{20}$ similarly to Example 2. Sample having the second counter-incident side dielectric layer 306 formed from $(In_2O_3)_{50}(ZrO_2)_{50}$ showed recording sensitivity and signal intensity at 1× that were a little lower, and signal intensity at 2× that was a little lower. Sample having the second counter-incident side dielectric layer 306 formed from a material that contains at least Si, In and O with a concentration of $SiO_2$ not lower than 5 mol % and a concentration of Si not lower than 1 atomic % showed recording sensitivity, overwrite cycle-ability and signal intensity all at satisfactory levels. These results showed that the medium 29 having high performance can be obtained when the second counter-incident side dielectric layer 306 contains 5 mol % or more $SiO_2$ and 1 atomic % or more Si.

Example 6

In Example 6, the information recording medium 32 shown in FIG. 6 was made, and was tested similarly to Example 3.

Samples were made as follows. First, the substrate 26 made of polycarbonate (120 mm in diameter, 0.6 mm in thickness) was prepared with guide groove (40 nm in depth, 0.344 μm in track pitch) formed thereon for guiding the laser beam 11. A $(ZnS)_{80}(SiO_2)_{20}$ layer (40 nm in thickness) as the first counter-incident side dielectric layer 202, a $(SiO_2)_{25}(Cr_2O_3)_{50}(ZrO_2)_{25}$ layer (5 nm in thickness) as the first incident side interface layer 203, a $Ge_{45}In_1Bi_3Te_{51}$ layer (6 nm in thickness) as the first recording layer 204, the first counter-incident side dielectric layer 206 (15 nm in thickness), an Ag—Pd—Cu layer (10 nm in thickness) as the first reflective layer 208 and a $TiO_2$ layer (20 nm in thickness) as the transmittance adjustment layer 209 were formed successively by sputtering on the polycarbonate substrate. The film-forming apparatus used, the sputtering target and the film-forming conditions (type of gas, pressure and electrical power supplied) were similar to those employed to form the first information layer 23 in Example 3.

The substrate 30 made of polycarbonate (120 mm in diameter, 0.58 mm in thickness) was prepared with guide groove (40 nm in depth, 0.344 μm in track pitch) formed thereon for guiding the laser beam 11. An Ag—Pd—Cu layer (80 nm in thickness) as the second reflective layer 208, a $(SiO_2)_{25}(In_2O_3)_{50}(ZrO_2)_{25}$ layer (15 nm in thickness) as the second counter-incident side dielectric layer 306, a $(SiO_2)_{15}(In_2O_3)_{35}(ZrO_2)_{50}$ layer (10 nm in thickness) as the second counter-incident side interface layer (not shown), a $Ge_{45}In_1Bi_3Te_{51}$ layer (10 nm in thickness) as the second recording layer 304, a $(Cr_2O_3)_{50}(ZrO_2)_{50}$ layer (5 nm in thickness) as the second incident side interface layer 303 and a $(ZnS)_{80}(SiO_2)_{20}$ layer (60 nm in thickness) as the second incident side dielectric layer 302 were formed successively by sputtering on the polycarbonate substrate. The film-forming apparatus used, the sputtering target and the film-forming conditions (type of gas, pressure and electrical power supplied) were similar to those employed to form the second information layer 25 in Example 3.

Then the second incident side dielectric layer 302 of the substrate 30 was coated with an ultraviolet curable resin (acrylic resin), and was put into close contact with the resin of the transmittance adjustment layer 209 of the substrate 26. The resin layer with uniform thickness of 20 nm was formed between the second incident side dielectric layer 302 and the transmittance adjustment layer 209 by rotating the substrate 26. The resin was cured by irradiating it with ultraviolet ray. Thus the substrate 26 was adhered with the adhesive layer 27 onto the substrate 30. Last, initialization process was carried out in which the second recording layer 304 and the first recording layer 204 were crystallized over the entire surface thereof by the laser beam.

Recording sensitivity, overwrite cycle-ability and signal sensitivity of the first information layer 23 of the information recording medium 32 were determined for each sample by methods similar to those employed in Example 4. The determinations were made with the laser beam 11 having a wavelength of 405 nm, and the objective lens 34 having a numerical aperture NA of 0.65. The sample was rotated at linear velocities of 8.6 m/second and 17.2 m/second during determination and a minimum mark length was 0.294 µm. Information was recorded in the groove.

The determinations showed low overwrite cycle-ability at 1× and 2× due to the diffusion of sulfur contained in ZnS into the recording layer in the sample having the first counter-incident side dielectric layer 206 formed from $(ZnS)_{80}(SiO_2)_{20}$ similarly to Example 4. Sample having the first counter-incident side dielectric layer 206 formed from $(In_2O_3)_{50}(ZrO_2)_{50}$ showed recording sensitivity and signal intensity at 1× that were a little lower, and signal intensity at 2× that was a little lower. Sample having the first counter-incident side dielectric layer 206 formed from a material that contains at least Si, In and O with a concentration of $SiO_2$ not lower than 5 mol % and a concentration of Si not lower than 1 atomic % showed recording sensitivity, overwrite cycle-ability and signal intensity all at satisfactory levels. These results showed that the medium 32 having high performance can be obtained when the first counter-incident side dielectric layer 206 contains 5 mol % or more $SiO_2$ and 1 atomic % or more Si.

Example 7

In Example 7, the information recording medium 15 shown in FIG. 1 was made, and the relations between 1) and 2); 1) the materials of the incident side interface layer 103 and of the counter-incident side interface layer 105, and 2) archival characteristic and overwrite cycle-ability, were investigated. Specifically, samples of the information recording medium 15 including the information layers 16 having the incident side interface layer 103 and the counter-incident side interface layer 105 of different combinations of materials, were made, and archival characteristic and overwrite cycle-ability of the information layer 16 were determined.

Samples were made as follows. First, the substrate 14 made of polycarbonate (120 mm in diameter, 1.1 mm in thickness) was prepared with a guide groove (20 nm in depth, 0.32 µm in track pitch) formed thereon for guiding the laser beam 11. An Ag—Pd—Cu layer (80 nm in thickness) as the reflective layer 108, a $(SiO_2)_{25}(In_2O_3)_{50}(ZrO_2)_{25}$ layer (20 nm in thickness) as the counter-incident side dielectric layer 106, the counter-incident side interface layer 105 (5 nm in thickness), a $Ge_{45}In_1Bi_3Te_{51}$ layer (10 nm in thickness) as the recording layer 104, the incident side interface layer 103 (5 nm in thickness) and a $(ZnS)_{80}(SiO_2)_{20}$ layer (60 nm in thickness) as the incident side dielectric layer 102 were formed successively by sputtering on the polycarbonate substrate.

The reflective layer 108 was formed by supplying electrical power of 200 W from a DC power supply in an Ar gas atmosphere having a pressure of 0.4 Pa. The counter-incident side dielectric layer 106 was formed by supplying electrical power of 400 W from an RF power supply in an Ar gas atmosphere having a pressure of 0.15 Pa. The counter-incident side interface layer 105 was formed by supplying electrical power of 400 W from an RF power supply in an Ar gas atmosphere having a pressure of 0.15 Pa. The recording layer 104 was formed by supplying electrical power of 100 W from a DC power supply in an Ar gas atmosphere having a pressure of 0.15 Pa. The incident side interface layer 103 was formed by supplying electrical power of 400 W from an RF power supply in an Ar gas atmosphere having a pressure of 0.15 Pa. The incident side dielectric layer 102 was formed by supplying electrical power of 400 W from an RF power supply in an atmosphere of mixed gas of Ar and $O_2$ (containing 3% by volume of $O_2$) having a pressure of 0.15 Pa.

Then the incident side dielectric layer 102 was coated with an ultraviolet curable resin (acrylic resin). The resin layer was made uniform by rotating the substrate 14. The resin was cured by irradiating it with ultraviolet ray. This resulted in the transparent layer 13 having a thickness of 100 µm formed from the resin. Then initialization process was carried out in which the recording layer 104 was crystallized by the laser beam. In this way, a plurality of samples having the incident side interface layers 103 and the counter-incident side interface layers 105 formed from different combinations of materials were made.

Archival characteristic and overwrite cycle-ability of the information layer 16 were determined for each sample by using the recording/reproduction apparatus 38 shown in FIG. 7. The determinations were made by using the laser beam 11 having a wavelength of 405 nm, and the objective lens 34 having a numerical aperture NA of 0.85. The sample was rotated at linear velocities of 4.9 m/second during the determination and a minimum mark length (2T) was 0.149 µm. Information was recorded in the groove.

The materials forming the incident side interface layer 103 and the counter-incident side interface layer 105 of the information layer 16, archival characteristic and overwrite cycle-ability of the information layer 16 of the information recording medium 15 are shown in Table 7. Archival characteristic was evaluated by the change in jitter before and after exposure to an environment of a temperature 80° C. and a relative humidity 85% for 100 hours. Sample with change in jitter less than 1% is indicated with A, sample with change not less than 1% and less than 2% is indicated with B, and sample with change not less than 2% is indicated with C. For the overwrite cycle-ability, number of repetitive overwriting cycles 1,000 or more is indicated with A, number of cycles not less than 500 and less than 1,000 is indicated with B, and number of cycles less than 500 is indicated with C.

TABLE 7

| Sam. No. | Material for Incident Side Interface Layer 103 (mol %) | Material for Counter-incident Side Interface Layer 105 (mol %) | Archival Characteristic | Overwrite Cycle-Ability |
|---|---|---|---|---|
| 4-1 | $(Cr_2O_3)_{50}(ZrO_2)_{50}$ | $(SiO_2)_{25}(Cr_2O_3)_{50}(ZrO_2)_{25}$ | B | A |
| 4-2 | $(Cr_2O_3)_{50}(ZrO_2)_{50}$ | $(SiO_2)_{25}(La_2O_3)_{50}(ZrO_2)_{25}$ | B | A |
| 4-3 | $(Cr_2O_3)_{50}(ZrO_2)_{50}$ | $(SiO_2)_{25}(CeO_2)_{50}(ZrO_2)_{25}$ | B | A |
| 4-4 | $(Cr_2O_3)_{50}(ZrO_2)_{50}$ | $(SiO_2)_{25}(Al_2O_3)_{50}(ZrO_2)_{25}$ | B | A |
| 4-5 | $(Cr_2O_3)_{50}(ZrO_2)_{50}$ | $(SiO_2)_{25}(Ga_2O_3)_{50}(ZrO_2)_{25}$ | B | A |

TABLE 7-continued

| Sam. No. | Material for Incident Side Interface Layer 103 (mol %) | Material for Counter-incident Side Interface Layer 105 (mol %) | Archival Characteristic | Overwrite Cycle-Ability |
|---|---|---|---|---|
| 4-6 | $(Cr_2O_3)_{50}(ZrO_2)_{50}$ | $(SiO_2)_{25}(MgO)_{50}(ZrO_2)_{25}$ | B | A |
| 4-7 | $(Cr_2O_3)_{50}(ZrO_2)_{50}$ | $(SiO_2)_{25}(Y_2O_3)_{50}(ZrO_2)_{25}$ | B | A |
| 4-8 | $(Cr_2O_3)_{50}(ZrO_2)_{50}$ | $(SiO_2)_{15}(In_2O_3)_{50}(ZrO_2)_{35}$ | A | A |
| 4-9 | $(SiO_2)_5(Cr_2O_3)_{50}(ZrO_2)_{45}$ | $(SiO_2)_5(In_2O_3)_{50}(ZrO_2)_{45}$ | A | A |
| 4-10 | $(SiO_2)_{15}(Cr_2O_3)_{50}(ZrO_2)_{35}$ | $(SiO_2)_{15}(In_2O_3)_{50}(ZrO_2)_{35}$ | A | A |
| 4-11 | $(SiO_2)_{25}(Cr_2O_3)_{50}(ZrO_2)_{25}$ | $(SiO_2)_{25}(In_2O_3)_{50}(ZrO_2)_{25}$ | A | A |
| 4-12 | $(SiO_2)_{20}(Cr_2O_3)_{60}(ZrO_2)_{20}$ | $(SiO_2)_{20}(In_2O_3)_{60}(ZrO_2)_{20}$ | A | A |
| 4-13 | $(SiO_2)_{15}(Cr_2O_3)_{70}(ZrO_2)_{15}$ | $(SiO_2)_{15}(In_2O_3)_{70}(ZrO_2)_{15}$ | A | A |
| 4-14 | $(SiO_2)_{10}(Cr_2O_3)_{80}(ZrO_2)_{10}$ | $(SiO_2)_{10}(In_2O_3)_{80}(ZrO_2)_{10}$ | A | A |
| 4-15 | $(SiO_2)_5(Cr_2O_3)_{90}(ZrO_2)_5$ | $(SiO_2)_5(In_2O_3)_{90}(ZrO_2)_5$ | A | A |
| 4-16 | $(SiO_2)_{25}(Cr_2O_3)_{50}[(ZrO_2)_{0.97}(Y_2O_3)_{0.03}]_{25}$ | $(SiO_2)_{25}(In_2O_3)_{50}[(ZrO_2)_{0.97}(Y_2O_3)_{0.03}]_{25}$ | A | A |
| 4-17 | $(SiO_2)_{25}(Cr_2O_3)_{50}[(ZrO_2)_{0.92}(Y_2O_3)_{0.08}]_{25}$ | $(SiO_2)_{25}(In_2O_3)_{50}[(ZrO_2)_{0.92}(Y_2O_3)_{0.08}]_{25}$ | A | A |
| 4-18 | $(SiO_2)_{15}(In_2O_3)_{50}(ZrO_2)_{35}$ | $(Cr_2O_3)_{50}(ZrO_2)_{50}$ | A | A |
| 4-19 | $(SiO_2)_{15}(In_2O_3)_{50}(ZrO_2)_{35}$ | $(SiO_2)_{15}(In_2O_3)_{50}(ZrO_2)_{35}$ | A | B |

The results described above showed that archival characteristic of the information layer 16 was a little low in samples 4-1 to 4-7 where both the incident side interface layer 103 and the counter-incident side interface layer 105 did not contain In. It was also found that overwrite cycle-ability of the information layer 16 was a little low in sample 4-19 where both the incident side interface layer 103 and the counter-incident side interface layer 105 contain In. It was found that both archival characteristic and overwrite cycle-ability of the information layer 16 were good in samples 4-8 to 4-18 where either one of the incident side interface layer 103 and the counter-incident side interface layer 105 contains In. These results showed that the information layer 16 having high archival characteristic could be obtained when either one of the incident side interface layer 103 and the counter-incident side interface layer 105 contains In.

Comparison of the samples 4-8 and 4-18 showed that sample 4-8 was excellent in overwrite cycle-ability particularly at 2×. This showed that a medium suitable for high-speed recording can be obtained by forming the incident side interface layer from a material containing $Cr_2O_3$ and $ZrO_2$ and using a Si—In—Zr/Hf—O-based material for the counter-incident side interface layer.

Samples 4-8 to 4-11 showed better overwrite cycle-ability than the sample 4-11. This is supposedly because Si content in the counter-incident side interface layer 105 of the samples 4-8 to 4-11 was less than that of the counter-incident side dielectric layer 106. Samples 4-12 to 4-15 also showed better overwrite cycle-ability than the sample 4-11. This is supposedly because Si content in these samples was less than that of the sample 4-11, and In content was higher than that of sample 4-11.

Example 8

In Example 8, the information recording medium 24 shown in FIG. 3 was made, and the relations between the combinations of the materials of the second incident side interface layer 303 and of the second counter-incident side interface layer, archival characteristic and overwrite cycle-ability of the second information layer 25 were investigated. Specifically, samples 5-1 to 5-19 of the information recording medium 24 including the second information layers 25 having different combinations of the materials for the second incident side interface layer 303 and the second counter-incident side interface layer were made, and archival characteristic and overwrite cycle-ability of the second information layer 25 were determined.

Samples were made as follows. First, the substrate 14 made of polycarbonate (120 mm in diameter, 1.1 mm in thickness) was prepared with a guide groove (20 nm in depth, 0.32 μm in track pitch) formed thereon for guiding the laser beam 11. An Ag—Pd—Cu layer (80 nm in thickness) as the second reflective layer 208, a $(SiO_2)_{25}(In_2O_3)_{50}(ZrO_2)_{25}$ layer (20 nm in thickness) as the second counter-incident side dielectric layer 306, the second counter-incident side interface layer (not shown) (5 nm in thickness), a $Ge_{45}In_1Bi_3Te_{51}$ layer (10 nm in thickness) as the second recording layer 304, the second incident side interface layer 303 (5 nm in thickness) and a $(ZnS)_{80}(SiO_2)_{20}$ layer (60 nm in thickness) as the second incident side dielectric layer 302 were formed successively by sputtering on the polycarbonate substrate.

The second reflective layer 308 was formed by supplying electrical power of 200 W from a DC power supply in an Ar gas atmosphere having a pressure of 0.4 Pa. The second counter-incident side dielectric layer 306 was formed by supplying electrical power of 400 W from an RF power supply in an Ar gas atmosphere having a pressure of 0.15 Pa. The second counter-incident side interface layer was formed by supplying electrical power of 400 W from an RF power supply in an Ar gas atmosphere having a pressure of 0.15 Pa. The second recording layer 304 was formed by supplying electrical power of 100 W from a DC power supply in an Ar gas atmosphere having a pressure of 0.15 Pa. The second incident side interface layer 303 was formed by supplying electrical power of 400 W from an RF power supply in an Ar gas atmosphere having a pressure of 0.15 Pa. The second incident side dielectric layer 302 was formed by supplying electrical power of 400 W from an RF power supply in an atmosphere of mixed gas of Ar and $O_2$ (containing 3% by volume of $O_2$) having a pressure of 0.15 Pa.

Then the second incident side dielectric layer 302 was coated with an ultraviolet curable resin (acrylic resin), over which a substrate having guide groove (20 nm in depth, 0.32 μm in track pitch) formed thereon was placed in contact therewith and was rotated so as to make the resin layer uniform. The resin was cured, and then the substrate was removed. This process resulted in the optical separation layer 17 having a thickness of 25 μm with the guide groove for guiding the laser beam 11 formed on the side of the first information layer 23.

A $TiO_2$ layer (20 nm in thickness) as the transmittance adjustment layer 209, an Ag—Pd—Cu layer (10 nm in thickness) as the first reflective layer 208, a $(SiO_2)_{25}(In_2O_3)_{50}(ZrO_2)_{25}$ layer (15 nm in thickness) as the first counter-incident side dielectric layer 206, a $Ge_{45}In_1Bi_3Te_{51}$ layer (6 nm in thickness) as the first recording layer 204, a $(SiO_2)_{25}(Cr_2$ $O_3)_{50}(ZrO_2)_{25}$ layer (5 nm in thickness) as the first incident side interface layer 203 and a $(ZnS)_{80}(SiO_2)_{20}$ layer (40 nm in thickness) as the first incident side dielectric layer 202 were formed successively by sputtering on the optical separation layer 17. The film-forming apparatus used, the sputtering target and the film-forming conditions (type of gas, pressure and electrical power supplied) were similar to those employed to form the first information layer 23 of Example 3.

Then the second incident side dielectric layer 202 was coated with an ultraviolet curable resin (acrylic resin). The resin layer was made uniform by rotating the substrate 14. The resin was cured by irradiating it with ultraviolet ray. This resulted in the transparent layer 13 having a thickness of 75 μm formed from the resin. Then initialization process was carried out in which the second recording layer 304 and the first recording layer 204 were crystallized by the laser beam. In this way, a plurality of samples having the second incident side interface layer 303 and the second counter-incident side interface layer formed from different combinations of materials were made.

Archival characteristic and overwrite cycle-ability of the second information layer 25 of the information recording medium 24 were determined for each sample by using the recording/reproduction apparatus 38 shown in FIG. 7. The determinations were made with the laser beam 11 having a wavelength of 405 nm, the objective lens 34 having a numerical aperture NA of 0.85. The sample was rotated at a linear velocity of 4.9 m/second during determination and a minimum mark length (2T) of 0.149 μm. Information was recorded in the groove.

The materials forming the second incident side interface layer 303 and the second counter-incident side interface layer of the second information layer 25 of the second information medium 24, archival characteristic and overwrite cycle-ability of the second information layer 25 of the information recording medium 24 are shown in Table 8. Archival characteristic was evaluated by the change in jitter before and after exposure to an environment of a temperature 80° C. and a relative humidity 85% for 100 hours. Sample with change in jitter less than 1% is indicated with A, sample with change not less than 1% and less than 2% is indicated with B, and sample with change not less than 2% is indicated with C. For the overwrite cycle-ability, number of repetitive overwriting cycles not less than 1,000 is indicated with A, number of cycles not less than 500 and less than 1,000 is indicated with B, and number of cycles less than 500 is indicated with C.

TABLE 8

| Sam. No. | Material for Second Incident Side Interface Layer 303 (mol %) | Material for Second Counter-incident Side Interface Layer 105 (mol %) | Archival Characteristic | Overwrite Cycle-Ability |
|---|---|---|---|---|
| 5-1 | $(Cr_2O_3)_{50}(ZrO_2)_{50}$ | $(SiO_2)_{25}(Cr_2O_3)_{50}(ZrO_2)_{25}$ | B | A |
| 5-2 | $(Cr_2O_3)_{50}(ZrO_2)_{50}$ | $(SiO_2)_{25}(La_2O_3)_{50}(ZrO_2)_{25}$ | B | A |
| 5-3 | $(Cr_2O_3)_{50}(ZrO_2)_{50}$ | $(SiO_2)_{25}(CeO_2)_{50}(ZrO_2)_{25}$ | B | A |
| 5-4 | $(Cr_2O_3)_{50}(ZrO_2)_{50}$ | $(SiO_2)_{25}(Al_2O_3)_{50}(ZrO_2)_{25}$ | B | A |
| 5-5 | $(Cr_2O_3)_{50}(ZrO_2)_{50}$ | $(SiO_2)_{25}(Ga_2O_3)_{50}(ZrO_2)_{25}$ | B | A |
| 5-6 | $(Cr_2O_3)_{50}(ZrO_2)_{50}$ | $(SiO_2)_{25}(MgO)_{50}(ZrO_2)_{25}$ | B | A |
| 5-7 | $(Cr_2O_3)_{50}(ZrO_2)_{50}$ | $(SiO_2)_{25}(Y_2O_3)_{50}(ZrO_2)_{25}$ | B | A |
| 5-8 | $(Cr_2O_3)_{50}(ZrO_2)_{50}$ | $(SiO_2)_{15}(In_2O_3)_{50}(ZrO_2)_{35}$ | A | A |
| 5-9 | $(SiO_2)_5(Cr_2O_3)_{50}(ZrO_2)_{45}$ | $(SiO_2)_5(In_2O_3)_{50}(ZrO_2)_{45}$ | A | A |
| 5-10 | $(SiO_2)_{15}(Cr_2O_3)_{50}(ZrO_2)_{35}$ | $(SiO_2)_{15}(In_2O_3)_{50}(ZrO_2)_{35}$ | A | A |
| 5-11 | $(SiO_2)_{25}(Cr_2O_3)_{50}(ZrO_2)_{25}$ | $(SiO_2)_{25}(In_2O_3)_{50}(ZrO_2)_{25}$ | A | A |
| 5-12 | $(SiO_2)_{20}(Cr_2O_3)_{60}(ZrO_2)_{20}$ | $(SiO_2)_{20}(In_2O_3)_{60}(ZrO_2)_{20}$ | A | A |
| 5-13 | $(SiO_2)_{15}(Cr_2O_3)_{70}(ZrO_2)_{15}$ | $(SiO_2)_{15}(In_2O_3)_{70}(ZrO_2)_{15}$ | A | A |
| 5-14 | $(SiO_2)_{10}(Cr_2O_3)_{80}(ZrO_2)_{10}$ | $(SiO_2)_{10}(In_2O_3)_{80}(ZrO_2)_{10}$ | A | A |
| 5-15 | $(SiO_2)_5(Cr_2O_3)_{90}(ZrO_2)_5$ | $(SiO_2)_5(In_2O_3)_{90}(ZrO_2)_5$ | A | A |
| 5-16 | $(SiO_2)_{25}(Cr_2O_3)_{50}[(ZrO_2)_{0.97}(Y_2O_3)_{0.03}]_{25}$ | $(SiO_2)_{25}(In_2O_3)_{50}[(ZrO_2)_{0.97}(Y_2O_3)_{0.03}]_{25}$ | A | A |
| 5-17 | $(SiO_2)_{25}(Cr_2O_3)_{50}[(ZrO_2)_{0.92}(Y_2O_3)_{0.08}]_{25}$ | $(SiO_2)_{25}(In_2O_3)_{50}[(ZrO_2)_{0.92}(Y_2O_3)_{0.08}]_{25}$ | A | A |
| 5-18 | $(SiO_2)_{15}(In_2O_3)_{50}(ZrO_2)_{35}$ | $(Cr_2O_3)_{50}(ZrO_2)_{50}$ | A | A |
| 5-19 | $(SiO_2)_{15}(In_2O_3)_{50}(ZrO_2)_{35}$ | $(SiO_2)_{15}(In_2O_3)_{50}(ZrO_2)_{35}$ | A | B |

The results described above showed that archival characteristic of the second information layer 25 was a little low in samples 5-1 to 5-7 wherein both the second incident side interface layer 303 and the second counter-incident side interface layer did not contain In. It was also found that overwrite cycle-ability of the second information layer 25 was a little low in sample 5-19 wherein both the second incident side interface layer 303 and the second counter-incident side interface layer contain In. It was found that both archival characteristic and overwrite cycle-ability of the second information layer 25 were good in samples 5-8 to 5-18 where either one of the second incident side interface layer 303 and the second counter-incident side interface layer contains In. These results showed that the second information layer 25 having favorable archival characteristic can be obtained when either one of the second incident side interface layer 303 and the second counter-incident side interface layer contains In.

Comparison of the samples 5-8 and 5-18 showed that sample 5-8 was excellent in overwrite cycle-ability particularly at 2×. This showed that a medium suitable for high-speed recording can be obtained by forming the second incident side interface layer from a material containing $Cr_2O_3$ and $ZrO_2$ and using a Si—In—Zr/Hf—O-based material for the second counter-incident side interface layer.

Samples 5-8 to 5-10 showed better overwrite cycle-ability than the sample 5-11. This is supposedly because Si content in the counter-incident side interface layer 105 of the samples 5-8 to 5-10 was less than that of the counter-incident side dielectric layer 106. Samples 5-12 to 5-15 also showed better overwrite cycle-ability than the sample 5-11. This is supposedly because Si contents in these samples were less than that of the sample 5-11, and In content was higher than that of sample 5-11.

Example 9

In Example 9, the information recording medium 24 shown in FIG. 3 was made, and the relations between 1) and 2); 1) the combinations of the materials of the first incident side interface layer 203 and of the first counter-incident side interface layer, and 2) archival characteristic and overwrite cycle-ability of the first information layer 23 were investigated. Specifically, samples 6-1 to 6-19 of the information recording medium 24 including the first information layers 23 having different combinations of the materials for the first incident side interface layer 203 and the first counter-incident side interface layer were made, and archival characteristic and overwrite cycle-ability of the first information layer 23 were determined.

Samples were made as follows. First, the substrate 14 made of polycarbonate (120 mm in diameter, 1.1 mm in thickness) was prepared with a guide groove (20 nm in depth, 0.32 µm in track pitch) formed thereon for guiding the laser beam 11. An Ag—Pd—Cu layer (80 nm in thickness) as the second reflective layer 308, a $(SiO_2)_{25}(In_2O_3)_{50}(ZrO_2)_{25}$ layer (15 nm in thickness) as the second counter-incident side dielectric layer 306, a $(SiO_2)_{15}(In_2O_3)_{35}(ZrO_2)_{50}$ layer (10 nm in thickness) as the second counter-incident side interface layer (not shown), a $Ge_{45}In_1Bi_3Te_{51}$ layer (10 nm in thickness) as the second recording layer 304, a $(Cr_2O_3)_{50}(ZrO_2)$, 50 layer (5 nm in thickness) as the second incident side interface layer 303 and a $(ZnS)_{80}(SiO_2)_{20}$ layer (60 nm in thickness) as the second incident side dielectric layer 302 were formed successively by sputtering on the polycarbonate substrate. The film-forming apparatus used, the sputtering target and the film-forming conditions (type of gas, pressure and electrical power supplied) were similar to those employed to form the second information layer 25 in Example 3.

Then the second incident side dielectric layer 302 was coated with an ultraviolet curable resin (acrylic resin), over which a substrate having a guide groove (20 nm in depth, 0.32 µm in track pitch) formed thereon was placed in contact therewith and was rotated so as to make the resin layer uniform. The resin was cured, and then the substrate was removed. This process resulted in the optical separation layer 17 having a thickness of 25 µm with the guide groove for guiding the laser beam 11 formed on the side of the first information layer 23.

A $TiO_2$ layer (20 nm in thickness) as the transmittance adjustment layer 209, an Ag—Pd—Cu layer (10 nm in thickness) as the first reflective layer 208, a $(SiO_2)_{25}(In_2O_3)_{50}(ZrO_2)_{25}$ layer (10 nm in thickness) as the first counter-incident side dielectric layer 206, the second counter-incident side interface layer (not shown) (5 nm in thickness), a $Ge_{45}In_1Bi_3Te_{51}$ layer (6 nm in thickness) as the first recording layer 204, the second incident side interface layer 203 (5 nm in thickness), and a $(ZnS)_{80}(SiO_2)_2O$ layer (40 nm in thickness) as the second incident side dielectric layer 202 were formed successively by sputtering on the optical adjustment layer 17. The film-forming apparatus used, the sputtering target and the film-forming conditions (type of gas, pressure and electrical power supplied) were similar to those employed to form the first information layer 23 in Example 3.

Then the first incident side dielectric layer 202 was coated with an ultraviolet curable resin (acrylic resin). The resin layer was made uniform by rotating the substrate 14. The resin was cured by irradiating it with ultraviolet ray. This resulted in the transparent layer 13 having a thickness of 75 µm formed from the resin. Then initialization process was carried out in which the second recording layer 304 and the first recording layer 204 were crystallized by the laser beam. In this way, a plurality of samples having the first incident side interface layer 203 and the first counter-incident side interface layer formed from different combinations of materials were made.

Archival characteristic and overwrite cycle-ability of the first information layer 23 of the information recording medium 24 were determined for each sample by using the recording/reproduction apparatus 38 shown in FIG. 7. The determinations were made by using the laser beam 11 having a wavelength of 405 nm and the objective lens 34 having a numerical aperture NA of 0.85. The sample was rotated at a linear velocitiy of 4.9 m/second during determination and a minimum mark length (2T) was 0.149 µm. Information was recorded on the groove.

The materials forming the first incident side interface layer 203 and the first counter-incident side interface layer of the first information layer 23, archival characteristic and overwrite cycle-ability of the first information layer 23 of the information recording medium 24 are shown in Table 9. Archival characteristic was evaluated by the change in jitter before and after exposure to an environment of a temperature 80° C. and a relative humidity 85% for 100 hours. Sample with change in jitter less than 1% is indicated with A, sample with change not less than 1% and less than 2% is indicated with B, and sample with change not less than 2% is indicated with C. For the overwrite cycle-ability, number of repetitive overwriting cycles not less than 1,000 is indicated with A, number of cycles not less than 500 and less than 1,000 is indicated with B, and number of cycles less than 500 is indicated with C.

TABLE 9

| Sam. No. | Material for First Incident Side Interface Layer 203 (mol %) | Material for First Counter-incident Side Interface Layer (mol %) | Archival Characteristic | Overwrite Cycle-Ability |
|---|---|---|---|---|
| 6-1 | $(Cr_2O_3)_{50}(ZrO_2)_{50}$ | $(SiO_2)_{25}(Cr_2O_3)_{50}(ZrO_2)_{25}$ | B | A |
| 6-2 | $(Cr_2O_3)_{50}(ZrO_2)_{50}$ | $(SiO_2)_{25}(La_2O_3)_{50}(ZrO_2)_{25}$ | B | A |
| 6-3 | $(Cr_2O_3)_{50}(ZrO_2)_{50}$ | $(SiO_2)_{25}(CeO_2)_{50}(ZrO_2)_{25}$ | B | A |
| 6-4 | $(Cr_2O_3)_{50}(ZrO_2)_{50}$ | $(SiO_2)_{25}(Al_2O_3)_{50}(ZrO_2)_{25}$ | B | A |
| 6-5 | $(Cr_2O_3)_{50}(ZrO_2)_{50}$ | $(SiO_2)_{25}(Ga_2O_3)_{50}(ZrO_2)_{25}$ | B | A |
| 6-6 | $(Cr_2O_3)_{50}(ZrO_2)_{50}$ | $(SiO_2)_{25}(MgO)_{50}(ZrO_2)_{25}$ | B | A |
| 6-7 | $(Cr_2O_3)_{50}(ZrO_2)_{50}$ | $(SiO_2)_{25}(Y_2O_3)_{50}(ZrO_2)_{25}$ | B | A |
| 6-8 | $(Cr_2O_3)_{50}(ZrO_2)_{50}$ | $(SiO_2)_{15}(In_2O_3)_{50}(ZrO_2)_{35}$ | A | A |
| 6-9 | $(SiO_2)_5(Cr_2O_3)_{50}(ZrO_2)_{45}$ | $(SiO_2)_5(In_2O_3)_{50}(ZrO_2)_{45}$ | A | A |
| 6-10 | $(SiO_2)_{15}(Cr_2O_3)_{50}(ZrO_2)_{35}$ | $(SiO_2)_{15}(In_2O_3)_{50}(ZrO_2)_{35}$ | A | A |
| 6-11 | $(SiO_2)_{25}(Cr_2O_3)_{50}(ZrO_2)_{25}$ | $(SiO_2)_{25}(In_2O_3)_{50}(ZrO_2)_{25}$ | A | A |
| 6-12 | $(SiO_2)_{20}(Cr_2O_3)_{60}(ZrO_2)_{20}$ | $(SiO_2)_{20}(In_2O_3)_{60}(ZrO_2)_{20}$ | A | A |
| 6-13 | $(SiO_2)_{15}(Cr_2O_3)_{70}(ZrO_2)_{15}$ | $(SiO_2)_{15}(In_2O_3)_{70}(ZrO_2)_{15}$ | A | A |
| 6-14 | $(SiO_2)_{10}(Cr_2O_3)_{80}(ZrO_2)_{10}$ | $(SiO_2)_{10}(In_2O_3)_{80}(ZrO_2)_{10}$ | A | A |
| 6-15 | $(SiO_2)_5(Cr_2O_3)_{90}(ZrO_2)_5$ | $(SiO_2)_5(In_2O_3)_{90}(ZrO_2)_5$ | A | A |
| 6-16 | $(SiO_2)_{25}(Cr_2O_3)_{50}[(ZrO_2)_{0.97}(Y_2O_3)_{0.03}]_{25}$ | $(SiO_2)_{25}(In_2O_3)_{50}[(ZrO_2)_{0.97}(Y_2O_3)_{0.03}]_{25}$ | A | A |
| 6-17 | $(SiO_2)_{25}(Cr_2O_3)_{50}[(ZrO_2)_{0.92}(Y_2O_3)_{0.08}]_{25}$ | $(SiO_2)_{25}(In_2O_3)_{50}[(ZrO_2)_{0.92}(Y_2O_3)_{0.08}]_{25}$ | A | A |
| 6-18 | $(SiO_2)_{15}(In_2O_3)_{50}(ZrO_2)_{35}$ | $(Cr_2O_3)_{50}(ZrO_2)_{50}$ | A | A |
| 6-19 | $(SiO_2)_{15}(In_2O_3)_{50}(ZrO_2)_{35}$ | $(SiO_2)_{15}(In_2O_3)_{50}(ZrO_2)_{35}$ | A | B |

The results described above showed that archival characteristic of the first information layer 23 was a little low in samples 6-1 to 6-7 wherein both the first incident side interface layer 203 and the first counter-incident side interface layer did not contain In. It was also found that overwrite cycle-ability of the first information layer 23 was a little low in sample 6-19 wherein both the first incident side interface layer 203 and the first counter-incident side interface layer contain In. It was found that both the archival characteristic and the overwrite cycle-ability of the first information layer 23 were good in samples 6-8 to 6-18 wherein either one of the first incident side interface layer 203 and the first counter-incident side interface layer contains In. These results showed that the first information layer 23 having favorable archival characteristic can be obtained when either the first incident side interface layer 203 or the first counter-incident side interface layer contains In.

Comparison of the samples 6-8 and 6-18 showed that sample 6-8 was excellent in overwrite cycle-ability particularly at 2×. This showed that a medium suitable for high-speed recording can be obtained by using a layer containing $Cr_2O_3$ and $ZrO_2$ as the first incident side interface layer and using a Si—In—Zr/Hf—O-based material for the first counter-incident side interface layer.

Samples 6-8 to 6-10 showed better overwrite cycle-ability than the sample 6-11. This is supposedly because Si contents in the counter-incident side interface layer 105 of the samples 6-8 to 6-10 were less than that of the counter-incident side dielectric layer 106. Samples 6-12 to 6-15 also showed better overwrite cycle-ability than the sample 6-11 did. This is supposedly because Si contents in these samples were less than that of the sample 6-11, and In contents were higher than that of sample 6-11.

Example 10

The recording layer 104, the first recording layer 204 or the second recording layer 304 of Example 1 to Example 9 was formed from a material represented by one of (Ge—Sn)Te, GeTe—$Sb_2Te_3$, (Ge—Sn)Te—$Sb_2Te_3$, GeTe—$Bi_2Te_3$, (Ge—Sn)Te—$Bi_2Te_3$, GeTe—(Sb—Bi)$_2Te_3$, (Ge—Sn)Te—(Sb—Bi)$_2Te_3$, GeTe —(Bi—In)$_2Te_3$ and (Ge—Sn)Te—(Bi—In)$_2Te_3$, and similar results were obtained. When the recording layer was particularly formed from a material represented by GeTe—(Sb—In)$_2Te_3$ or (Ge—Sn)Te—(Bi—In)$_2Te_3$, good archival characteristic at a low transfer rate was obtained as In component contained in the recording layer stabilized the amorphous phase.

Example 11

The dielectric layer or the interface layer formed from Si—In—Zr/Hf—O-based material in Example 1 to Example 10 was formed from material prepared by adding, to Si, In, and Zr (and/or Hf), up to 20 mol % of one or more component selected from among oxide of at least one component selected from among carbon (C), Sc, La, Gd, Dy, Yb, Al, Mg, Zn, Ta, Ti, Ca, Ce, Sn, Te, Nb and Bi, nitride of at least one element selected from among Si, Cr, Al and Ge and Si—C. Similar effects were obtained with any of the media.

Example 12

In Example 12, the electrical information recording medium 44 shown in FIG. 8 was fabricated and phase transition thereof was investigated when electric current was supplied.

Si substrate subjected to nitrization treatment on the surface was prepared as the substrate 39, and a layer measuring 6 μm by 6 μm and 0.1 μm in thickness was formed from Pt as the lower electrode 40 on the surface. A layer measuring 4.5 μm by 5 μm and 0.01 μm in thickness was of $(SiO_2)_{25}(In_2O_3)_{50}(ZrO_2)_{25}$ as the first dielectric layer 401. A layer measuring 5 μm by 5 μm and 0.1 μm in thickness was formed from $Ge_{45}Bi_4Te_{51}$ as the first recording layer 41 on the layer 401. A layer measuring 5 μm by 5 μm and 0.1 μm in thickness was formed from $Sb_{70}Te_{25}Ge_5$ as the second recording layer 42 on the layer 41. A layer measuring 4.5 μm by 5 μm and 0.01 μm in thickness was formed from $(SiO_2)_{25}(In_2O_3)_{50}(ZrO_2)_{25}$ as the second dielectric layer 402 on the layer 42. A layer measuring 5 μm by 5 μm and 0.1 μm in thickness was formed from Pt as the upper electrode 43 on the layer 402. All of these layers were formed by sputtering.

The first dielectric layer 401 and the second dielectric layer 402 are insulators. Accordingly, the first dielectric layer 401 and the second dielectric layer 402 were formed with surface areas smaller than those of the first recording layer 41 and the second recording layer 42 in order to supply electrical current to the first recording layer 41 and the second recording layer 42, with the lower electrode 40 making contact with the first recording layer 41 and the upper electrode 43 making contact with the second recording layer 42.

Then lead wires made of Au were connected to the lower electrode 40 and the upper electrode 43 by wire bonding, and the electrical information recording medium 44 was connected with application parts 45 to the electrical information recording/reproduction apparatus 50. The pulsed power supply 48 of the apparatus 50 was connected with the switch 47 between the lower electrode 40 and the upper electrode 43. The resistance detector 46 was connected with the switch 49 between the lower electrode 40 and the upper electrode 43 so as to detect the change in the resistance due to phase transition in the first recording layer 41 and the second recording layer 42.

The first recording layer 41 has a melting point $T_{m1}$ of 630° C., a crystallization temperature $T_{x1}$ of 170° C., and a crystallization time $t_{x1}$ of 100 ns. The second recording layer 42 has a melting point $T_{m2}$ of 550° C., a crystallization temperature $T_{x2}$ of 200° C., and a crystallization time $t_{x2}$ of 50 ns. The first recording layer 41 has a resistance $r_{a1}$ of 500Ω in the state of amorphous phase, and resistance $r_{c1}$ of 10Ω in the state of crystal phase. The second recording layer 42 has a resistance $r_{a2}$ of 800Ω in the state of amorphous phase, and a resistance $r_{c2}$ of 20Ω in the state of crystal phase.

Figure 11:
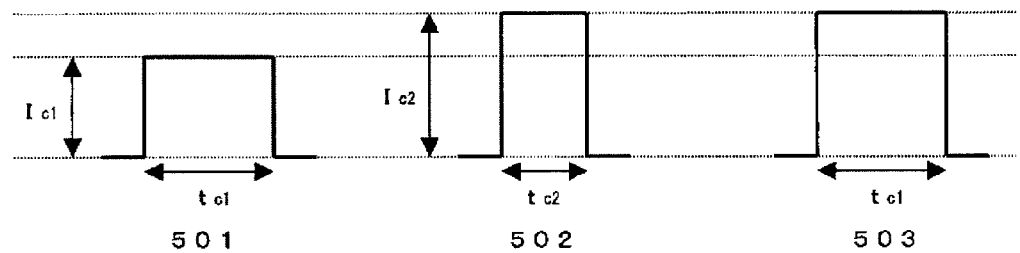
FIG. 11 shows an example of recording and erasing pulse waveforms applied to the electrical information recording medium of the present invention.
Figure 11:
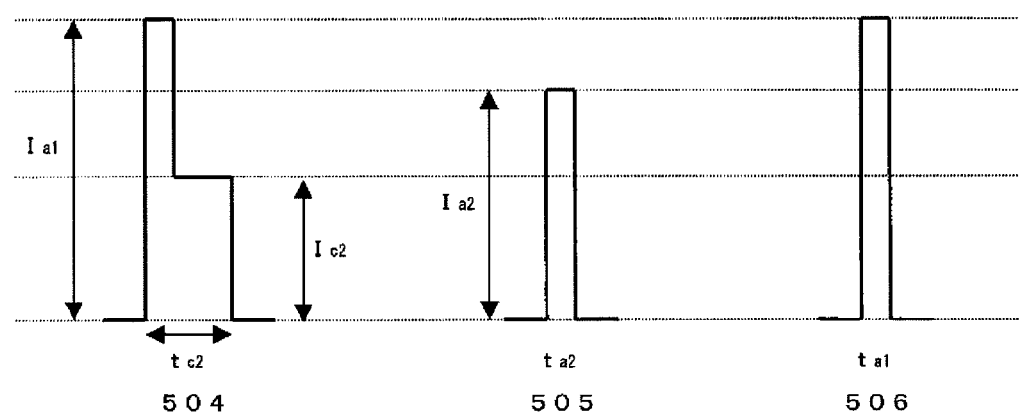
Figure 11:
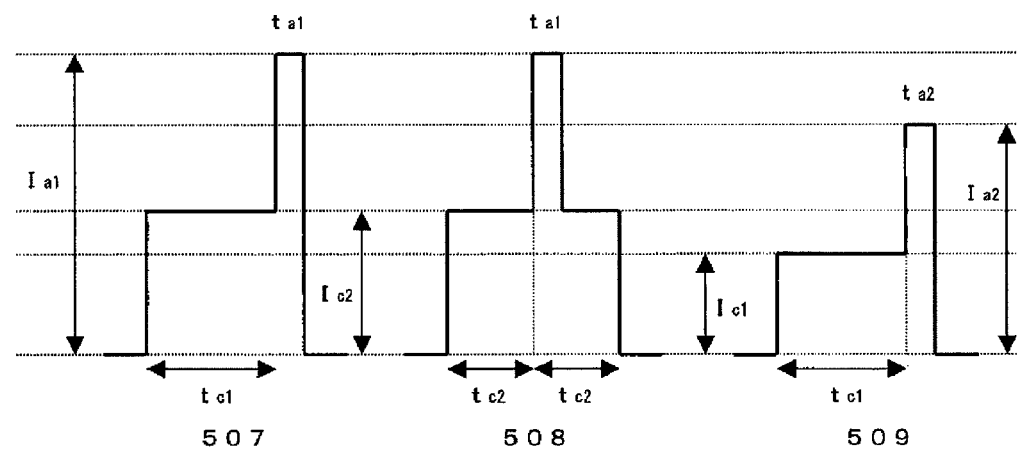
Figure 12:
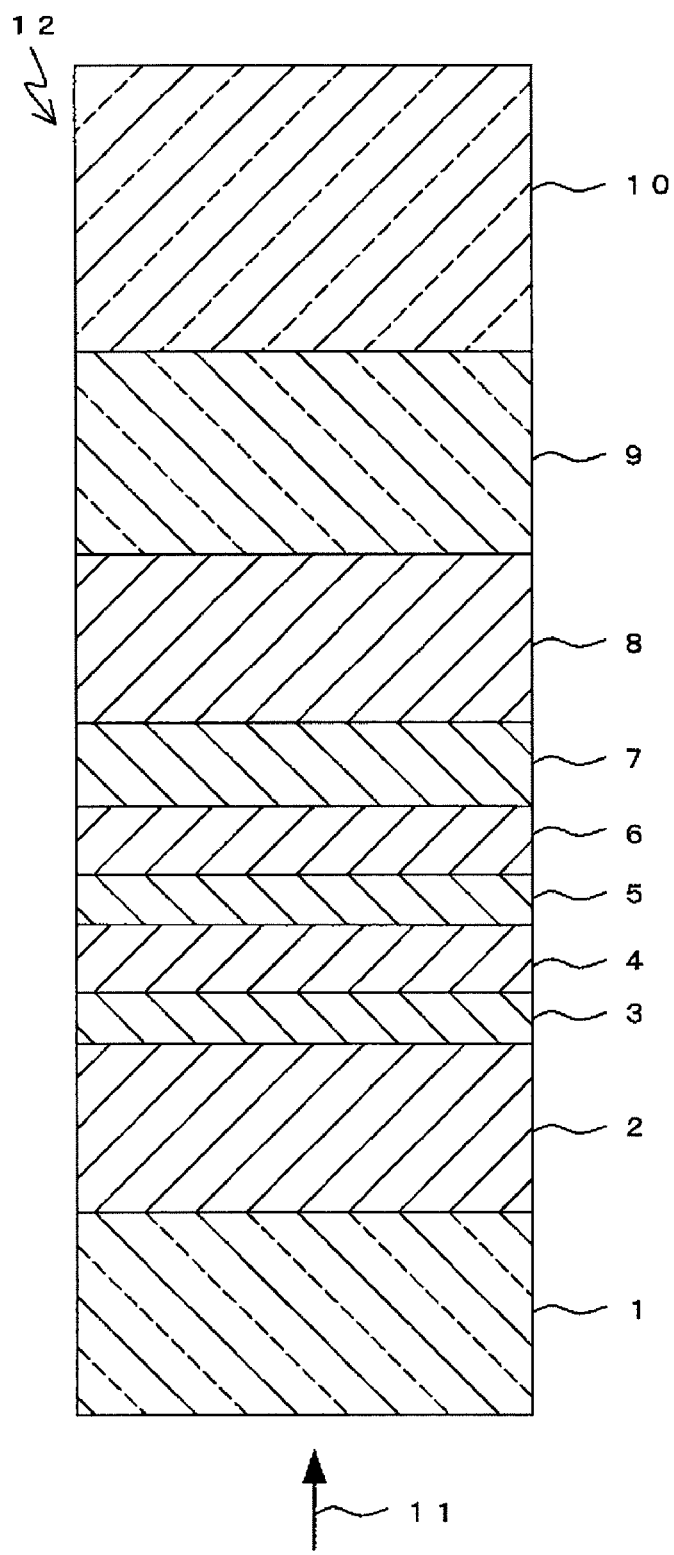
FIG. 12 is a partial sectional view showing an example of layer constitution of 4.7 GB/DVD-RAM.

In state 1 wherein both the first recording layer 41 and the second recording layer 42 were in amorphous phase, current pulses of $I_{c1}$=5 mA and $t_{c1}$=150 ns having recording waveform 501 shown in FIG. 11 were supplied between the lower electrode 40 and the upper electrode 43. This results in phase transition from amorphous phase to crystal phase only in the first recording layer 41 (this state will hereafter be referred to as state 2). In state 1, current pulses of $I_{c2}$=10 mA and $t_{c2}$=100 ns having recording waveform 502 shown in FIG. 11 were supplied between the lower electrode 40 and the upper electrode 43. This results in phase transition from amorphous phase to crystal phase only in the second recording layer 42 (this state will hereafter be referred to as state 3). In state 1, current pulses of $I_{c2}$=10 mA and $t_{c1}$=150 ns having recording waveform 503 shown in FIG. 11 were supplied between the lower electrode 40 and the upper electrode 43. This results in phase transition from amorphous phase to crystal phase in both the first recording layer 41 and the second recording layer 42 (this state will be referred to as state 4).

Then in state 4 wherein both the first recording layer 41 and the second recording layer 42 were in crystal phase of lower resistance, current pulses of $I_{a1}=20$ mA, $I_{c2}=10$ mA and $t_{c2}=100$ ns having recording waveform 504 shown in FIG. 11 were supplied between the lower electrode 40 and the upper electrode 43. This results in phase transition from crystal phase to amorphous phase only in the first recording layer 41 (state 3). In state 4, current pulses of $I_{a2}=15$ mA and $t_{a2}=50$ ns having recording waveform 505 shown in FIG. 11 were supplied between the lower electrode 40 and the upper electrode 43. This results in phase transition from crystal phase to amorphous phase only in the second recording layer 42 (state 2). In state 4, current pulses of $I_{a1}=20$ mA and $t_{a1}=50$ ns having erasing waveform 506 shown in FIG. 11 were supplied between the lower electrode 40 and the upper electrode 43. This results in phase transition from crystal phase to amorphous phase in both the first recording layer 41 and the second recording layer 42 (state 1).

In state 2 or 3, current pulses of $I_{c2}=10$ mA and $t_{c1}=150$ ns having recording waveform 503 shown in FIG. 11 were supplied. This resulted in phase transition from amorphous phase to crystal phase in both the first recording layer 41 and the second recording layer 42 (state 4). In state 2 or 3, current pulses of $I_{a1}=20$ mA, $I_{c2}=10$ mA and $t_{C1}=150$ ns, $t_{a1}=50$ ns having erasing waveform 507 shown in FIG. 11 were supplied. This resulted in phase transition from crystal phase to amorphous phase in both the first recording layer 41 and the second recording layer 42 (state 1). In state 2, current pulses of $I_{a1}=20$ mA, $I_{c2}=10$ mA and $t_{c2}=100$ ns, $t_{a1}=50$ ns having recording waveform 508 shown in FIG. 11 were supplied. This resulted in phase transition from crystal phase to amorphous phase in the first recording layer 41 and phase transition from amorphous phase to crystal phase in the second recording layer 42 (state 3). In state 3, current pulses of $I_{a2}=15$ mA, $I_{c1}=5$ mA and $t_{c1}=150$ ns, $t_{a2}=50$ ns having recording waveform 509 shown in FIG. 11 were supplied. This resulted in phase transition from amorphous phase to crystal phase in the first recording layer 41 and phase transition from crystal phase to amorphous phase in the second recording layer 42 (state 2).

From the results described above, it was found that reversible phase transition between crystal phase and amorphous phase can be caused electrically in the first recording layer 41 and the second recording layer 42 in the electrical phase transition type information recording medium 44 shown in FIG. 8. It was also found that four states can be established in the medium 44: state 1 wherein both the first recording layer 41 and the second recording layer 42 are in amorphous phase; state 2 wherein the first recording layer 41 is in crystal phase and the second recording layer 42 is in amorphous phase; state 3 wherein the first recording layer 41 is in amorphous phase and the second recording layer 42 is in crystal phase; and state 4 wherein both the first recording layer 41 and the second recording layer 42 are in crystal phase.

The number of overwrite cycles of the electrical phase transition type information recording medium 44 was also determined. The results showed that the number of repetitive overwrite cycles increased 10 times or more over a medium wherein the first dielectric layer 401 and the second dielectric layer 402 were not provided. This is because the first dielectric layer 401 and the second dielectric layer 402 suppress the material transfer from the lower electrode 40 and the upper electrode 43 into the first recording layer 41 and the second recording layer 42.

INDUSTRIAL APPLICABILITY

The information recording medium of the present invention has the capability to retain the recorded information over a long period of time (involatility) and is useful as an high-density optical disc of overwritable type (such as Blu-ray Disc Rewritable (BD-RE), DVD-RAM, DVD-RW, +RW, etc.), write-once type (such as Blu-ray Disc Recordable (BD-R), DVD-R, etc.) or read-only type (such as Blu-ray Disc Read-only (BD-ROM), DVD-ROM, etc.). The information recording medium can also be used in such applications as an electrically involatile memory.

The invention claimed is:

1. An information recording medium on and/or from which information can be recorded and/or reproduced by applying light or applying electrical energy, and which media comprises:

at least one recording layer, at least one interface layer of a Si—In—Zr/Hf—O-based material comprising Si, In, M1 (M1 representing at least one element selected from among Zr and Hf) and oxygen (O), wherein the layer of Si—In—Zr/Hf—O-based material comprises 1 atomic % or more Si, at least one dielectric layer of a Si—In—Zr/Hf—O-based material comprising Si, In, M1 (M1 representing at least one element selected from among Zr and Hf) and oxygen (O), wherein the layer of Si—In—Zr/Hf—O-based material comprises 1 atomic % or more Si, and at least one reflective layer, wherein a layer of Si—In—Zr/Hf—O-based material as an interface layer, another layer of Si—In—Zr/Hf—O-based material as a dielectric layer and a reflective layer are stacked in this order on one surface of a recording layer, and a proportion of In occupying the Si—In—Zr/Hf—O-based material as an interface layer is larger than a proportion of In occupying the Si—In—Zr/Hf—O-based material as a dielectric layer, and/or a proportion of Si occupying the Si—In—Zr/Hf—O-based material as an interface layer is smaller than a proportion of Si occupying the Si—In—Zr/Hf—O-based material as a dielectric layer.

2. The information recording medium according to claim 1, wherein either one or both of the interface layer and the dielectric layer comprises a Si—In—Zr/Hf—O-based material represented by a formula (1):

$$Si_{a1}In_{b1}M1_{c1}O_{100-a1-b1-c1} \text{ (atomic \%)} \quad (1)$$

wherein M1 represents at least one element selected from among Zr and Hf, while a1, b1 and c1 satisfy relationships: $1 \leq a1 < 32$, $3 < b1 < 38$, $1 < c1 < 30$, and $25 < a1+b1+c1 < 40$.

3. The information recording medium according to claim 1, wherein either one or both of the interface layer and the dielectric layer comprises a Si—In—Zr/Hf—O-based material represented by a formula (2):

$$(SiO_2)_{x1}(In_2O_3)_{y1}(M1\,O_2)_{100-x1-y1} \text{ (mol \%)} \quad (2)$$

wherein M1 represents at least one element selected from among Zr and Hf, while x1 and y1 satisfy relationships: $5 \leq x1 \leq 90$, $5 \leq y1 \leq 90$ and $10 \leq x1+y1 \leq 95$.

4. The information recording medium according to claim 1, wherein either one or both of the interface layer and the dielectric layer further comprises M2 in which M2 represents at least one element selected from among Y, Cr and Ga.

5. The information recording medium according to claim 4, wherein either one or both of the interface layer and the dielectric layer comprises a Si—In—Zr/Hf—O-based material represented by the formula (3):

$$Si_{d1}In_{e1}M1_{f1}M2_{g1}O_{100-d1-e1-f1-g1} \text{ (atomic \%)} \quad (3)$$

wherein M1 represents at least one element selected from among Zr and Hf, M2 represents at least one element selected from among Y, Cr and Ga, while d1, e1, f1, and g1 satisfy relationships: $1 \leq d1 < 31$, $2 < e1 < 38$, $1 < f1 < 29$, $0 < g1 < 36$, and $25 < d1+e1+f1+g1 < 40$.

6. The information recording medium according to claim 4, wherein either one or both of the interface layer and the dielectric layer comprises a Si—In—Zr/Hf—O-based material represented by a formula (4):

$$(SiO_2)_{z1}(In_2O_3)_{w1}(M1O_2)_{v1}(M2_2O_3)_{100-z1-w1-v1} \text{ (mol \%)} \quad (4)$$

wherein M1 represents at least one element selected from among Zr and Hf, M2 represents at least one element selected from among Y, Cr and Ga, while z1, w1 and v1 satisfy the relationships: $5 \leq z1 < 90$, $5 \leq w1 < 90$, $5 \leq v1 < 90$, and $15 \leq z1+w1+v1 < 100$.

7. The information recording medium according to claim 4, wherein either one or both of the interface layer and the dielectric layer comprises a Si—In—Zr/Hf—O-based material comprising Y as M2, which is represented by a formula (5):

$$(SiO_2)_{u1}(In_2O_3)_{t1}[(ZrO_2)_{0.97}(Y_2O_3)_{0.03}]_{100-u1-t1} \text{ (mol \%)} \quad (5)$$

wherein u1 and t1 satisfy relationships: $5 \leq u1 \leq 90$, $5 \leq t1 \leq 90$, and $10 \leq u1+t1 \leq 95$.

8. The information recording medium according to claim 4, wherein either one or both of the interface layer and the dielectric layer comprises a Si—In—Zr/Hf—O-based material comprising Y as M2, which is represented by a formula (6):

$$(SiO_2)_{s1}(In_2O_3)_{r1}[ZrO_2)_{0.92}(Y_2O_3)_{0.08}]_{100-s1-r1} \text{ (mol \%)} \quad (6)$$

wherein s1 and r1 satisfy relationships: $5 \leq s1 \leq 90$, $5 \leq r1 \leq 90$, and $10 \leq s1+r1 \leq 95$.

9. The information recording medium according to claim 1, wherein either one or both of the interface layer and the dielectric layer further comprises at least one component selected from among:
carbon (C);
oxide of at least one element selected from among Sc, La, Gd, Dy, Yb, Al, Mg, Zn, Ta, Ti, Ca, Ce, Sn, Te, Nb and Bi;
nitride of at least one element selected from among Si, Cr, Al and Ge; and
Si—C.

10. The information recording medium according to claim 1, wherein the recording layer can undergo phase transition.

11. The information recording medium according to claim 10 wherein the recording layer comprises Ge and Te and at least one element selected from among Sb, Bi, In and Sn.

12. The information recording medium according to claim 11, wherein the recording layer comprises a material represented by any of (Ge-Sn)Te, GeTe —Sb$_2$Te$_3$, (Ge—Sn)Te—Sb$_2$Te$_3$, GeTe—Bi$_2$Te$_3$, (Ge—Sn)Te—Bi$_2$Te$_3$, GeTe—(Sb—Bi)$_2$Te$_3$, (Ge—Sn)Te—(Sb —Bi)$_2$Te$_3$, GeTe—(Sb—In)$_2$Te$_3$ and (Ge—Sn)Te—(Bi—In)$_2$Te$_3$.

13. The information recording medium according to claim 4, wherein either one or both of the interface layer and the dielectric layer comprises Cr as M2.

14. The information recording medium according to claim 13, wherein either one or both of the interface layer and the dielectric layer further comprises Y.

15. The information recording medium according to claim 1 which further comprises a layer comprising Cr, M1 and O which is disposed in contact with a surface of the recording layer which surface is opposite to the one surface.

16. The information recording medium according to claim 1, wherein the reflective layer comprises Ag as a main component.

17. The information recording medium according to claim 1, which comprises two or more recording layers.

18. A method for producing the information recording medium according to claim 1, which method comprises at least a step of forming the layer of the Si—In—Zr/Hf—O-based material by sputtering method wherein a sputtering target comprising Si, In, M1 and O with concentration of Si not less than 0.5 atomic % is used.

19. The method according to claim 18, wherein the sputtering target comprises a Si—In—Zr/Hf—O-based material represented by a formula (11):

$$Si_{a2}In_{b2}M1_{c2}O_{100-a2-b2-c2} \text{ (atomic \%)} \quad (11)$$

wherein M1 represents at least one element selected from among Zr and Hf, while a2, b2 and c2 satisfy relationships: $0.5 \leq a2 < 35$, $0 < b2 < 43$, $0 < c2 < 35$, and $20 < a2+b2+c2 < 45$.

20. The method according to claim 18, wherein the sputtering target comprises a Si—In—Zr/Hf—O-based material represented by a formula (12):

$$(SiO_2)_{x2}(In_2O_3)_{y2}(M1O_2)_{100-x2-y2} \text{ (mol \%)} \quad (12)$$

wherein M1 represents at least one element selected from among Zr and Hf, while x2 and y2 satisfy relationships: $2 < x2 \leq 95$, $0 < y2 \leq 95$ and $5 \leq x2+y2 < 100$.

21. The method according to claim 18, wherein the sputtering target further comprises M2 (wherein M2 at least one element selected from among Y, Cr and Ga).

22. The method according to claim 21, wherein the sputtering target comprises a Si—In—Zr/Hf—O-based material represented by a formula (13):

$$Si_{d2}In_{e2}M1_{f2}M2_{g2}O_{100-d2-e2-f2-g2} \text{ (atomic \%)} \quad (13)$$

wherein M1 represents at least one element selected from among Zr and Hf, M2 represents at least one element selected from among Y, Cr and Ga, while d2, e2, f2, and g2 satisfy relationships: $0.5 \leq d2 < 34$, $0 < e2 < 43$, $0 < f2 < 34$, $0 < g2 < 41$, and $20 < d2+e2+f2+g2 < 45$.

23. The method according to claim 21, wherein the sputtering target comprises a Si—In—Zr/Hf—O-based material represented by a formula (14):

$$(SiO_2)_{z2}(In_2O_3)_{w2}(M1O_2)_{v2}(M2_2O_3)_{100-z2-w2-v2} \text{ (mol \%)} \quad (14)$$

wherein M1 represents at least one element selected from among Zr and Hf, M2 represents at least one element selected from among Y, Cr and Ga, while z2, w2 and v2 satisfy relationships: $2 < z2 < 95$, $0 < w2 < 95$, $0 < v2 < 95$, and $10 \leq z2+w2+v2 < 100$.

24. The method according to claim 21, wherein the sputtering target comprises a Si—In—Zr/Hf—O-based material represented by a formula (15):

$$(SiO_2)_{u2}(In_2O_3)_{t2}[(ZrO_2)_{0.97}(Y_2O_3)_{0.03}]_{100-u2-t2} \text{ (mol \%)} \quad (15)$$

wherein M1 represents at least one element selected from among Zr and Hf, while u2 and t2 satisfy relationships: $2 < u2 \leq 95$, $2 < t2 \leq 95$, and $5 \leq u2+t2 < 100$.

25. The method according to claim 21, wherein the sputtering target comprises a Si—In—Zr/Hf—O-based material represented by a formula (16):

$$(SiO_2)_{s2}(In_2O_3)_{r2}[(ZrO_2)_{0.92}(Y_2O_3)_{0.08}]_{100-s2-r2} \text{ (mol \%)} \quad (16)$$

wherein M1 represents at least one element selected from among Zr and Hf, while s2 and r2 satisfy the relationships: $2 < s2 \leqq 95$, $2 < r2 \leqq 95$, and $5 \leqq s2+r2 < 100$.

26. The method according to claim 18, wherein the sputtering target further comprises at least one component selected from among:
  carbon (C);
  oxide of at least one element selected from among Sc, La, Gd, Dy, Yb, Al, Mg, Zn, Ta, Ti, Ca, Ce, Sn, Te, Nb and Bi;
  nitride of at least one element selected from among Si, Cr, Al and Ge; and
  Si—C.

27. The method according to claim 18, wherein a rare gas or a mixed gas of the rare gas and $O_2$ gas is used in the step of forming the layer of Si—In—Zr/Hf—O-based material.

* * * * *